United States Patent
Han et al.

(10) Patent No.: US 12,272,314 B2
(45) Date of Patent: Apr. 8, 2025

(54) DISPLAY SUBSTRATE, PREPARATION METHOD THEREOF, AND DISPLAY APPARATUS

(71) Applicant: BOE Technology Group Co., Ltd., Beijing (CN)

(72) Inventors: Long Han, Beijing (CN); Guangliang Shang, Beijing (CN); Libin Liu, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 0 days.

(21) Appl. No.: 17/771,016

(22) PCT Filed: May 27, 2021

(86) PCT No.: PCT/CN2021/096497
§ 371 (c)(1),
(2) Date: Dec. 1, 2022

(87) PCT Pub. No.: WO2022/246756
PCT Pub. Date: Dec. 1, 2022

(65) Prior Publication Data
US 2024/0144885 A1    May 2, 2024

(51) Int. Cl.
*G09G 3/3266*    (2016.01)
*G11C 19/28*    (2006.01)

(52) U.S. Cl.
CPC .......... *G09G 3/3266* (2013.01); *G11C 19/28* (2013.01); *G09G 2310/0286* (2013.01); *G09G 2310/08* (2013.01); *G09G 2330/021* (2013.01)

(58) Field of Classification Search
CPC .......... G09G 3/3266; G09G 2330/021; G09G 2310/0286; G09G 2300/0408; G11C 19/28
See application file for complete search history.

(56) References Cited

U.S. PATENT DOCUMENTS

| | | | | |
|---|---|---|---|---|
| 11,735,107 B2* | 8/2023 | Yu | .......................... | G11C 19/28 345/76 |
| 11,763,752 B2* | 9/2023 | Bai | ...................... | G09G 3/3266 345/204 |
| 11,776,481 B2* | 10/2023 | Li | ........................ | G09G 3/3266 345/204 |

(Continued)

FOREIGN PATENT DOCUMENTS

| | | |
|---|---|---|
| AU | 2019275624 A1 | 3/2021 |
| CN | 110767665 A | 2/2020 |

(Continued)

OTHER PUBLICATIONS

European Search Report for 21942332.4 Mailed Nov. 7, 2023.

*Primary Examiner* — Doon Y Chow
(74) *Attorney, Agent, or Firm* — Ling Wu; Stephen Yang; Ling and Yang Intellectual Property

(57) ABSTRACT

Disclosed is a display substrate including a display region and a non-display region. The non-display region is provided with a gate drive circuit, the gate drive circuit includes a plurality of cascaded shift register units, and a shift register unit is connected with at least one power supply line. The shift register unit includes a first output circuit and a second output circuit. The first output circuit is connected with a first group of clock signal lines, and the second output circuit is connected with the first group of clock signal lines and a second group of clock signal lines. In a first direction, the first group of clock signal lines and the at least one power supply line are located between the first output circuit and the second output circuit.

19 Claims, 21 Drawing Sheets

(56) References Cited

U.S. PATENT DOCUMENTS

| | | | |
|---|---|---|---|
| 11,875,749 B2* | 1/2024 | Yu | G11C 19/28 |
| 12,002,422 B2* | 6/2024 | Cheng | H10K 59/126 |
| 2019/0340969 A1* | 11/2019 | Hu | G11C 19/287 |
| 2022/0302240 A1* | 9/2022 | Zhang | H10K 59/131 |

FOREIGN PATENT DOCUMENTS

| | | |
|---|---|---|
| CN | 112838109 A | 5/2021 |
| EP | 3961611 A1 | 3/2022 |

* cited by examiner

DISPLAY SUBSTRATE, PREPARATION METHOD THEREOF, AND DISPLAY APPARATUS

CROSS-REFERENCE TO RELATED APPLICATION

The present application is a U.S. National Phase Entry of International Application No. PCT/CN2021/096497 having an international filing date of May 27, 2021. The above-identified application is hereby incorporated by reference.

TECHNICAL FIELD

The present disclosure relates to, but is not limited to, the field of display technologies, and particularly to a display substrate and a preparation method thereof, and a display apparatus.

BACKGROUND

An Organic Light Emitting Diode (OLED) and a Quantum dot Light Emitting Diode (QLED) are active light emitting display devices, which have advantages of auto-luminescence, a wide angle of view, a high contrast ratio, low power consumption, an extremely high response speed, lightness and thinness, bendability, a low cost, etc. With continuous development of display technologies, a flexible display apparatus (Flexible Display) that uses OLED or QLED as a light emitting device and uses a Thin Film Transistor (TFT) for signal control has become a mainstream product in the field of display at present.

SUMMARY

The following is a summary of subject matters described herein in detail. The summary is not intended to limit the scope of protection of claims.

Embodiments of the present disclosure provide a display substrate and a preparation method thereof, and a display apparatus.

In one aspect, an embodiment of the present disclosure provides a display substrate, including a display region and a non-display region. The non-display region is provided with a gate drive circuit. The gate drive circuit includes a plurality of cascaded shift register units; and a shift register unit is connected with at least one power supply line. The shift register unit includes a first output circuit and a second output circuit. The first output circuit is connected with a first group of clock signal lines, and the second output circuit is connected with the first group of clock signal lines and a second group of clock signal lines. In a first direction, the first group of clock signal lines and the at least one power supply line are located between the first output circuit and the second output circuit, and the second group of clock signal lines are located on one side of the second output circuit away from the first group of clock signal lines.

In some exemplary implementations, the at least one power supply line includes a first power supply line and a second power supply line. The first power supply line is connected with the first output circuit, and the second power supply line is connected with the second output circuit. In the first direction, the first power supply line is located between the first output circuit and the first group of clock signal lines, and the second power supply line is located between the first group of clock signal lines and the second output circuit.

In some exemplary implementations, the non-display region is further provided with a third power supply line and a fourth power supply line. The third power supply line is connected with the second output circuit, and the fourth power supply line is connected with the first output circuit. In the first direction, the fourth power supply line is located on one side of the first output circuit away from the first power supply line, and the third power supply line is located between the second power supply line and the second group of clock signal lines.

In some exemplary implementations, the non-display region is further provided with an initial signal line. In the first direction, the initial signal line is located on one side of the fourth power supply line away from the first output circuit.

In some exemplary implementations, the first output circuit includes a first node control sub-circuit, a second node control sub-circuit, and a first output sub-circuit. The first node control sub-circuit is connected with an input terminal, a first output terminal, a first clock terminal, a second clock terminal, a third clock terminal, a first power supply terminal, a second power supply terminal, a first node, and a second node, and is configured to control potentials of the first node and the second node under control of the first clock terminal, the third clock terminal, and the input terminal. The second node control sub-circuit is connected with the first node, the second node, the second power supply terminal, and the first output terminal, is configured to maintain the potentials of the first node and the second node. The first output sub-circuit is connected with the first node, the second node, the second clock terminal, the second power supply terminal, and the first output terminal, and is configured to control the first output terminal to output a first output signal under control of the first node and the second node. The second node control sub-circuit, the first output sub-circuit, and the first node control sub-circuit are sequentially arranged along the first direction.

In some exemplary implementations, the first node control sub-circuit includes a first control transistor, a second control transistor, a third control transistor, a fourth control transistor, a fifth control transistor, a sixth control transistor, a seventh control transistor, and an eighth control transistor. A control electrode of the first control transistor is connected with the first clock terminal, a first electrode is connected with the input terminal, and a second electrode is connected with a fourth node. A control electrode of the second control transistor is connected with the first clock terminal, a first electrode is connected with the fourth node, and a second electrode is connected with the first node. A control electrode of the third control transistor is connected with the third clock terminal, a first electrode is connected with the first power supply terminal, and a second electrode is connected with the second node. A control electrode of the fourth control transistor is connected with the second node, a first electrode is connected with the second power supply terminal, and a second electrode is connected with a third node. A control electrode of the fifth control transistor is connected with the second node, a first electrode is connected with the third node, and a second electrode is connected with the first node. A control electrode of the sixth control transistor is connected with the first node, a first electrode is connected with the first power supply terminal, and a second electrode is connected with the third node. A control electrode of the seventh control transistor is connected with the input terminal, a first electrode is connected with the second power supply terminal, and a second electrode is connected with the second node. A control electrode of the eighth control transistor is connected with the first output terminal, a first electrode is connected with the second clock terminal, and a second electrode is connected with the fourth node. The second node control sub-circuit includes a first capacitor and a second capacitor. A first electrode of the first capacitor is connected with the first node, and a second electrode is connected with the first output terminal. A first electrode of the second capacitor is connected with the second node, and a second electrode is connected with the second power supply terminal. The first output sub-circuit includes a first output transistor and a second output transistor. A control electrode of the first output transistor is connected with the first node, a first electrode is connected with the second clock terminal, and a second electrode is connected with the first output terminal. A control electrode of the second output transistor is connected with the second node, a first electrode is connected with the second power supply terminal, and a second electrode is connected with the first output terminal.

In some exemplary implementations, the first capacitor and the first output transistor are adjacent in the first direction, and the second capacitor and the second output transistor are adjacent in the first direction. The first capacitor and the second capacitor are adjacent in a second direction, and the first output transistor and the second output transistor are adjacent in the second direction. The second direction is intersected with the first direction.

In some exemplary implementations, active layers of the first control transistor, the second control transistor, and the eighth control transistor are of an integral structure, and active layers of the fourth control transistor and the fifth control transistor are of an integral structure; and active layers of the first output transistor and the second output transistor are of an integral structure.

In some exemplary implementations, in the first direction, an active layer of the sixth control transistor is located between an active layer of the fifth control transistor and an active layer of the second control transistor, and an active layer of the seventh control transistor is located between an active layer of the fourth control transistor and an active layer of the third control transistor.

In some exemplary implementations, the second output circuit includes a denoising control sub-circuit, a second output sub-circuit, and a third output sub-circuit. The denoising control sub-circuit is connected with a first output terminal, a first clock terminal, a third clock terminal, a first power supply terminal, a second power supply terminal, and a first denoising control node, and is configured to rectify a charge of the first power supply terminal to the first denoising control node under control of the third clock terminal so as to maintain the first denoising control node at a voltage that enables the second output sub-circuit to be turned on, and to transmit a signal of the second power supply terminal to the first denoising control node under control of the first output terminal so as to maintain the first denoising control node at a voltage that enables the second output sub-circuit to be turned off. The second output sub-circuit is connected with the first denoising control node, a second output terminal, and the first power supply terminal, and is configured to transmit a signal of the first power supply terminal to the second output terminal under control of the first denoising control node. The third output sub-circuit is connected with a first node, a fourth clock terminal, and the second output terminal, and is configured to transmit a signal of the fourth clock terminal to the second output terminal under control of the first node. In a second direction, the second output sub-circuit and the third output sub-circuit are adjacent. In the first direction, the denoising control sub-circuit is located between the first group of clock signal lines and the second output sub-circuit. The second direction interacts with the first direction.

In some exemplary implementations, the denoising control sub-circuit includes a first denoising control transistor, a second denoising control transistor, a third denoising control transistor, a fourth denoising control transistor, a third capacitor, and a fourth capacitor. A control electrode of the first denoising control transistor is connected with the first output terminal, a first electrode is connected with the second power supply terminal, and a second electrode is connected with the second denoising control node. A control electrode of the second denoising control transistor is connected with the third clock terminal, a first electrode is connected with the first power supply terminal, and a second electrode is connected with the second denoising control node. A control electrode and a first electrode of the third denoising transistor are connected with a second denoising control node, and a second electrode is connected with the first denoising control node. A control electrode of the fourth denoising control transistor is connected with the first output terminal, a first electrode is connected with the second power supply terminal, and a second electrode is connected with the first denoising control node. A first electrode of the third capacitor is connected with the second denoising control node, and a second electrode is connected with the first clock terminal. A first electrode of the fourth capacitor is connected with the first denoising control node, and a second electrode is connected with the first power supply terminal. The second output sub-circuit includes a third output transistor. A control electrode of the third output transistor is connected with the first denoising control node, a first electrode is connected with the first power supply terminal, and a second electrode is connected with the second output terminal. The third output sub-circuit includes a fourth output transistor. A control electrode of the fourth output transistor is connected with the first node, a first electrode is connected with the fourth clock terminal, and a second electrode is connected with the second output terminal.

In some exemplary implementations, the third output transistor and the fourth output transistor are adjacent in the second direction, and the first denoising control transistor and the second denoising control transistor are adjacent in the second direction. In the first direction, the third capacitor is located between the second denoising control transistor and the third denoising control transistor, and the fourth denoising control transistor is located between the first denoising control transistor and the fourth capacitor.

In some exemplary implementations, active layers of the first denoising control transistor and the second denoising control transistor are of an integral structure, and active layers of the third output transistor and the fourth output transistor are of an integral structure.

In some exemplary implementations, the first group of clock signal lines includes a first clock signal line, a second clock signal line, and a third clock signal line; the second group of clock signal lines includes a fourth clock signal line and a fifth clock signal line. A duty ratio of a first clock signal provided by the first clock signal line, a duty ratio of a second clock signal provided by the second clock signal line, and a duty ratio of a third clock signal provided by the third clock signal line are the same, a duty ratio of a fourth clock signal provided by the fourth clock signal line, and a duty ratio of a fifth clock signal provided by the fifth clock signal line are the same, and the duty ratio of the fourth clock signal is smaller than the duty ratio of the first clock signal. The second clock signal is delayed from the first clock signal by a set time length, and the third clock signal is delayed from the second clock signal by a set time length, wherein the first clock signal, the second clock signal, and the third clock signal are not at a first voltage simultaneously; the fourth clock signal and the fifth clock signal are not at a second voltage simultaneously; and the first voltage is different from the second voltage.

In some exemplary implementations, in the first direction, the first clock signal line, the second clock signal line, and the third clock signal line are sequentially arranged along a direction away from the first output circuit, and the fourth clock signal line and the fifth clock signal line are sequentially arranged along a direction away from the second output circuit.

In some exemplary embodiments, a first output circuit of a shift register unit of any stage is connected with the first clock signal line, the second clock signal line, and the third clock signal line, and a second output circuit is connected with two clock signal lines in the first group of clock signal lines and one clock signal line in the second group of clock signal lines.

In some exemplary implementations, a first clock terminal of a (6n+1)th stage shift register unit is connected with the first clock signal line, a second clock terminal is connected with the second clock signal line, a third clock terminal is connected with the third clock signal line, and a fourth clock terminal is connected with the fourth clock signal line. A first clock terminal of a (6n+2)th stage shift register unit is connected with the second clock signal line, a second clock terminal is connected with the third clock signal line, a third clock terminal is connected with the first clock signal line, and a fourth clock terminal is connected with the fifth clock signal line. A first clock terminal of a (6n+3)th stage shift register unit is connected with the third clock signal line, a second clock terminal is connected with the first clock signal line, a third clock terminal is connected with the second clock signal line, and a fourth clock terminal is connected with the fourth clock signal line. A first clock terminal of a (6n+4)th stage shift register unit is connected with the first clock signal line, a second clock terminal is connected with the second clock signal line, a third clock terminal is connected with the third clock signal line, and a fourth clock terminal is connected with the fifth clock signal line. A first clock terminal of a (6n+5)th stage shift register unit is connected with the second clock signal line, a second clock terminal is connected with the third clock signal line, a third clock terminal is connected with the first clock signal line, and a fourth clock terminal is connected with the fourth clock signal line. A first clock terminal of a (6n+6)th stage shift register unit is connected with the third clock signal line, a second clock terminal is connected with the first clock signal line, a third clock terminal is connected with the second clock signal line, and a fourth clock terminal is connected with the fifth clock signal line, wherein n is a natural number.

In some exemplary implementations, a first output terminal of a (2k−1)th stage shift register unit is connected with an input terminal of a (2k+1)th stage shift register unit, and an input terminal of a first stage shift register unit is connected with a first initial signal line. A first output terminal of a (2k)th stage shift register unit is connected with an input terminal of a (2k+2)th stage shift register unit, and an input terminal of a second stage shift register unit is connected with a second initial signal line, wherein k is a positive integer. The first group of clock signal lines includes a first sub-group of clock signal lines and a second sub-group of clock signal lines; and the second group of clock signal lines includes a third sub-group of clock signal lines and a fourth sub-group of clock signal lines. The (2k−1)th stage shift register unit is connected with the first sub-group of clock signal lines and the third sub-group of clock signal lines, and the (2k)th stage shift register unit is connected with the second sub-group of clock signal lines and the fourth sub-group of clock signal lines.

In some exemplary implementations, in the first direction, the first sub-group of clock signal lines and the second sub-group of clock signal lines are arranged at intervals, and the third sub-group of clock signal lines and the fourth sub-group of clock signal lines are arranged at intervals.

In some exemplary implementations, in a direction perpendicular to the display substrate, the non-display region of the display substrate includes: a base substrate, and a first semiconductor layer, a first conductive layer, a second conductive layer, a third conductive layer, and a fourth conductive layer disposed on the base substrate. The first semiconductor layer at least includes active layers of a plurality of transistors of the shift register unit. The first conductive layer at least includes control electrodes of the plurality of transistors of the shift register unit, and first electrodes of a plurality of capacitors of the shift register unit. The second conductive layer at least includes second electrodes of the plurality of capacitors of the shift register unit. The third conductive layer at least includes first electrodes and second electrodes of the plurality of transistors of the shift register unit, the first group of clock signal lines, the second group of clock signal lines, and a plurality of power supply lines. The fourth conductive layer at least includes a connection electrode connecting a first node and a third output sub-circuit of the second output circuit.

In another aspect, an embodiment of the present disclosure provides a display apparatus, which includes the aforementioned display substrate.

In another aspect, an embodiment of the present disclosure provides a preparation method of a display substrate, used for preparing the aforementioned display substrate, and the preparation method includes: providing a base substrate; and forming a gate drive circuit in a non-display region. The gate drive circuit includes a plurality of cascaded shift register units. A shift register unit is connected with at least one power supply line. The shift register unit includes a first output circuit and a second output circuit; the first output circuit is connected with a first group of clock signal lines, and the second output circuit is connected with the first group of clock signal lines and a second group of clock signal lines. In a first direction, the first group of clock signal lines and the at least one power supply line are located between the first output circuit and the second output circuit, and the second group of clock signal lines are located on one side of the second output circuit away from the first group of clock signal lines.

Other aspects may be understood upon reading and understanding of the accompanying drawings and detailed description.

BRIEF DESCRIPTION OF DRAWINGS

The drawings provide a further understanding to technical solutions of the present disclosure, form a part of the specification, and are adopted to explain, together with the embodiments of the present disclosure, the technical solutions of the present disclosure and not intended to form limits to the technical solutions of the present disclosure. Shapes and sizes of one or more components in the drawings do not reflect true scales, and are only intended to schematically describe contents of the present disclosure.

DETAILED DESCRIPTION

Figure 1:
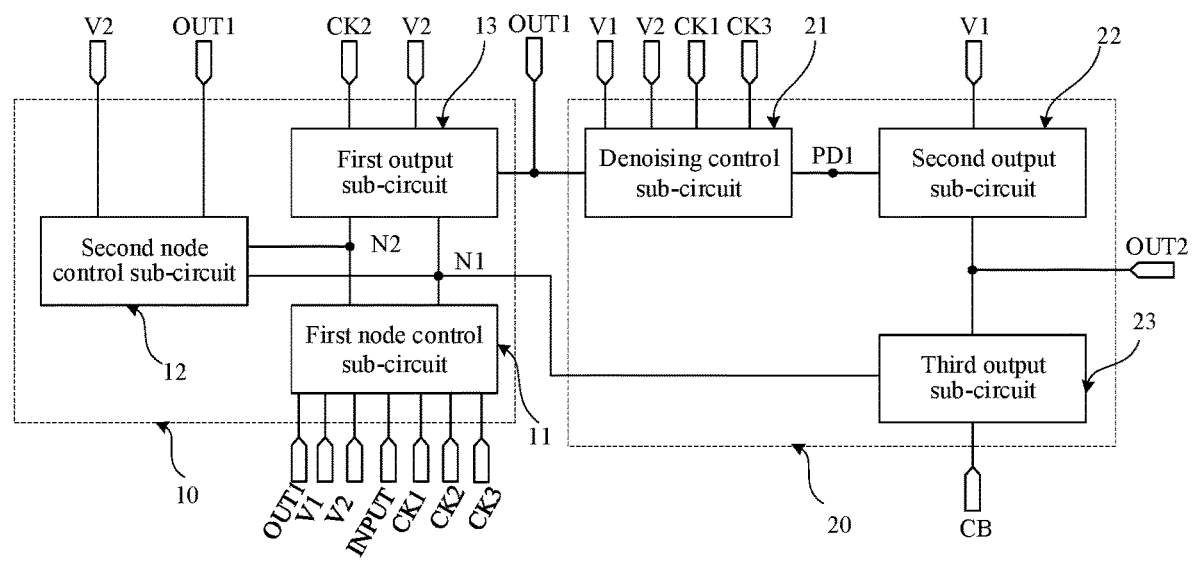
FIG. 1 is a schematic diagram of a structure of a shift register unit according to at least one embodiment of the present disclosure.

The embodiments of the present disclosure will be described below in combination with the drawings in detail. Implementations may be implemented in multiple different forms. Those of ordinary skills in the art may easily understand such a fact that modes and contents may be transformed into one or more forms without departing from the purpose and scope of the present disclosure. Therefore, the present disclosure should not be construed as being only limited to contents recorded in the following implementations. The embodiments in the present disclosure and features in the embodiments may be combined randomly with each other if there is no conflict.

In the drawings, a size of one or more constituent elements, a thickness of a layer, or a region is sometimes exaggerated for clarity. Therefore, a mode of the present disclosure is not necessarily limited to the size shown, and a shape and size of one or more components in the drawings do not reflect a true proportion. In addition, the accompanying drawings schematically show ideal examples, and one mode of the present disclosure is not limited to a shape, a numerical value, or the like shown in the accompanying drawings.

Ordinal numerals, such as "first", "second" and "third", in the present disclosure are set to avoid confusion of constituents, but not intended for restriction in quantity. In the present disclosure, a "plurality" represents two or more than two.

In the present disclosure, for convenience, wordings "central", "up", "down", "front", "back", "vertical", "horizontal", "top", "bottom", "inside", "outside", and the like indicating directional or positional relationships are used for illustrating positional relationships between constituent elements with reference to the drawings. These terms are not intended to indicate or imply that involved apparatuses or elements must have specific orientations and be structured and operated in the specific orientations but only to facilitate describing the present specification and simplify the description, and thus should not be understood as limitations on the present disclosure. The positional relationships between the constituent elements may be changed as appropriate based on a direction according to which the constituent elements are described. Therefore, they are not limited to the wordings described in the specification, which may be replaced appropriately according to a situation.

In the present disclosure, unless otherwise specified and defined, terms "mounting", "mutual connection", and "connection" should be understood in a broad sense. For example, a connection may be a fixed connection, or a detachable connection, or an integral connection; it may be a mechanical connection or an electrical connection; it may be a direct connection, or an indirect connection through a middleware, or internal communication between two elements. Those of ordinary skills in the art may understand meanings of the above terms in the present disclosure according to a situation. Herein, the "electrical connection" includes a case where constituent elements are connected together through an element having some electric function. The "element having some electric function" is not particularly limited as long as electric signals between the connected constituent elements may be transmitted. Examples of the "element having some electric function" not only include electrodes and wirings, but also include switching elements such as transistors, resistors, inductors, capacitors, other elements with one or more functions, etc.

In the present disclosure, a transistor refers to an element at least including three terminals, i.e., a gate electrode (gate), a drain electrode, and a source electrode. The transistor has a channel region between the drain electrode (drain electrode terminal, drain region, or drain) and the source electrode (source electrode terminal, source region, or source), and a current can flow through the drain electrode, the channel region, and the source electrode. In the present disclosure, the channel region refers to a region through which a current mainly flows.

In the present disclosure, to distinguish two electrodes of a transistor except a gate electrode, one of the electrodes is referred to as a first electrode and the other electrode is referred to as a second electrode. The first electrode may be a source electrode or a drain electrode, and the second electrode may be a drain electrode or a source electrode. In addition, the gate electrode of the transistor is referred to as a control electrode. In a case that transistors with opposite polarities are used, or that a direction of a current changes during operation of a circuit, or the like, functions of the "source electrode" and the "drain electrode" are sometimes exchanged. Therefore, the "source electrode" and the "drain electrode" are interchangeable in the present disclosure.

In the present disclosure, "parallel" refers to a state in which an angle formed by two straight lines is above −10° and below 10°, and thus may include a state in which the angle is above −5° and below 5°. In addition, "perpendicular" refers to a state in which an angle formed by two straight lines is above 80° and below 100°, and thus may include a state in which the angle is above 85° and below 95°.

In the present disclosure, a "film" and a "layer" are interchangeable. For example, sometimes a "conducting layer" may be replaced with a "conducting film". Similarly, sometimes an "insulation film" may be replaced with an "insulation layer".

In the present disclosure, "about" and "approximate" refer to a case that a boundary is defined not so strictly and a process and measurement error within a range is allowed.

An embodiment of the present disclosure provides a display substrate, including a display region and a non-display region. The non-display region is provided with a gate drive circuit. The gate drive circuit includes a plurality of cascaded shift register units; a shift register unit is connected with at least one power supply line. The shift register unit includes a first output circuit and a second output circuit; the first output circuit is connected with a first group of clock signal lines, and the second output circuit is connected with the first group of clock signal lines and a second group of clock signal lines. In a first direction, the first group of clock signal lines and the at least one power supply line are located between the first output circuit and the second output circuit, and the second group of clock signal lines are located on one side of the second output circuit away from the first group of clock signal lines.

According to the display substrate provided by the embodiment, the first output circuit and the second output circuit share the first group of clock signal lines, and the power supply line and the shared first group of clock signal lines are disposed between the first output circuit and the second output circuit, thereby saving wiring space and facilitating achievement of the display substrate with a narrow border design.

In some exemplary implementations, a phase of an output signal of the first output terminal is opposite to a phase of an output signal of the second output terminal.

In some exemplary implementations, the at least one power supply line includes a first power supply line connected with the first output circuit and a second power supply line connected with the second output circuit. In the first direction, the first power supply line is located between the first output circuit and the first group of clock signal lines, and the second power supply line is located between the first group of clock signal lines and the second output circuit. In some examples, the first power supply line continuously provides a low-level signal, and the second power supply line continuously provides a high-level signal. However, the embodiment is not limited thereto.

In some exemplary implementations, the non-display region is further provided with a third power supply line and a fourth power supply line. The third power supply line is connected with the second output circuit, and the fourth power supply line is connected with the first output circuit. In the first direction, the fourth power supply line is located on one side of the first output circuit away from the first power supply line, and the third power supply line is located between the second power supply line and the second group of clock signal lines. In some examples, the third power supply line continuously provides a low-level signal, and the fourth power supply line continuously provides a high-level signal. However, the embodiment is not limited thereto.

In some exemplary implementations, the non-display region is further provided with an initial signal line. In the first direction, the initial signal line is located on one side of the fourth power supply line away from the first output circuit. In some examples, an input terminal of a first stage shift register unit is connected with the initial signal line. In some examples, the initial signal line includes a first initial signal line connected with the input terminal of the first stage shift register unit and a second initial signal line connected with an input terminal of a second stage shift register unit. However, the embodiment is not limited thereto.

In some exemplary implementations, the first output circuit includes a first node control sub-circuit, a second node control sub-circuit, and a first output sub-circuit. The first node control sub-circuit is connected with an input terminal, a first output terminal, a first clock terminal, a second clock terminal, a third clock terminal, a first power supply terminal, a second power supply terminal, a first node, and a second node, and is configured to control potentials of the first node and the second node under control of the first clock terminal, the third clock terminal, and the input terminal. The second node control sub-circuit is connected with the first node, the second node, the second power supply terminal, and the first output terminal, is configured to maintain potentials of the first node and the second node. The first output sub-circuit is connected with the first node, the second node, the second clock terminal, the second power supply terminal, and the first output terminal, and is configured to control the first output terminal to output a first output signal under control of the first node and the second node. The second node control sub-circuit, the first output sub-circuit, and the first node control sub-circuit are sequentially arranged along the first direction. In some examples, the first power supply terminal continuously provides a low-level signal, and the second power supply terminal continuously provides a high-level signal. A circuit arrangement of the embodiment may save wiring space.

In some exemplary implementations, the first node control sub-circuit includes a first control transistor, a second control transistor, a third control transistor, a fourth control transistor, a fifth control transistor, a sixth control transistor, a seventh control transistor, and an eighth control transistor. The first control transistor has a control electrode connected with the first clock terminal, a first electrode connected with the input terminal, and a second electrode connected with the fourth node. The second control transistor has a control electrode connected with the first clock terminal, a first electrode connected with the fourth node, and a second electrode connected with the first node. The third control transistor has a control electrode connected with the third clock terminal, a first electrode connected with the first power supply terminal, and a second electrode connected with the second node. The fourth control transistor has a control electrode connected with the second node, a first electrode connected with the second power supply terminal, and a second electrode connected with the third node. The fifth control transistor has a control electrode connected with the second node, a first electrode connected with the third node, and a second electrode connected with the first node. The sixth control transistor has a control electrode connected with the first node, a first electrode connected with the first power supply terminal, and a second electrode connected with the third node. The seventh control transistor has a control electrode connected with the input terminal, a first electrode connected with the second power supply terminal, and a second electrode connected with the second node. The eighth control transistor has a control electrode connected with the first output terminal, a first electrode connected with the second clock terminal, and a second electrode connected with the fourth node. The second node control sub-circuit includes a first capacitor and a second capacitor. The first capacitor has a first electrode connected with the first node, and a second electrode connected with the first output terminal. The second capacitor has a first electrode connected with the second node, and a second electrode connected with the second power supply terminal. The first output sub-circuit includes a first output transistor and a second output transistor. The first output transistor has a control electrode connected with the first node, a first electrode connected with the second clock terminal, and a second electrode connected with the first output terminal. The second output transistor has a control electrode connected with the second node, a first electrode connected with the second power supply terminal, and a second electrode connected with the first output terminal.

In some exemplary implementations, the first capacitor is adjacent to the first output transistor in the first direction, the second capacitor is adjacent to the second output transistor in the first direction; the first capacitor is adjacent to the second capacitor in a second direction, and the first output transistor is adjacent to the second output transistor in the second direction. The second direction interacts with the first direction. For example, the first direction and the second direction are located in a same plane and perpendicular to each other.

In some exemplary implementations, active layers of the first control transistor, the second control transistor, and the eighth control transistor are of an integral structure, and active layers of the fourth control transistor and the fifth control transistor are of an integral structure; active layers of the first output transistor and the second output transistor are of an integral structure. However, the embodiment is not limited thereto.

In some exemplary implementations, in the first direction, an active layer of the sixth control transistor is located between an active layer of the fifth control transistor and an active layer of the second control transistor, and an active layer of the seventh control transistor is located between an active layer of the fourth control transistor and an active layer of the third control transistor. However, the embodiment is not limited thereto.

In some exemplary implementations, the second output circuit includes a denoising control sub-circuit, a second output sub-circuit, and a third output sub-circuit. The denoising control sub-circuit is connected with the first output terminal, the first clock terminal, the third clock terminal, the first power supply terminal, the second power supply terminal, and a first denoising control node, and is configured to rectify a charge of the first power supply terminal to the first denoising control node under control of the third clock terminal, so that the first denoising control node is maintained at a voltage that enables the second output sub-circuit to be turned on, and to transmit a signal of the second power supply terminal to the first denoising control node under control of the first output terminal, so that the first denoising control node is maintained at a voltage that enables the second output sub-circuit to be turned off. The second output sub-circuit is connected with the first denoising control node, the second output terminal, and the first power supply terminal, and is configured to transmit a signal of the first power supply terminal to the second output terminal under control of the first denoising control node. The third output sub-circuit is connected with the first node, the fourth clock terminal, and the second output terminal, and is configured to transmit a signal of the fourth clock terminal to the second output terminal under control of the first node. In the second direction, the second output sub-circuit is adjacent to the third output sub-circuit; in the first direction, the denoising control sub-circuit is located between the first group of clock signal lines and the second output sub-circuit. The second direction interacts with the first direction.

In some exemplary implementations, the denoising control sub-circuit includes a first denoising control transistor, a second denoising control transistor, a third denoising control transistor, a fourth denoising control transistor, a third capacitor, and a fourth capacitor. The first denoising control transistor has a control electrode connected with the first output terminal, a first electrode connected with the second power supply terminal, and a second electrode connected with the second denoising control node. The second denoising control transistor has a control electrode connected with the third clock terminal, a first electrode connected with the first power supply terminal, and a second electrode connected with the second denoising control node. The third denoising transistor has a control electrode and a first electrode that are connected with the second denoising control node, and a second electrode connected with the first denoising control node. The fourth denoising control transistor has a control electrode connected with the first output terminal, a first electrode connected with the second clock terminal, and a second electrode connected with the first denoising control node. The third capacitor has a first electrode connected with the second denoising control node, and a second electrode connected with the first clock terminal. The fourth capacitor has a first electrode connected with the first denoising control node, and a second electrode connected with the first power supply terminal. The second output sub-circuit includes a third output transistor. The third output transistor has a control electrode connected with the first denoising control node, a first electrode connected with the first power supply terminal, and a second electrode connected with the second output terminal. The third output sub-circuit includes a fourth output transistor. The fourth output transistor has a control electrode connected with the first node, a first electrode connected with the fourth clock terminal, and a second electrode connected with the second output terminal.

In some exemplary implementations, the third output transistor is adjacent to the fourth output transistor in a second direction, and the first denoising control transistor is adjacent to the second denoising control transistor in a second direction. In the first direction, the third capacitor is located between the second denoising control transistor and the third denoising control transistor, and the fourth denoising control transistor is located between the first denoising control transistor and the fourth capacitor. However, the embodiment is not limited thereto.

In some exemplary implementations, active layers of the first denoising control transistor and the second denoising control transistor are of an integral structure, and active layers of the third output transistor and the fourth output transistor are of an integral structure. However, the embodiment is not limited thereto.

In some exemplary implementations, the first group of clock signal lines includes a first clock signal line, a second clock signal line, and a third clock signal line. The second group of clock signal lines includes a fourth clock signal line and a fifth clock signal line. A duty ratio of a first clock signal provided by the first clock signal line, a duty ratio of a second clock signal provided by the second clock signal line, and a duty ratio of a third clock signal provided by the third clock signal line are the same, a duty ratio of a fourth clock signal provided by the fourth clock signal line is the same as a duty ratio of a fifth clock signal provided by the fifth clock signal line, and the duty ratio of the fourth clock signal is smaller than the duty ratio of the first clock signal. The second clock signal is delayed by a set time length from the first clock signal, and the third clock signal is delayed by a set time length from the second clock signal, so that the first clock signal, the second clock signal, and the third clock signal are not at a first voltage simultaneously. The fourth clock signal and the fifth clock signal are not at a second voltage simultaneously. The first voltage is different from the second voltage. For example, the first voltage is less than the second voltage. For example, the first voltage may at a low level, and the second voltage may be at a high level. However, the embodiment is not limited thereto.

In some exemplary implementations, in the first direction, the first clock signal line, the second clock signal line, and the third clock signal line are sequentially arranged along a direction away from the first output circuit, and the fourth clock signal line and the fifth clock signal line are sequentially arranged along a direction away from the second output circuit. However, in the embodiment, an arrangement sequence of a plurality of clock signal lines of the first group of clock signal lines is not limited, and an arrangement sequence of a plurality of clock signal lines of the second group of clock signal lines is not limited.

In some exemplary embodiments, a shift register unit of any stage has a first output circuit connected with the first clock signal line, the second clock signal line, and the third clock signal line, and a second output circuit connected with two clock signal lines in the first group of clock signal lines and one clock signal line in the second group of clock signal lines.

In some exemplary implementations, a (6n+1)th stage shift register unit has a first clock terminal connected with the first clock signal line, a second clock terminal connected with the second clock signal line, a third clock terminal connected with the third clock signal line, and a fourth clock terminal connected with the fourth clock signal line. A (6n+2)th stage shift register unit has a first clock terminal connected with the second clock signal line, a second clock terminal connected with the third clock signal line, a third clock terminal connected with the first clock signal line, and a fourth clock terminal connected with the fifth clock signal line. A (6n+3)th stage shift register unit has a first clock terminal connected with the third clock signal line, a second clock terminal connected with the first clock signal line, a third clock terminal connected with the second clock signal line, and a fourth clock terminal connected with the fourth clock signal line. A (6n+4)th stage shift register unit has a first clock terminal connected with the first clock signal line, a second clock terminal connected with the second clock signal line, a third clock terminal connected with the third clock signal line, and a fourth clock terminal connected with the fifth clock signal line. A (6n+5)th stage shift register unit has a first clock terminal connected with the second clock signal line, a second clock terminal connected with the third clock signal line, a third clock terminal connected with the first clock signal line, and a fourth clock terminal connected with the fourth clock signal line. A (6n+6)th stage shift register unit has a first clock terminal connected with the third clock signal line, a second clock terminal connected with the first clock signal line, a third clock terminal connected with the second clock signal line, and a fourth clock terminal connected with the fifth clock signal line. Among them, n is a natural number. In this example, six cascaded shift register units act as a repetition unit with a minimum period, which may drive six rows of sub-pixels of the display region.

In some exemplary implementations, a first output terminal of a (2k−1)th stage shift register unit is connected with an input terminal of a (2k+1)th stage shift register unit, and the input terminal of the first stage shift register unit is connected with the first initial signal line. A first output terminal of a (2k)th stage shift register unit is connected with an input terminal of a (2k+2)th stage shift register unit, and the input terminal of the second stage shift register unit is connected with the second initial signal line, wherein k is a positive integer. The first group of clock signal lines includes a first sub-group of clock signal lines and a second sub-group of clock signal lines; the second group of clock signal lines includes a third sub-group of clock signal lines and a fourth sub-group of clock signal lines. The (2k−1)th stage shift register unit is connected with the first sub-group of clock signal lines and the third sub-group of clock signal lines, and the (2k)th stage shift register unit is connected with the second sub-group of clock signal lines and the fourth sub-group of clock signal lines. In some examples, twelve shift register units may act as a repetition unit with a minimum period, which may drive twelve rows of sub-pixels of the display region.

In some exemplary implementations, in the first direction, the first sub-group of clock signal lines and the second sub-group of clock signal lines are arranged at intervals, and the third sub-group of clock signal lines and the fourth sub-group of clock signal lines are arranged at intervals. However, the embodiment is not limited thereto. For example, the first sub-group of clock signal lines and the second sub-group of clock signal lines are sequentially arranged along the first direction, and the third sub-group of clock signal lines and the fourth sub-group of clock signal lines are sequentially arranged along the first direction.

In some exemplary implementations, the first sub-group of clock signal lines includes a first clock signal line, a second clock signal line, and a third clock signal line; the second sub-group of clock signal lines includes a sixth clock signal line, a seventh clock signal line, and an eighth clock signal line. The third sub-group of clock signal lines includes a fourth clock signal line and a fifth clock signal line; the fourth sub-group of clock signal lines includes a ninth clock signal line and a tenth clock signal line. A duty ratio of a first clock signal provided by the first clock signal line, a duty ratio of a second clock signal provided by the second clock signal line, a duty ratio of a third clock signal provided by the third clock signal line, a duty ratio of a sixth clock signal provided by the sixth clock signal line, a duty ratio of a seventh clock signal provided by the seventh clock signal line, and a duty ratio of an eighth clock signal provided by the eighth clock signal line are the same. The second clock signal is delayed by a first set time length from the first clock signal, and the third clock signal is delayed by the first set time length from the second clock signal, so that the first clock signal, the second clock signal, and the third clock signal are not at a first voltage simultaneously. The seventh clock signal is delayed by the first set time length from the sixth clock signal, and the eighth clock signal is delayed by the first set time length from the seventh clock signal, so that the sixth clock signal, the seventh clock signal, and the eighth clock signal are not at the first voltage simultaneously. The sixth clock signal is delayed by a second set time length from the first clock signal, the seventh clock signal is delayed by the second set time length from the second clock signal, and the eighth clock signal is delayed by the second set time length from the third clock signal. A duty ratio of a fourth clock signal provided by the fourth clock signal line, a duty ratio of a fifth clock signal provided by the fifth clock signal line, a duty ratio of a ninth clock signal provided by the ninth clock signal line, a duty ratio of a tenth clock signal provided by the tenth clock signal line are the same. The duty ratio of the fourth clock signal is smaller than the duty ratio of the first clock signal; the fourth clock signal and the fifth clock signal are not at a second voltage simultaneously, the ninth clock signal and the tenth clock signal are not at the second voltage simultaneously, and the second voltage is different from the first voltage. The ninth clock signal is delayed by the second set time length from the fourth clock signal, and the tenth clock signal is delayed by the second set time length from the fifth clock signal.

In some exemplary implementations, in a direction perpendicular to the display substrate, the non-display region of the display substrate includes: a base substrate, and a first semiconductor layer, a first conductive layer, a second conductive layer, a third conductive layer, and a fourth conductive layer arranged on the base substrate. The first semiconductor layer at least includes active layers of a plurality of transistors of a shift register unit. The first conductive layer at least includes control electrodes of the plurality of transistors of the shift register unit, and first electrodes of a plurality of capacitors of the shift register unit. The second conductive layer at least includes second electrodes of the plurality of capacitors of the shift register unit. The third conductive layer at least includes first electrodes and second electrodes of the plurality of transistors of the shift register unit, the first group of clock signal lines, the second group of clock signal lines, and a plurality of power supply lines. The fourth conductive layer at least includes a connection electrode connecting the first node and the third output sub-circuit of the second output circuit.

Solutions of the embodiment will be described below through some examples.

In some exemplary implementations, the display substrate may include: a display region and a non-display region. For example, the non-display region may be located at a periphery of the display region. However, the embodiment is not limited thereto. The display region at least includes a plurality of regularly arranged pixel circuits, a plurality of gate lines (for example, including a scanning line, a reset signal line, and a light emitting control line) extending along a first direction, a plurality of data lines extending along a second direction, and a power supply line. The first direction and the second direction are located in a same plane, and the first direction interacts with the second direction, for example, the first direction is perpendicular to the second direction.

In some exemplary implementations, a pixel unit in the display region may include three sub-pixels, and the three sub-pixels may be a red sub-pixel, a green sub-pixel, and a blue sub-pixel respectively. However, the embodiment is not limited thereto. In some examples, a pixel unit may include four sub-pixels, and the four sub-pixels may be a red sub-pixel, a green sub-pixel, a blue sub-pixel, and a white sub-pixel respectively.

In some exemplary implementations, a shape of a sub-pixel may be a rectangle, a rhombus, a pentagon, or a hexagon. When a pixel unit includes three sub-pixels, the three sub-pixels may be arranged in a manner to stand side by side horizontally, in a manner to stand side by side vertically, or in a manner like a Chinese character "品". When a pixel unit includes four sub-pixels, the four sub-pixels may be arranged in a manner to stand side by side horizontally, in a manner to stand side by side vertically, or in manner to form a square. However, the embodiment is not limited thereto.

In some exemplary implementations, a timing controller, a data drive circuit, and a gate drive circuit may be arranged in the non-display region. The gate drive circuit may be arranged on two opposite sides of the display region respectively, such as left and right sides of the display region. The timing controller and the data drive circuit may be arranged on a side of the display region, such as a lower side of the display region. However, the embodiment is not limited thereto.

In some exemplary implementations, the data drive circuit may provide a data signal to a sub-pixel through a data line. The gate drive circuit may provide a scanning signal to a sub-pixel through a scanning line, and provide a reset signal to a sub-pixel through a reset signal line, or provide a light emitting control signal to a sub-pixel through a light emitting control line. The timing controller may provide drive signals to the data drive circuit and the gate drive circuit. Actions of the gate drive circuit and the data drive circuit may be controlled by the timing controller. The timing controller may provide gray scale data specifying a gray scale that should be displayed at a sub-pixel to the data drive circuit. The data drive circuit may provide a data signal of a potential corresponding to the gray scale data of the sub-pixel to sub-pixels of a row selected by the gate drive circuit via a data line.

In some exemplary implementations, the pixel drive circuit may have a structure of 3T1C, 4T1C, 5T1C, 5T2C, 6T1C, or 7T1C. However, the embodiment is not limited thereto. For example, the pixel drive circuit may include an N-type transistor and a P-type transistor. The N-type transistor may be, for example, an oxide thin film transistor and the P-type transistor may be, for example, a Low Temperature Poly Silicon thin film transistor. An active layer of the Low Temperature Poly Silicon thin film transistor is made of Low Temperature Poly Silicon (LTPS), and an active layer of the oxide thin film transistor is made of an oxide semiconductor (Oxide). The Low-temperature Poly Silicon thin film transistor has advantages of a high mobility, fast charging, etc., while an oxide thin film transistor has an advantage of a low leakage current, etc. The Low Temperature Poly Silicon thin film transistor and the oxide thin film transistor are integrated on one display substrate to form a Low Temperature Polycrystalline Oxide (LTPO) display substrate, and advantages of both the Low Temperature Poly Silicon thin film transistor and the oxide thin film transistor may be utilized to achieve low frequency drive, reduce power consumption, and improve display quality.

In some exemplary implementations, the gate drive circuit includes a plurality of cascaded shift register units. For example, an input terminal of a first stage shift register unit may be connected with an initial signal line, and a first output terminal of an i-th stage shift register unit may be connected with an input terminal of an (i+1)-th stage shift register unit to provide an input signal to the (i+1)-th stage shift register unit, wherein i is a positive integer. A second output terminal of a shift register unit may provide a scanning signal to a sub-pixel through a scanning line and provide a reset signal to a sub-pixel through a reset signal line. For example, a first output signal provided by a first output terminal of a shift register unit may be configured to control turning on of a P-type transistor (for example, a Low Temperature Poly Silicon thin film transistor) in a pixel circuit, and a second output signal provided by a second output terminal of the shift register unit may be configured to control turning on of an N-type transistor (for example, an oxide thin film transistor) in a pixel circuit. However, the embodiment is not limited thereto.

FIG. 1 is a schematic diagram of a structure of a shift register unit according to at least one embodiment of the present disclosure. In some exemplary implementations, as shown in FIG. 1, the shift register unit provided in this exemplary embodiment includes a first output circuit 10 and a second output circuit 20. The first output circuit 10 outputs a first output signal through a first output terminal OUT1, and the second output circuit 20 outputs a second output signal through a second output terminal OUT2. A phase of the first output signal is opposite to a phase of the second output signal.

In some exemplary implementations, as shown in FIG. 1, the first output circuit 10 includes a first node control sub-circuit 11, a second node control sub-circuit 12, and a first output sub-circuit 13. The first node control sub-circuit 11 is connected with an input terminal INPUT, the first output terminal OUT1, a first power supply terminal V1, a second power supply terminal V2, a first clock terminal CK1, a second clock terminal CK2, a third clock terminal CK3, a first node N1, and a second node N2, and is configured to control potentials of the first node N1 and the second node N2 under control of the first clock terminal CK1, the input terminal INPUT, and the third clock terminal CK3. The second node control sub-circuit 12 is connected with the first node N1, the second node N2, the second power supply terminal V2, and the first output terminal OUT1, and is configured to maintain the potentials of the first node N1 and the second node N2. The first output sub-circuit 13 is connected with the second clock terminal CK2, the second power supply terminal V2, the first node N1, the second node N2, and the first output terminal OUT1, and is configured to control the first output terminal OUT1 to output a first output signal under control of the first node N1 and the second node N2.

In some exemplary implementations, as shown in FIG. 1, the second output circuit 20 includes a denoising control sub-circuit 21, a second output sub-circuit 22, and a third output sub-circuit 23. The denoising control sub-circuit 21 is connected with the first clock terminal CK1, the third clock terminal CK3, a first denoising control node PD1, the first output terminal OUT1, the first power supply terminal V1, and the second power supply terminal V2. The denoising control sub-circuit 21 is configured to rectify a charge of the first power supply terminal V1 to the first denoising control node PD1 under control of the third clock terminal CK3, so that the first denoising control node PD1 is maintained at a voltage that enables the second output sub-circuit 22 to be turned on; and to transmit a signal of the second power supply terminal V2 to the first denoising control node PD1 under control of the first output terminal OUT1, so that the first denoising control node PD1 is maintained at a voltage that enables the second output sub-circuit 22 to be turned off. The second output sub-circuit 22 is connected with the first denoising control node PD1, the second output terminal OUT2, and the first power supply terminal V1, and is configured to transmit a signal of the first power supply terminal V1 to the second output terminal OUT2 under control of the first denoising control node PD1. The third output sub-circuit 23 is connected with the first node N1, the fourth clock terminal CB, and the second output terminal OUT2, and is configured to transmit a signal of the fourth clock terminal CB to the second output terminal OUT2 under control of the first node N1.

In some examples, the first power supply terminal V1 may continuously provide a low-level signal, and the second power supply terminal V2 may continuously provide a high-level signal. However, the embodiment is not limited thereto.

In this exemplary implementation, a phase of a first output signal output by the first output terminal OUT1 is opposite to a phase of a second output signal output by the second output terminal OUT2. By providing the denoising control sub-circuit in the second output circuit, it is possible to continuously denoise the second output terminal OUT2 of the shift register unit, thereby improving display stability.

Figure 2:
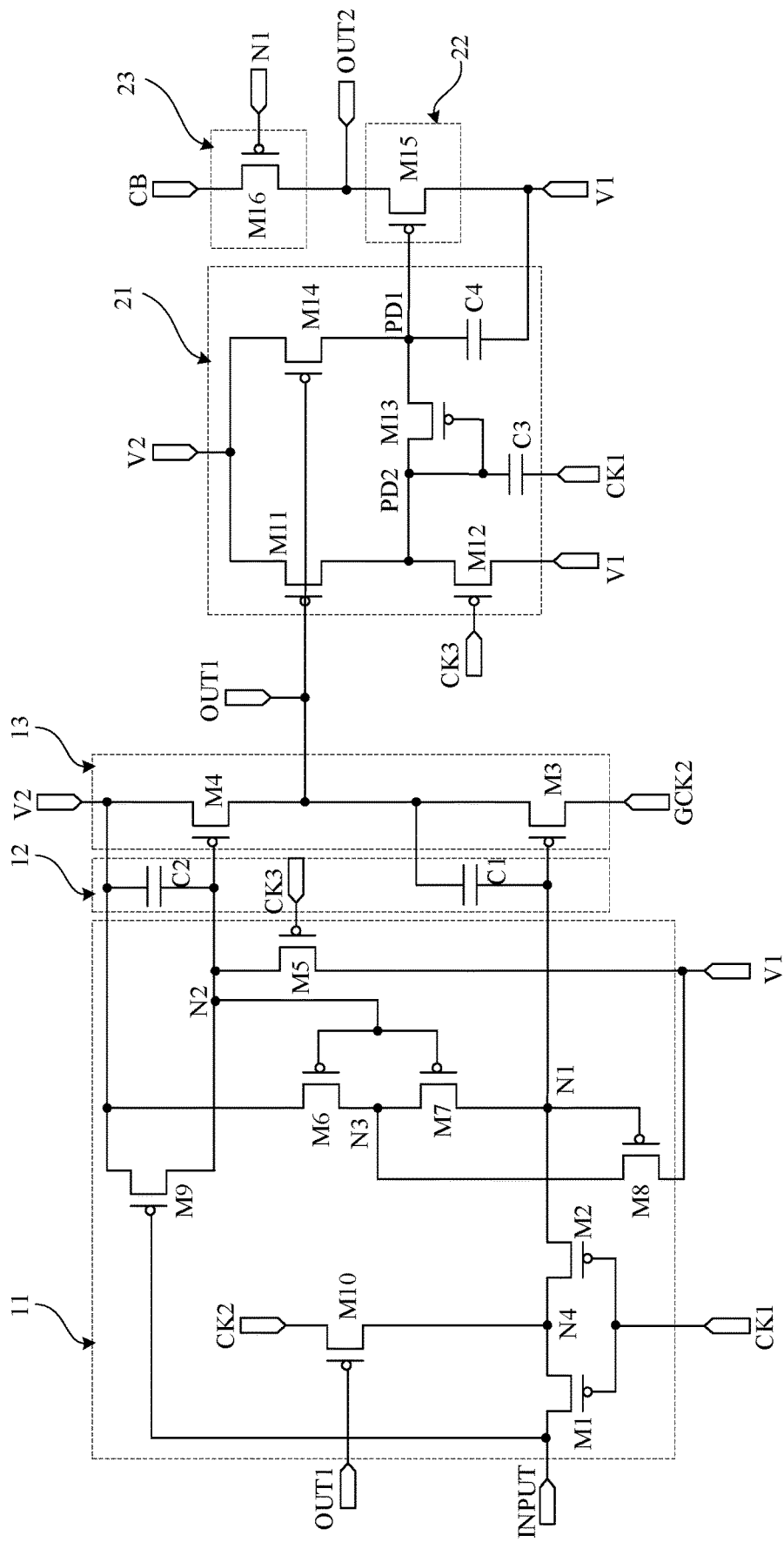
FIG. 2 is an equivalent circuit diagram of a shift register unit according to at least one embodiment of the present disclosure.

FIG. 2 is an equivalent circuit diagram of a shift register unit according to at least one embodiment of the present disclosure. As shown in FIG. 2, the first node control sub-circuit 11 includes a first control transistor M1, a second control transistor M2, a third control transistor M5, a fourth control transistor M6, a fifth control transistor M7, a sixth control transistor M8, a seventh control transistor M9, and an eighth control transistor M10.

The first control transistor M1 has a control electrode connected with the first clock terminal CK1, a first electrode connected with the input terminal INPUT, and a second electrode connected with the fourth node N4. The second control transistor M2 has a control electrode connected with the first clock terminal CK1, a first electrode connected with the fourth node N4, and a second electrode connected with the first node N1. The third control transistor M5 has a control electrode connected with the third clock terminal CK3, a first electrode connected with the first power supply terminal V1, and a second electrode connected with the second node N2. The fourth control transistor M6 has a control electrode connected with the second node N2, a first electrode connected with the second power supply terminal V2, and a second electrode connected with the third node N3. The fifth control transistor M7 has a control electrode connected with the second node N2, a first electrode connected with the third node N3, and a second electrode connected with the first node N1. The sixth control transistor M8 has a control electrode connected with the first node N1, a first electrode connected with the first power supply terminal V1, and a second electrode connected with the third node N3. The seventh control transistor M9 has a control electrode connected with the input terminal INPUT, a first electrode connected with the second power supply terminal V2, and a second electrode connected with the second node N2. The eighth control transistor M10 has a control electrode connected with the first output terminal OUT1, a first electrode connected with the second clock terminal CK2, and a second electrode connected with the fourth node N4.

In the exemplary embodiment, the first control transistor M1 and the second control transistor M2 constitute a double gate transistor, and a leakage current of the double gate transistor is small, and a potential of the fourth node N4 is controlled using the eighth control transistor M10 to reduce a drain-source voltage of the first control transistor M1 and the second control transistor M2 for a set period of time to reduce a leakage current of the first control transistor M1 and the second control transistor M2. The fourth control transistor M6 and the fifth control transistor M7 constitute a double gate transistor, a potential of the third node N3 is controlled using the sixth control transistor to reduce a drain-source voltage of the fourth control transistor M6 and a drain-source voltage of the fifth control transistor M7 for a set period of time to reduce a leakage current of the fourth control transistor M6 and a leakage current of the fifth control transistor M7.

The second node control sub-circuit 12 includes a first capacitor C1 and a second capacitor C2. The first capacitor C1 has a first electrode connected with the first node N1, and a second electrode connected with the first output terminal OUT1. The second capacitor C2 has a first electrode connected with the second node N2, and a second electrode connected with the second power supply terminal V2.

The first output sub-circuit 13 includes a first output transistor M3 and a second output transistor M4. The first output transistor M3 has a control electrode connected with the first node N1, a first electrode connected with the second clock terminal CK2, and a second electrode connected with the first output terminal OUT1. The second output transistor M4 has a control electrode connected with the second node N2, a first electrode connected with the second power supply terminal V2, and a second electrode connected with the first output terminal OUT1.

In some exemplary implementations, as shown in FIG. 2, the denoising control sub-circuit 21 includes a first denoising control transistor M11, a second denoising control transistor M12, a third denoising control transistor M13, a fourth denoising control transistor M14, a third capacitor C3, and a fourth capacitor C4.

The first denoising control transistor M11 has a control electrode connected with the first output terminal OUT1, a first electrode connected with the second power supply terminal V2, and a second electrode connected with a second denoising control node PD2. The second denoising control transistor M12 has a control electrode connected with the third clock terminal CK3, a first electrode connected with the first power supply terminal V1, and a second electrode connected with the second denoising control node PD2. The third denoising transistor M13 has a control electrode and a first electrode that are connected with the second denoising control node PD2, and a second electrode connected with a first denoising control node PD1. The fourth denoising control transistor M14 has a control electrode connected with the first output terminal OUT1, a first electrode connected with the second power supply terminal V2, and a second electrode connected with the first denoising control node PD1. The third capacitor C3 has a first electrode connected with the second denoising control node PD2, and a second electrode connected with the first clock terminal CK1. The fourth capacitor C4 has a first electrode connected with the first denoising control node PD1, and a second electrode connected with the first power supply terminal V1.

In the exemplary embodiment, a charge pump structure is formed by the second denoising control transistor M12, the third denoising control transistor M13, the third capacitor C3, and the fourth capacitor C4, and a potential of the first denoising control node PD1 is stabilized at a potential that enables the second output sub-circuit to be turned on by using a voltage regulation function of the charge pump structure, thereby ensuring that the second output sub-circuit is continuously turned on in a holding phase during a drive process of a row of gate lines, so as to continuously denoise the second output terminal.

In some exemplary implementations, the second output sub-circuit includes a third output transistor M15. The third output transistor M15 has a control electrode connected with the first denoising control node PD1, a first electrode connected with the first power supply terminal V1, and a second electrode connected with the second output terminal OUT2. The third output sub-circuit includes a fourth output transistor M16. The fourth output transistor M16 has a control electrode connected with the first node N1, a first electrode connected with the fourth clock terminal CB, and a second electrode connected with the second output terminal OUT2.

In the exemplary embodiment, the first denoising control node PD1, the second denoising control node PD2, the first node N1, the second node N2, the third node N3, and the fourth node N4 do not represent actual components, but represent convergence points of related electrical connections in a circuit diagram. In other words, these nodes are nodes equivalent to the convergence points of related electrical connections in the circuit diagram.

In the exemplary embodiment, an exemplary structure of the first node control sub-circuit, the second node control sub-circuit, the first output sub-circuit, the denoising control sub-circuit, the second output sub-circuit, and the third output sub-circuit is shown in FIG. 2. Those skilled in the art will readily understand that implementations of the first node control sub-circuit, the second node control sub-circuit, the first output sub-circuit, the denoising control sub-circuit, the second output sub-circuit, and the third output sub-circuit are not limited thereto, as long as their functions can be achieved.

Figure 3:
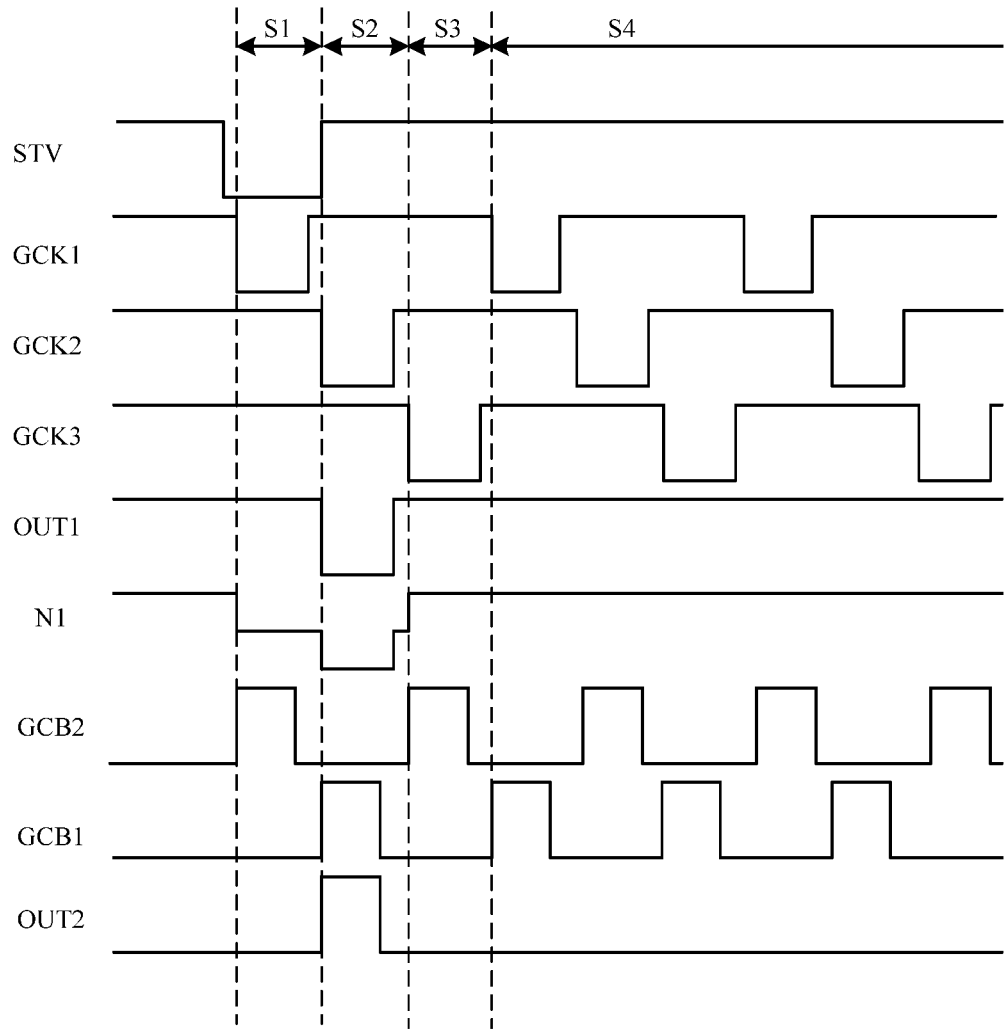
FIG. 3 is a working timing diagram of the shift register unit shown in FIG. 2.

Technical solutions of the embodiments of the present disclosure will be further described below through a working process of a shift register unit. The following description is made by taking a working process of a first stage shift register unit as an example. An input terminal INPUT of the first stage shift register unit is connected with an initial signal line STV. FIG. 3 is a working timing diagram of the shift register unit shown in FIG. 2.

In the exemplary embodiment, during a drive process of a row of gate lines within one frame period, after the shift register unit outputs a scanning signal through a second output terminal, the shift register unit outputs a non-operating voltage to a gate line with which the shift register unit is connected in a holding phase to ensure that a sub-pixel connected with the gate line is turned off.

A case that transistors in the shift register unit are all P-type transistors, a voltage provided by the first power supply terminal V1 is a low-level voltage, and a voltage provided by the second power supply terminal V2 is a high-level voltage, is taken as an example for following description. In the exemplary embodiment, a case that the shift register unit has a first clock terminal CK1 connected with a first clock signal line GCK1, a second clock terminal CK2 connected with a second clock signal line GCK2, a third clock terminal CK3 connected with a third clock signal line GCK3, and a fourth clock terminal CB connected with a fourth clock signal line GCB1, is taken as an example for following description.

As shown in FIG. 3, the driving process of the shift register unit in a row of gate lines provided in the exemplary embodiment at least includes following phases: a pre-charge phase S1, a bootstrap output phase S2, a node pull-up phase S3, and a holding phase S4.

In the pre-charge phase S1, the initial signal line STV provides a low-level signal, the first clock signal line GCK1 provides a low-level signal, the fourth clock signal line GCB1 provides a low-level signal, and the second clock signal line GCK2 and the third clock signal line GCK3 provide high-level signals. The first control transistor M1 and the second control transistor M2 are turned on under control of the low-level signal provided by the first clock signal line GCK1, the initial signal line STV provides a low-level signal to a first node N1, a potential of the first node N1 is pulled to a low potential VGL+Vth, the first output transistor M3 is turned on under control of the low potential of the first node N1, and the second clock signal line GCK2 provides a high-level signal to the first output terminal OUT1. A voltage stored at both ends of the first capacitor C1 is VGL+Vth−VGH, wherein Vth is a threshold voltage of the first control transistor M1, and VGL is a low voltage.

In the pre-charge phase S1, the seventh control transistor M9 is turned on under control of the low-level signal provided by the input terminal INPUT, and the second power supply terminal V2 provides a high-level signal to the second node N2. The second output transistor M4, the fourth control transistor M6, and the fifth control transistor M7 are turned off under control of a high potential of the second node N2. The third control transistor M5 is turned off under control of a high-level signal provided by the third clock signal line GCK3. The sixth control transistor M8 is turned on under control of the low potential of the first node N1, and the first power supply terminal V1 provides a low-level signal to the third node N3. The eighth control transistor M10 is turned off under control of a high-level signal of the first output terminal OUT1.

In the pre-charge phase S1, both the first denoising control transistor M11 and the fourth denoising control transistor M14 are turned off under control of the high-level signal of the first output terminal OUT1. The second denoising control transistor M12 is turned off under control of a high-level signal provided by the third clock signal line GCK3. The fourth output transistor M16 is turned on under control of the low potential of the first node N1, and the fourth clock signal line GCB1 provides a low-level signal to the second output terminal OUT2.

In the bootstrap output phase S2, the initial signal line STV provides a high-level signal, the first clock signal line GCK1, the third clock signal line GCK3, and the fourth clock signal line GCB1 provide high-level signals, the second clock signal line GCK2 provides a low-level signal. The first control transistor M1 and the second control transistor M2 are turned off under control of a high-level signal provided by the first clock signal line GCK1. The first node N1 is held at a low potential and the first output transistor M3 is turned on. The second clock signal line GCK2 provides a low-level signal to the first output terminal OUT1. Since a voltage at both ends of the first capacitor C1 cannot be abruptly changed, a potential of the first node N1 is pulled down to 2VGL+Vth−2VGH under an action of the first capacitor C1 to ensure that the first output transistor M3 is turned on, wherein VGH is a high voltage.

In the bootstrap output phase S2, the seventh control transistor M9 is turned off under control of the high-level signal provided by the initial signal line STV. Under an action of the second capacitor C2, the second node N2 is maintained at a high potential, and the second output transistor M4, the fourth control transistor M6, and the fifth control transistor M7 are turned off. The sixth control transistor M8 is turned on under control of a low potential of the first node N1, and the first power supply terminal V1 provides a low-level signal to the third node N3.

In the bootstrap output phase S2, both the first denoising control transistor M11 and the fourth denoising control transistor M14 are turned on under control of the low-level signal of the first output terminal OUT1. The second power supply terminal V2 provides a high-level signal to the first denoising control node PD1 and the second denoising control node PD2. The second denoising control node M12 is turned off under control of a high-level signal provided by the third clock signal line GCK3. The third denoising control transistor M13 is turned off under control of a high potential of the second denoising control node PD2, and the third output transistor M15 is turned off under control of a high potential of the first denoising control node PD1. The fourth output transistor M16 is turned on under control of a low potential of the first node N1, and the fourth clock signal line GCB1 provides a high-level signal to the second output terminal OUT2.

During a later time period included in the bootstrap output phase S2, the second clock signal provided by the second clock signal line GCK2 jumps from a low-level signal to a high-level signal. Since a potential of the first node N1 is still lower than a potential of the second clock signal, the first output transistor M3 is turned on, and the first output terminal OUT1 outputs the second clock signal to achieve a low pulse output of the first output terminal OUT1.

In the bootstrap output phase S2, a low potential of the first node N1 controls the fourth output transistor M16 to be turned on, and the second output terminal OUT2 outputs a fourth clock signal provided by the fourth clock signal line GCB1. Since a pulse width of a high pulse of the fourth clock signal is smaller than a pulse width of a low pulse of the second clock signal provided by the second clock signal line GCK2, pulses of the fourth clock signal may all be transmitted to the second output terminal OUT2, including rising and falling portions. A low potential of the first output terminal OUT1 controls the first denoising control transistor M11 and the fourth denoising control transistor M14 to be turned on, stabilizes potentials of the first denoising control node PD1 and the second denoising control node PD2 at high potentials, enables the third output transistor M15 to be turned off, thereby avoiding a conflict in an output logic of the second output terminal OUT2.

In the node pull-up phase S3, the initial signal line STV provides a high-level signal, the first clock signal line GCK1 and the second clock signal line GCK2 provide high-level signals, the third clock signal line GCK3 and the fourth clock signal line GCB1 provides low-level signals. The third control transistor M5 is turned on under control of a low-level signal provided by the third clock signal line GCK3, and the first power supply terminal V1 provides a low-level signal to the second node N2. The second output transistor M4, the fourth control transistor M6, and the fifth control transistor M5 are turned on under control of a low potential of the second node N2, and the second power supply terminal V2 provides a high-level signal to the first output terminal OUT1 and the first node N1. The first output transistor M3 and the sixth control transistor M8 are turned off under control of a high potential of the first node N1.

In the node pull-up phase S3, both the first denoising control transistor M11 and the fourth denoising control transistor M14 are turned off under control of a high-level signal of the first output terminal OUT1. The second denoising control transistor M12 is turned on under control of a low-level signal provided by the third clock signal line GCK3, and the first power supply terminal V1 provides a low-level signal to the second denoising control node PD2. Since the first clock signal line GCK1 provides a high-level signal, a potential stored by the third capacitor C3 is VGL+Vth12−VGH, wherein Vth12 is a threshold voltage of the second denoising control transistor M12. The third denoising control transistor M13 is turned on under control of a low potential of the second denoising control node PD2, and the first denoising control node PD1 is pulled down to a low potential. The third output transistor M15 is turned on under control of a low potential of the first denoising control node PD1, and the first power supply terminal V1 provides a low-level signal to the second output terminal OUT2. The fourth output transistor M16 is turned off under control of a high potential of the first node N1.

In the holding phase S4, the third clock signal provided by the third clock signal line GCK3 periodically pulls a potential of the second node N2 to a low potential, which ensures that the second output transistor M4 is turned on, and enables the first output terminal OUT1 to stably output a high potential. The third clock signal periodically pulls down potentials of the second denoising control node PD2 and the first denoising control node PD1, and VGL+Vth12−VGH is stored in the third capacitor C3. Simultaneously, the first clock signal provided by the first clock signal line GCK1 periodically jumps to a low voltage, a potential of the second denoising control node PD2 and a potential of the first denoising control node PD1 may be pulled to lower potentials through the third capacitor C3, so as to ensure that the third output transistor M15 is fully turned on, and a low-level signal provided by the first power supply terminal V1 is output to the second output terminal OUT2.

According to the exemplary implementation, by continuously denoising the second output terminal OUT2 in the holding phase S4, stability of a displayed picture may be kept and a display effect may be improved.

In some exemplary implementations, as shown in FIG. 3, the first clock signal provided by the first clock signal line GCK1, the second clock signal provided by the second clock signal line GCK2, the third clock signal provided by the third clock signal line GCK3, the fourth clock signal provided by the fourth clock signal line GCB1, and the fifth clock signal provided by the fifth clock signal line GCB2 are all pulse signals. Duty ratios of the first clock signal, the second clock signal, and the third clock signal may be the same. The second clock signal is delayed from the first clock signal by a set time length, and the third clock signal is delayed from the second clock signal by a set time length, so that the first clock signal, the second clock signal, and the third clock signal are not at a low voltage simultaneously. For example, the second clock signal is delayed from the first clock signal by 1H, and the third clock signal is delayed from the second clock signal by 1H, and H is a time length required for a data signal to refresh a row of pixels. Duty ratios of the fourth clock signal and the fifth clock signal may be the same. A duty ratio of the fourth clock signal may be smaller than a duty ratio of the first clock signal. A duty ratio refers to a proportion of a high-level time length time length within a pulse period (including a high-level time length and a low-level time length) to a whole pulse period. The fourth clock signal and the fifth clock signal are not at a high voltage simultaneously. However, the embodiment is not limited thereto.

In some exemplary implementations, the duty ratios of the first clock signal, the second clock signal, and the third clock signal may be slightly less than ⅓, or, the duty ratios of the first clock signal, the second clock signal, and the third clock signal may be approximately equal to ⅓. However, the embodiment is not limited thereto.

Figure 4:
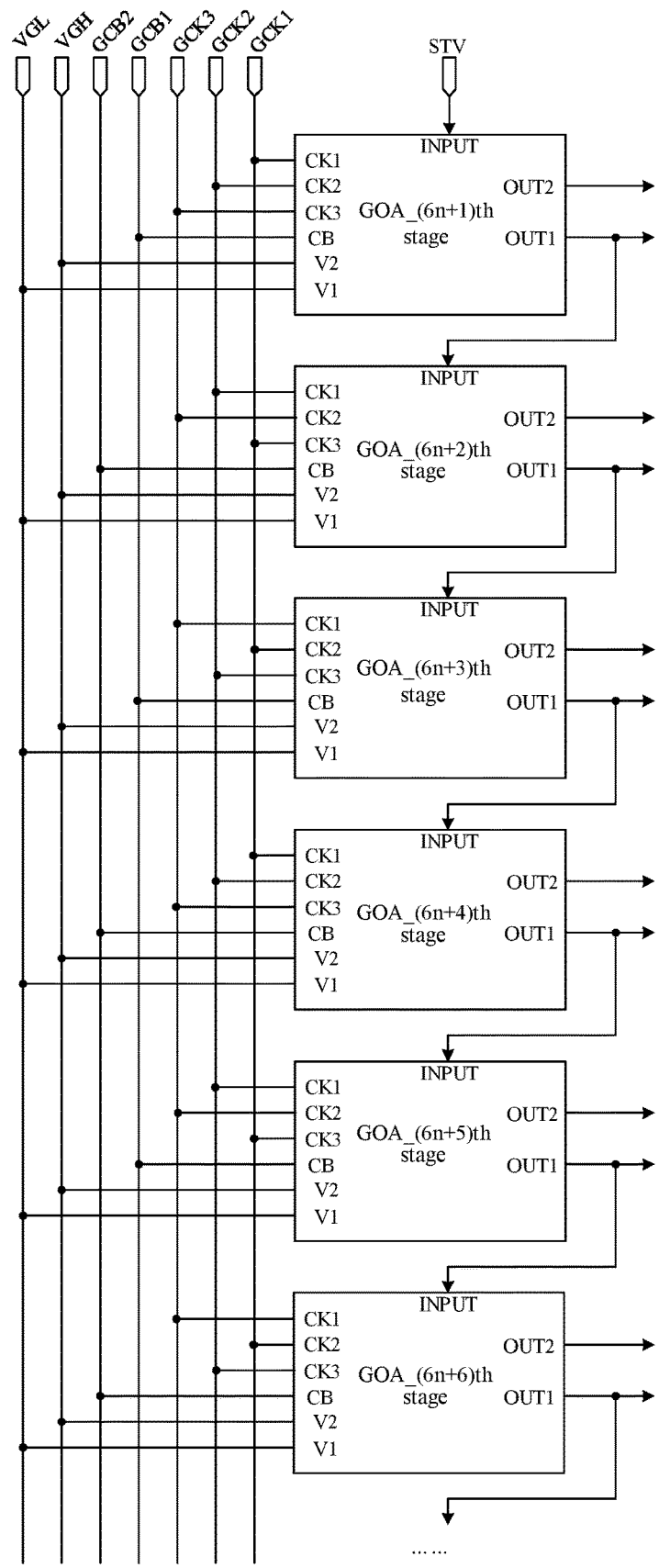
FIG. 4 is a schematic diagram of a cascade of shift register units according to at least one embodiment of the present disclosure.

FIG. 4 is a schematic diagram of a gate drive circuit according to at least one embodiment of the present disclosure. In some exemplary implementation, as shown in FIG. 4, the gate drive circuit includes a plurality of cascaded shift register units.

A (6n+1)th stage shift register unit has a first clock terminal connected with a first clock signal line GCK1, a second clock terminal connected with a second clock signal line GCK2, a third clock terminal connected with a third clock signal line GCK3, and a fourth clock terminal connected with a fourth clock signal line GCB1.

A (6n+2)th stage shift register unit has a first clock terminal connected with the second clock signal line GCK2, a second clock terminal connected with the third clock signal line GCK3, a third clock terminal connected with the first clock signal line GCK1, and a fourth clock terminal connected with a fifth clock signal line GCB2.

A (6n+3)th stage shift register unit has a first clock terminal connected with the third clock signal line GCK3, a second clock terminal connected with the first clock signal line GCK1, a third clock terminal connected with the second clock signal line GCK2, and a fourth clock terminal connected with the fourth clock signal line GCB1.

A (6n+4)th stage shift register unit has a first clock terminal connected with the first clock signal line GCK1, a second clock terminal connected with the second clock signal line GCK2, a third clock terminal connected with the third clock signal line GCK3, and a fourth clock terminal connected with the fifth clock signal line GCB2.

A (6n+5)th stage shift register unit has a first clock terminal connected with the second clock signal line GCK2, a second clock terminal connected with the third clock signal line GCK3, a third clock terminal connected with the first clock signal line GCK1, and a fourth clock terminal connected with the fourth clock signal line GCB1.

A (6n+6)th stage shift register unit has a first clock terminal connected with the third clock signal line GCK3, a second clock terminal connected with the first clock signal line GCK1, a third clock terminal connected with the second clock signal line GCK2, and a fourth clock terminal connected with the fifth clock signal line GCB2, wherein n is a natural number.

In the exemplary implementation, a first group of clock signal lines includes the first clock signal line GCK1, the second clock signal line GCK2, and the third clock signal line GCK3; a second group of clock signal lines includes the fourth clock signal line GCB1 and the fifth clock signal line GCB2. A shift register unit of any stage is connected with three clock signal lines in the first group of clock signal lines and one clock signal line in the second group of clock signal lines. Six cascaded shift register units of the gate drive circuit of the embodiment may be used as a repetition unit with a minimum period to drive six rows of sub-pixels of a display region.

Description of clock signals provided by the first clock signal line GCK1 to the fifth clock signal line GCB2 may be as described above and therefore will not be repeated here.

Figure 5:
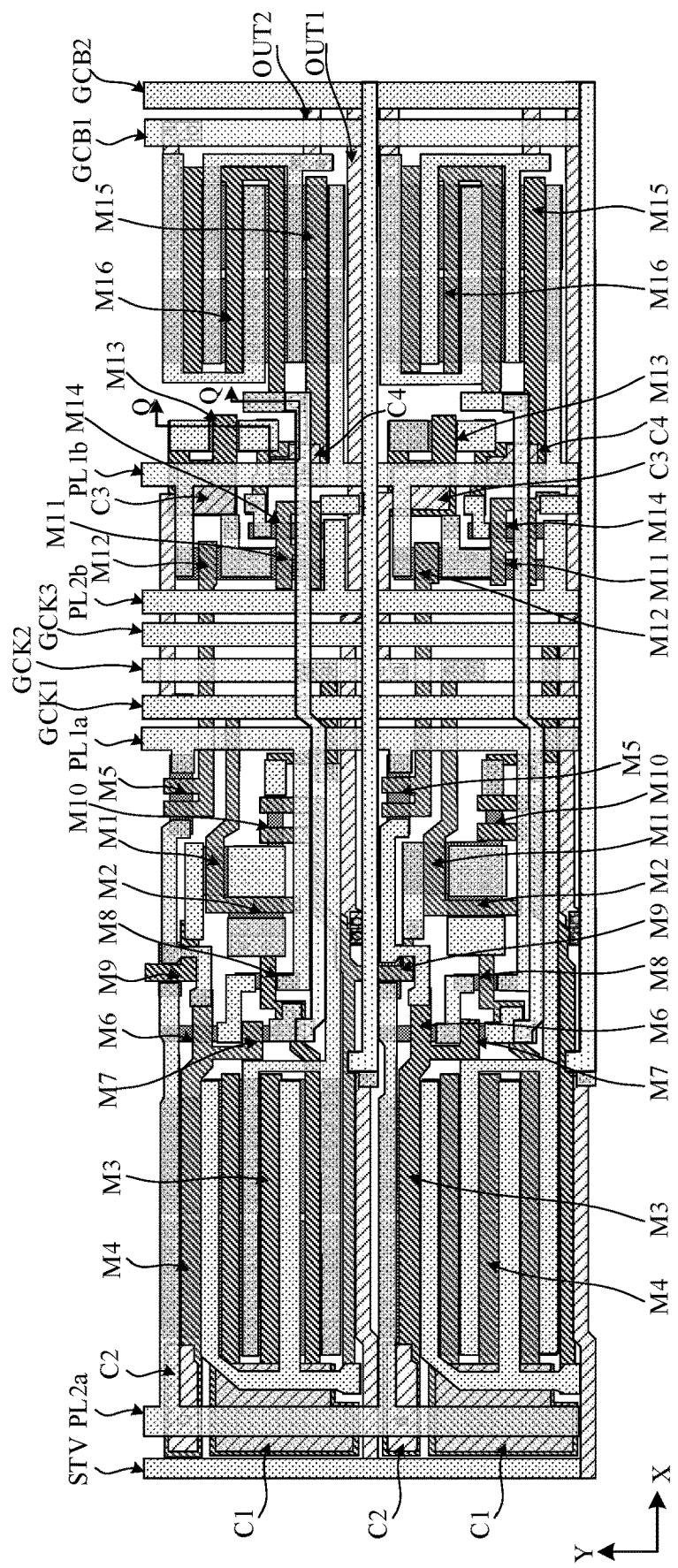
FIG. 5 is a top view of a shift register unit according to at least one embodiment of the present disclosure.
Figure 6:
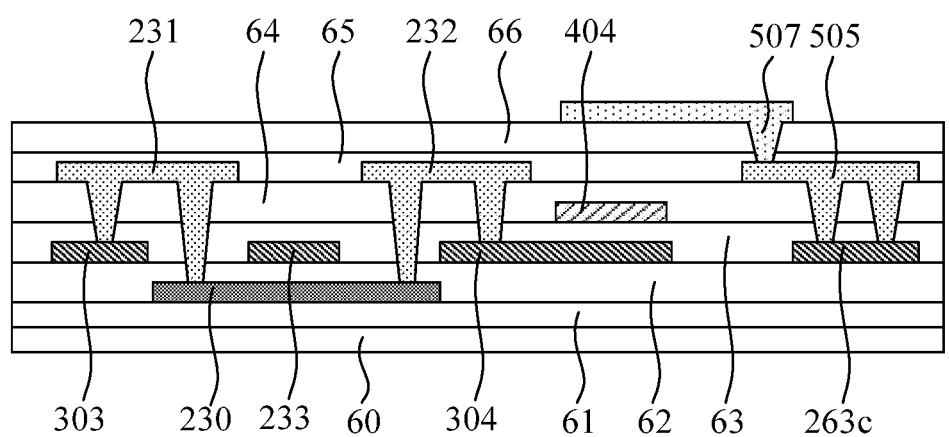
FIG. 6 is a schematic partial sectional view along a Q-Q direction in FIG. 5.

FIG. 5 is a top view of a shift register unit according to at least one embodiment of the present disclosure. In FIG. 5, a (6n+1)th stage shift register unit and a (6n+2)th stage shift register unit (e.g., n=1) that are cascaded are taken as an example for illustration. A structure of the (6n+1)th stage shift register unit is mainly taken as an example for illustration below. FIG. 6 is a schematic partial sectional view along a Q-Q direction in FIG. 5. An equivalent circuit diagram of the shift register unit of the exemplary implementation is shown in FIG. 2. In the exemplary implementation, a case that a transistor in the shift register unit is a P-type transistor and is also a Low Temperature Poly Silicon thin film transistor is taken as an example for description. However, the embodiment is not limited thereto.

In some exemplary implementations, as shown in FIG. 5, in a plane parallel to a display substrate, a first output circuit, a first group of clock signal lines, a second output circuit, and a second group of clock signal lines are sequentially arranged along a first direction X. In this example, the first output circuit and the second output circuit share the first group of clock signal lines, and the first group of clock signal lines is arranged between the first output circuit and the second output circuit, thereby saving wiring space.

In some exemplary implementations, as shown in FIG. 5, the first group of clock signal lines includes a first clock signal line GCK1, a second clock signal line GCK2, and a third clock signal line GCK3. The second group of clock signal lines includes a fourth clock signal line GCB1 and a fifth clock signal line GCB2. The first clock signal line GCK1, the second clock signal line GCK2, and the third clock signal line GCK3 are sequentially arranged in a direction away from the first output circuit in the first direction X. The fourth clock signal line GCB1 and the fifth clock signal line GCB2 are sequentially arranged in a direction away from the second output circuit in the first direction X.

In some exemplary implementations, as shown in FIG. 5, the first group of clock signal lines is located between a first node control sub-circuit of the first output circuit and a denoising control sub-circuit of the second output circuit in the first direction X. The second group of clock signal lines is located on one side of a second output sub-circuit and a third output sub-circuit away from the denoising control sub-circuit. The first node control sub-circuit is located between the first output sub-circuit and the first group of clock signal lines. The first output sub-circuit is located between the second node control sub-circuit and the first node control sub-circuit. The denoising control sub-circuit is located between the first group of clock signal lines and the second output sub-circuit. The second output sub-circuit and the third output sub-circuit are sequentially arranged along a second direction Y. The first direction X and the second direction Y intersect, for example, the first direction X and the second direction Y are perpendicular to each other.

In some exemplary implementations, as shown in FIG. 5, a low-level signal is continuously provided through a first power supply line PL1a and a third power supply line PL1b. The first power supply line PL1a is connected with a first output circuit of the shift register unit, and is configured to provide a low-level signal to the first output circuit; the third power supply line PL1b is connected with the second output circuit of the shift register unit, and is configured to provide a low-level signal to the second output circuit. In the first direction X, the first power supply line PL1a is located between the first node control sub-circuit and the first group of clock signal lines, and the third power supply line PL1b is located on one side of the second output sub-circuit and the third output sub-circuit close to the first group of clock signal lines. However, the embodiment is not limited thereto.

In some exemplary implementations, as shown in FIG. 5, a high-level signal is continuously provided through a second power supply line PL2b and a fourth power supply line PL2a. The second power supply line PL2b is connected with the second output circuit and is configured to provide a high-level signal to the second output circuit. The fourth power supply line PL2a is connected with the first output circuit and is configured to provide a high-level signal to the first output circuit. In the first direction X, the fourth power supply line PL2a is located on one side of the first output sub-circuit away from the first node control sub-circuit, and the second power supply line PL2b is located on one side of the denoising control sub-circuit close to the first group of clock signal lines. However, the embodiment is not limited thereto.

In some exemplary implementations, as shown in FIG. 5, in the first direction X, an initial signal line STV is located on one side of the fourth power supply line PL2a away from the first output sub-circuit. However, the embodiment is not limited thereto.

In some exemplary implementations, as shown in FIG. 5, the first clock signal line GCK1, the second clock signal line GCK2, the third clock signal line GCK3, the fourth clock signal line GCB1, the fifth clock signal line GCB2, the first power supply lines PL1a, the fourth power supply line PL2a, the third power supply line PL1b, the second power supply line PL2b, and the initial signal line STV all extend along the second direction Y. The first output terminal OUT1 and the second output terminal OUT2 both extend along the first direction X.

In some exemplary implementations, as shown in FIG. 5, a first output transistor M3 and a second output transistor M4 of the first output sub-circuit are adjacent in the second direction Y in a plane parallel to a display substrate. A first capacitor C1 and a second capacitor C2 of the second node control sub-circuit are adjacent in the second direction Y. The first capacitor C1 and the first output transistor M3 are adjacent in the first direction X, and the first capacitor C1 is located on one side of the first output transistor M3 away from the first node control sub-circuit. The second capacitor C2 and the second output transistor M4 are adjacent in the first direction X, and the second capacitor C2 is located on one side of the second output transistor M4 away from the first node control sub-circuit.

In some exemplary embodiments, as shown in FIG. 5, a fourth control transistor M6 and a fifth control transistor M7 are adjacent in the second direction Y in a plane parallel to the display substrate. A seventh control transistor M9 and the fourth control transistor M6 are adjacent in the first direction X, and the seventh control transistor M9 is located on one side of the fourth control transistor M6 away from the second output transistor M4. A sixth control transistor M8 and the fifth control transistor M7 are adjacent in the first direction X, and the sixth control transistor M8 is located on one side of the fifth control transistor M7 away from the first output transistor M3. The second control transistor M2 and the sixth control transistor M8 are adjacent in the first direction X, and the second control transistor M2 is located on one side of the sixth control transistor M8 away from the fifth control transistor M7. An eighth control transistor M10 and the second control transistor M2 are adjacent in the first direction X, and the eighth control transistor M10 is located on one side of the second control transistor M2 away from the sixth control transistor M8. In the first direction X, the first control transistor M1 is located between the second control transistor M2 and the eighth control transistor M10. A third control transistor M5 and the first control transistor M1 are adjacent in the first direction X, and the third control transistor M5 is located on one side of the first control transistor M1 away from the second control transistor M2.

In some exemplary implementations, as shown in FIG. 5, a first denoising control transistor M11 and a second denoising control transistor M12 are adjacent in the second direction Y in the plane parallel to the display substrate. The first denoising control transistor M11 and the second denoising control transistor M12 are adjacent to the second power supply line PL2b in the first direction X. The first denoising control transistor M11 and a fourth denoising control transistor M14 are adjacent in the first direction X, and the fourth denoising control transistor M14 is located on one side of the first denoising control transistor M11 away from the second power supply line PL2b. A third capacitor C3 and the second denoising control transistor M12 are adjacent in the first direction X, and the third capacitor C3 is located on one side of the second denoising control transistor M12 away from the second power supply line PL2b. A third denoising control transistor M13 and the third capacitor C3 are adjacent in the first direction X, and the third denoising control transistor M13 is located on one side of the third capacitor C3 away from the second denoising control transistor M12. A fourth capacitor C4 and the fourth denoising control transistor M14 are adjacent in the first direction X, and the fourth capacitor C4 is located on one side of the fourth denoising control transistor M14 away from the first denoising control transistor M11. The third denoising control transistor M13 and the fourth capacitor C4 are adjacent in the second direction Y.

In some exemplary implementations, as shown in FIG. 5, a third output transistor M15 and a fourth output transistor M16 are adjacent in the second direction Y in the plane parallel to the display substrate. The third output transistor M15 and the fourth capacitor C4 are adjacent in the first direction X, and the third output transistor M15 is located on one side of the fourth capacitor C4 away from the fourth denoising control transistor M14. The fourth output transistor M16 and the third denoising control transistor M13 are adjacent in the first direction X, and the fourth output transistor M16 is located on one side of the third denoising control transistor M13 away from the third capacitor C3.

In some exemplary implementations, as shown in FIG. 5, the first output transistor M3 and the second output transistor M4 of the first output sub-circuit and the first control transistor M1 to the eighth control transistor M10 of the first node control sub-circuit are located between the first power supply line PL1a and the fourth power supply line PL2a in the first direction X in the plane parallel to the display substrate. In the first direction X, a first denoising control transistor M11, a second denoising control transistor M12, and a fourth denoising control transistor M14 of the denoising control sub-circuit are located between the third power supply line PL1b and the second power supply line PL2b. A third denoising control transistor M13 of the denoising control sub-circuit, and a third output transistor M15 of the second output sub-circuit, and a fourth output transistor M16 of the third output sub-circuit are located between the third power supply line PL1b and the second group of clock signal lines in the first direction X. The first clock signal line GCK1, the second clock signal line GCK2, and the third clock signal line GCK3 are located between the first power supply line PL1a and the second power supply line PL2b in the first direction X.

In some exemplary implementations, as shown in FIG. 6, in a plane perpendicular to the display substrate, a non-display region of the display substrate may include: a base substrate 60, and a first semiconductor layer, a first conductive layer, a second conductive layer, a third conductive layer, and a fourth conductive layer sequentially disposed on the base substrate 60. A first insulation layer 61 is disposed between the base substrate 60 and the first semiconductor layer, a second insulation layer 62 is disposed between the first conductive layer and the first semiconductor layer, a third insulation layer 63 is disposed between the first conductive layer and the second conductive layer, a fourth insulation layer 64 is disposed between the second conductive layer and the third conductive layer. A fifth insulation layer 65 and a sixth insulation layer 66 are disposed between the third conductive layer and the fourth conductive layer. The fifth insulation layer 65 is located on one side of the sixth insulation layer 66 close to the base substrate 60. In some examples, the first insulation layer 61 to the fifth insulation layer 65 are inorganic insulation layers, and the sixth insulation layer 66 is an organic insulation layer. However, the embodiment is not limited thereto.

Figure 7A:
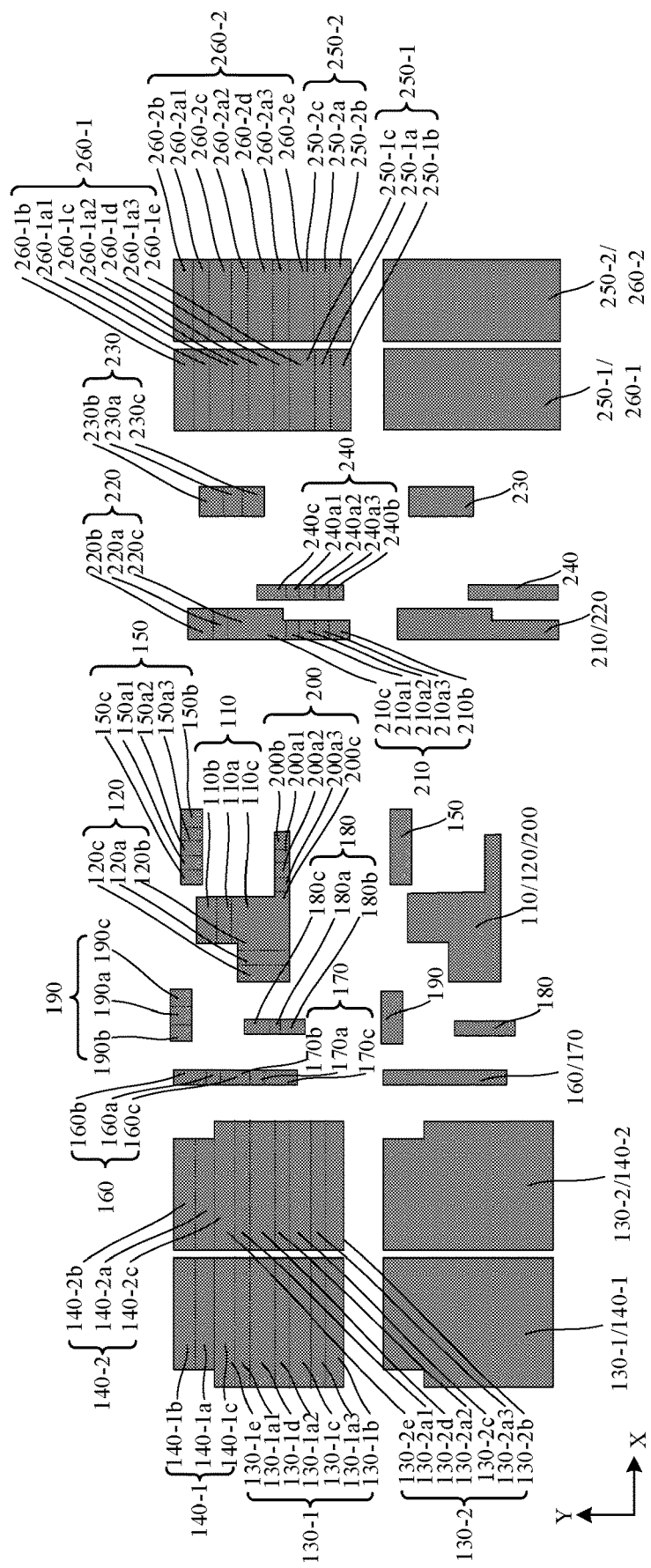
FIG. 7A is a top view of a shift register unit after a first semiconductor layer is formed according to at least one embodiment of the present disclosure.

FIG. 7A is a top view of a shift register unit after a first semiconductor layer is formed according to at least one embodiment of the present disclosure. As shown in FIG. 5 to FIG. 7A, the first semiconductor layer of the non-display region at least includes active layers of a plurality of transistors of the shift register unit. For example, the first semiconductor layer at least includes: an active layer 110 of the first control transistor M1, an active layer 120 of the second control transistor M2, an active layer 150 of the third control transistor M5, an active layer 160 of the fourth control transistor M6, an active layer 170 of the fifth control transistor M7, an active layer 180 of the sixth control transistor M8, an active layer 190 of the seventh control transistor M9, an active layer 200 of the eighth control transistor M10, an active layer 130-1 and an active layer 130-2 of the first output transistor M3, an active layer 140-1 and an active layer 140-2 of the second output transistor M4, an active layer 210 of the first denoising control transistor M11, an active layer 220 of the second denoising control transistor M12, an active layer 230 of third denoising control transistor M13, an active layer 240 of the fourth denoising control transistor M14, an active layer 250-1 and an active layer 250-2 of the third output transistor M15, and an active layer 260-1 and an active layer 260-2 of the fourth output transistor M16.

In some exemplary implementations, in the first direction X, the active layer 160 of the fourth control transistor M6 is located between the active layer 140-2 of the second output transistor M4 and the active layer 190 of the seventh control transistor M9; the active layer 170 of the fifth control transistor M7 is located between the active layer 130-2 of the first output transistor M3 and the active layer 180 of the sixth control transistor M8; the active layer 110 of the first control transistor M1 and the active layer 120 of the second control transistor M2 are located between the active layer 200 of the eighth control transistor M10 and the active layer 180 of the sixth control transistor M8; the active layer 230 of the third denoising control transistor M13 is located between the active layer 220 of the second denoising control transistor M12 and the active layer 260-1 of the fourth output transistor M16; the active layer 240 of the fourth denoising control transistor M14 is located between the active layer 210 of the first denoising control transistor M11 and the active layer 250-1 of the third output transistor M15.

In some exemplary implementations, the active layer 130-1 of the first output transistor M3 and the active layer 140-1 of the second output transistor M4 are of an integral structure, for example, a rectangle with a notch; the active layer 130-2 of the first output transistor M3 and the active layer 140-2 of the second output transistor M4 are of an integral structure, for example, a rectangle with a notch. The active layer 160 of the fourth control transistor M6 and the active layer 170 of the fifth control transistor M7 are of an integral structure, for example, may be in a shape of a rectangle. The active layer 110 of the first control transistor M1, the active layer 120 of the second control transistor M2, and the active layer 200 of the eighth control transistor M10 are of an integral structure. The active layer 210 of the first denoising control transistor M11 and the active layer 220 of the second denoising control transistor M12 are of an integral structure. The active layer 250-1 of the third output transistor M15 and the active layer 260-1 of the fourth output transistor M16 are of an integral structure, for example, in a shape of a rectangle; the active layer 250-2 of the third output transistor M15 and the active layer 260-2 of the fourth output transistor M16 are of an integral structure, for example, in a shape of a rectangle. However, the embodiment is not limited thereto.

In some exemplary implementations, a material of the first semiconductor layer may include, for example, poly silicon. An active layer may include at least one channel region and a plurality of doped regions. A channel region may not be doped with an impurity, and has characteristics of a semiconductor. The plurality of doped regions may be on two sides of the channel region and doped with impurities, and thus have conductivity. An impurity may be changed according to a type of a transistor.

In some exemplary implementations, a doped region of an active layer may be interpreted as a source electrode or drain electrode of a transistor. For example, a source electrode of the first control transistor M1 may correspond to a first doped region 110b doped with an impurity on a periphery of a channel region 110a of the active layer 110, and a drain electrode of the first control transistor M1 may correspond to a second doped region 110c doped with an impurity on the periphery of the channel region 110a of the active layer 110. In addition, a part of an active layer between transistors may be interpreted as a wiring doped with an impurity, and may be used for electrically connecting the transistors.

Figure 7B:
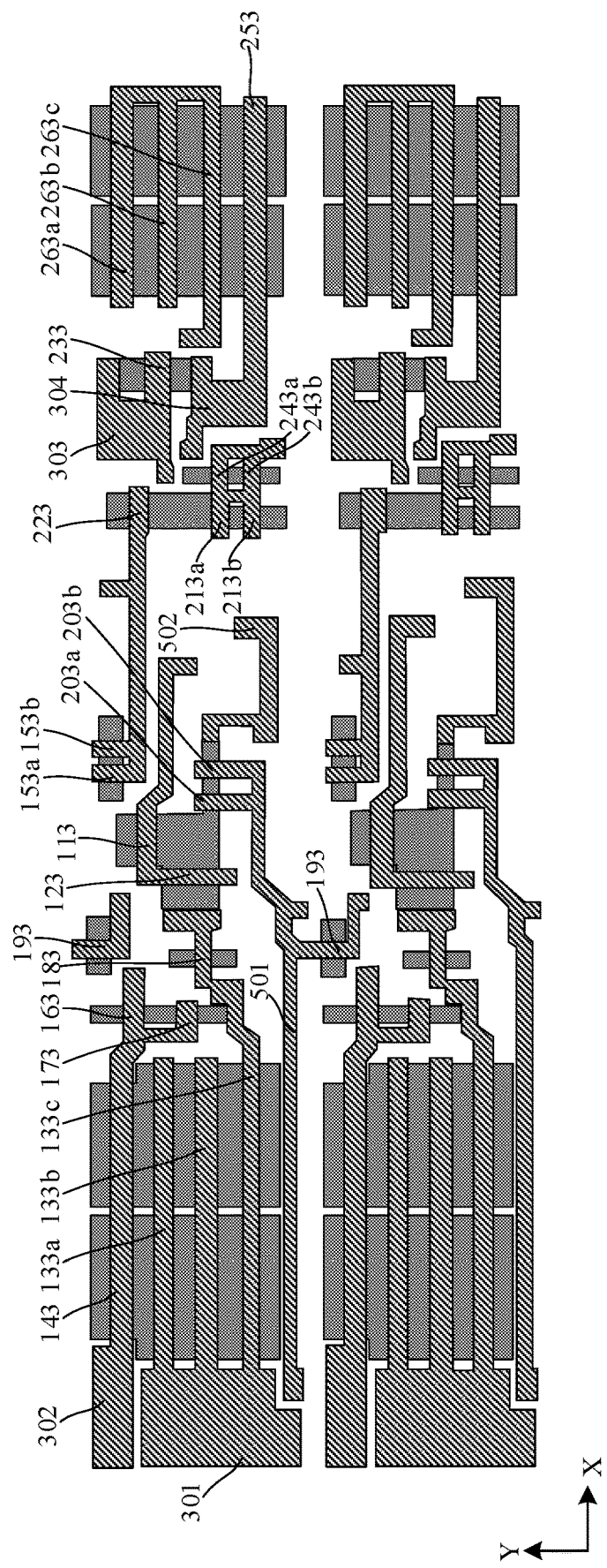
FIG. 7B is a top view of a shift register unit after a first conductive layer is formed according to at least one embodiment of the present disclosure.

FIG. 7B is a top view of a shift register unit after a first conductive layer is formed according to at least one embodiment of the present disclosure. As shown in FIG. 5 to FIG. 7B, the first conductive layer of the non-display region at least includes control electrodes of a plurality of transistors of the shift register unit and first electrodes of a plurality of capacitors. For example, the first conductive layer may include: a control electrode 113 of the first control transistor M1, a control electrode 123 of the second control transistor M2, a control electrode 153a and a control electrode 153b of the third control transistor M5, a control electrode 163 of the fourth control transistor M6, a control electrode 173 of the fifth control transistor M7, a control electrode 183 of the sixth control transistor M8, a control electrode 193 of the seventh control transistor M9, a control electrode 203a and a control electrode 203b of the eighth control transistor M10, a control electrode 133a, a control electrode 133b, and a control electrode 133c of the first output transistor M3, a control electrode 143 of the second output transistor M4, a control electrode 213a and a control electrode 213b of the first denoising control transistor M11, a control electrode 223 of the second denoising control transistor M12, a control electrode 233 of the third denoising control transistor M13, a control electrode 243a and a control electrode 243b of the fourth denoising control transistor M14, a control electrode 253 of the third output transistor M15, a control electrode 263a, a control electrode 263b, and a control electrode 263c of the fourth output transistor M16, a first electrode 301 of the first capacitor C1, a first electrode 302 of the second capacitor C2, a first electrode 303 of the third capacitor C3, a first electrode 304 of the fourth capacitor C4, a first connection electrode 501, and a second connection electrode 502.

In some exemplary embodiments, the first electrode 301 of the first capacitor C1, the control electrode 133a, control electrode 133b, and control electrode 133c of the first output transistor M3, and the control electrode 183 of the sixth transistor M8 may be of an integral structure. The first electrode 302 of the second capacitor C2, the control electrode 143 of the second output transistor M4, the control electrode 163 of the fourth control transistor M6, and the control electrode 173 of the fifth control transistor M7 may be of an integral structure. The control electrode 113 of the first control transistor M1 and the control electrode 123 of the second control transistor M2 may be of an integral structure. The control electrodes 153a and 153b of the third transistor M5 and the control electrode 223 of the second denoising control transistor M12 may be of an integral structure. The control electrodes 213a and 213b of the first denoising control transistor M11 and the control electrodes 243a and 243b of the fourth denoising control transistor M14 may be of an integral structure. The first electrode 303 of the third capacitor C3 and the control electrode 233 of the third denoising control transistor M13 may be of an integral structure. The first electrode 304 of the fourth capacitor C4 and the control electrode 253 of the third output transistor M15 may be of an integral structure. The control electrodes 263a, 263b, and 263c of the fourth output transistor M16 may be of an integral structure. A control electrode 193 of a seventh control transistor M9 of a shift register unit of any stage and control electrodes 203a and 203b of an eighth control transistor M10 of a shift register unit of a previous stage, and a first connection electrode 501 of the shift register unit of the previous stage may be of an integral structure. However, the embodiment is not limited thereto.

In the exemplary implementation, the third control transistor M5, the eighth control transistor M10, the first denoising control transistor M11, and the fourth denoising control transistor M14 may be double gate transistors, and the first output transistor M3 and the fourth output transistor M16 may be tri-gate transistors, so as to prevent and reduce occurrence of a leakage current. However, the embodiment is not limited thereto.

Figure 7C:
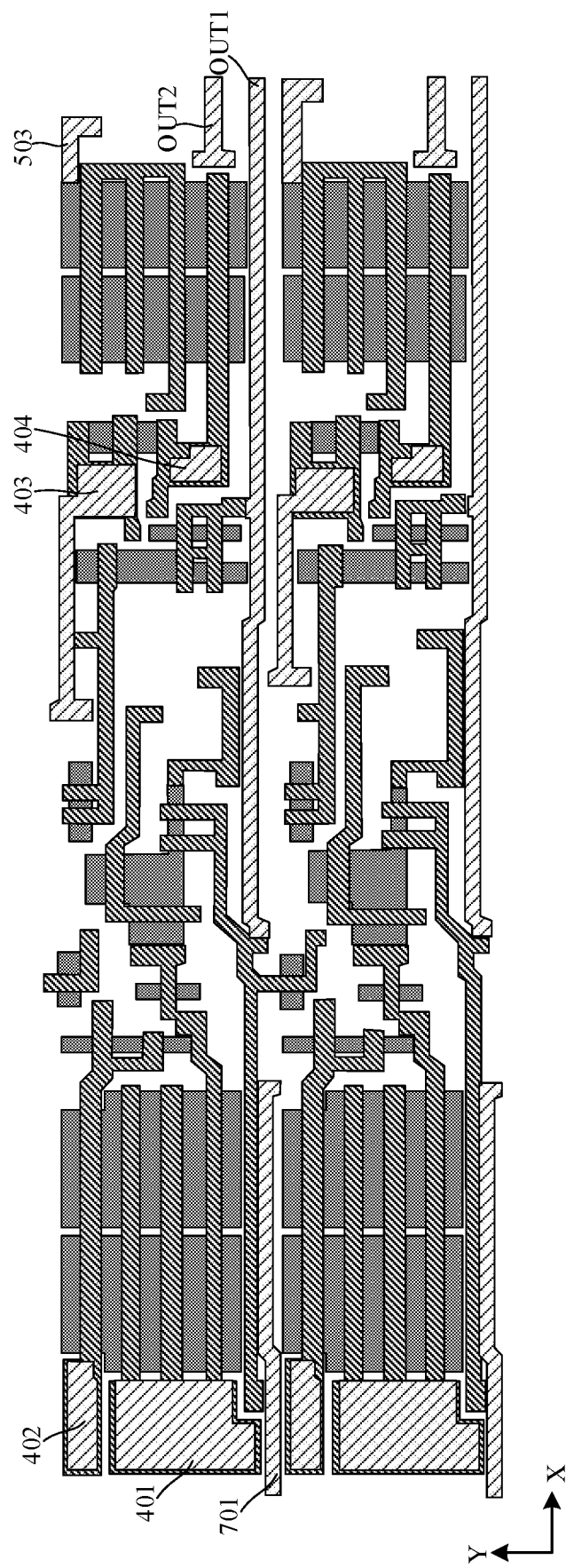
FIG. 7C is a top view of a shift register unit after a second conductive layer is formed according to at least one embodiment of the present disclosure.

FIG. 7C is a top view of a shift register unit after a second conductive layer is formed according to at least one embodiment of the present disclosure. As shown in FIG. 5 to FIG. 7C, the second conductive layer of the non-display region at least includes second electrodes of a plurality of capacitors of the shift register unit, a first output terminal, and a second output terminal. For example, the second conductive layer may include a second electrode 401 of the first capacitor C1, a second electrode 402 of the second capacitor C2, a second electrode 403 of the third capacitor C3, a second electrode 404 of the fourth capacitor C4, a first output terminal OUT1, a second output terminal OUT2, a third connection electrode 503, and a first connection line 701.

In some exemplary implementations, an orthographic projection of the second electrode 401 of the first capacitor C1 on the base substrate 60 is overlapped with an orthographic projection of the first electrode 301 of the first capacitor C1 on the base substrate 60. An orthographic projection of the second electrode 402 of the second capacitor C2 on the base substrate 60 is overlapped with an orthographic projection of the first electrode 302 of the second capacitor C2 on the base substrate 60. An orthographic projection of the second electrode 403 of the third capacitor C3 on the base substrate 60 is overlapped with an orthographic projection of the first electrode 303 of the third capacitor C3 on the base substrate 60. An orthographic projection of the second electrode 404 of the fourth capacitor C4 on the base substrate 60 is overlapped with an orthographic projection of the first electrode 304 of the fourth capacitor C4 on the base substrate 60.

In some exemplary implementations, the first output terminal OUT1 and the second output terminal OUT2 extend along the first direction X. The first output terminal OUT1 is located on one side of the third output transistor M15 away from the fourth output transistor M16 in the second direction Y, and the second output terminal OUT2 is located on one side of the third output transistor M15 away from the fourth capacitor C4 in the first direction X. The first connection line 701 extends along the first direction X and is located between shift register units of two adjacent stages in the second direction Y.

Figure 7D:
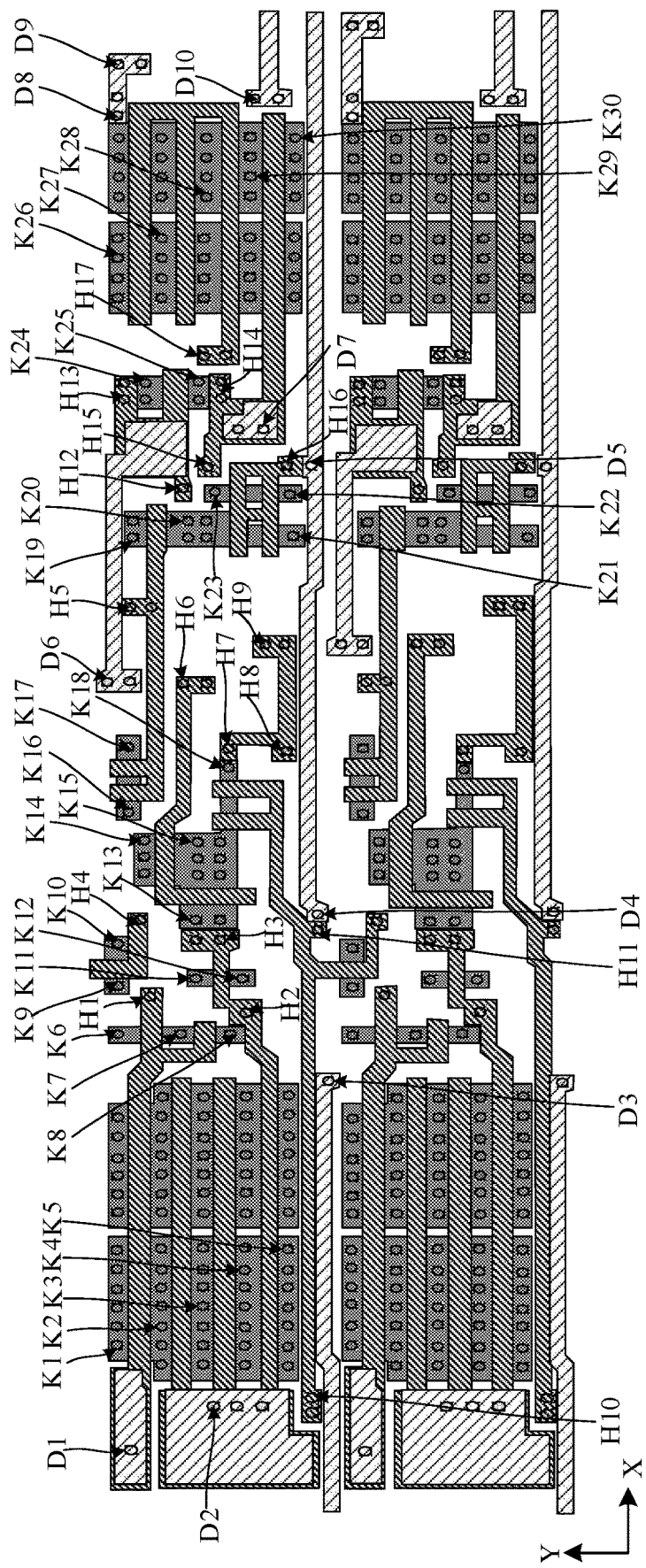
FIG. 7D is a top view of a shift register unit after a fourth insulation layer is formed according to at least one embodiment of the present disclosure.

FIG. 7D is a top view of a shift register unit after a fourth insulation layer is formed according to at least one embodiment of the present disclosure. As shown in FIG. 5 to FIG. 7D, a plurality of vias are formed on a fourth insulation layer 64 of the non-display region. For example, the plurality of vias may include a plurality of first vias K1 to K30, a plurality of second vias H1 to H17, and a plurality of third vias D1 to D10. The fourth insulation layer 64, the third insulation layer 63, and the second insulation layer 62 in the plurality of first vias K1 to K30 are etched away to expose a surface of the first semiconductor layer. The fourth insulation layer 64 and the third insulation layer 63 in the plurality of second vias H1 to H17 are etched away to expose a surface of the first conductive layer. The fourth insulation layer 64 in the plurality of third vias D1 to D10 is etched away to expose a surface of a second conductive layer.

Figure 7E:
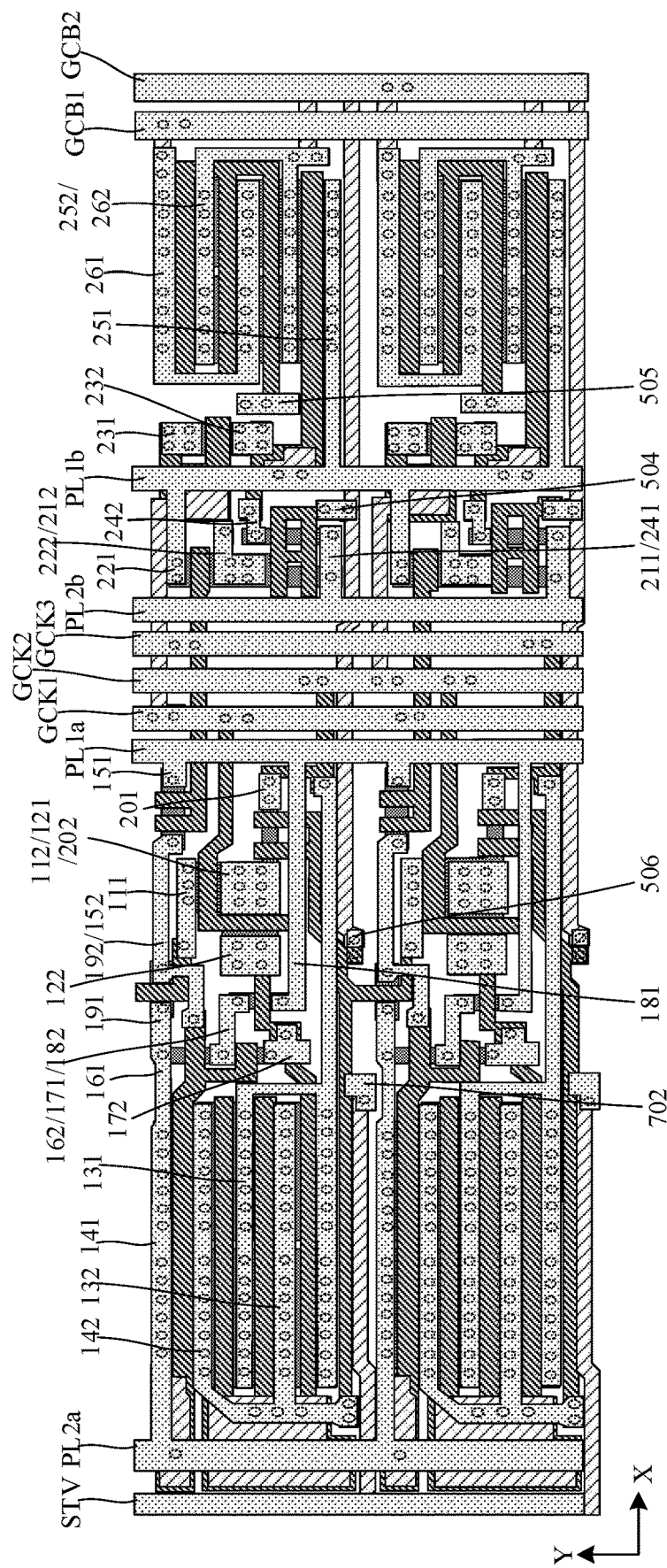
FIG. 7E is a top view of a shift register unit after a third conductive layer is formed according to at least one embodiment of the present disclosure.

FIG. 7E is a top view of a shift register unit after a third conductive layer is formed according to at least one embodiment of the present disclosure. As shown in FIG. 5 to FIG. 7E, the third conductive layer of the non-display region at least includes first electrodes and second electrodes of a plurality of transistors of the shift register unit, a first group of clock signal lines, a second group of clock signal lines, and a plurality of power supply lines. For example, the third conductive layer may include: a first electrode 111 and a second electrode 112 of the first control transistor M1, a first electrode 121 and a second electrode 122 of the second control transistor M2, a first electrode 151 and a second electrode 152 of the third control transistor M5, a first electrode 161 and a second electrode 162 of the fourth control transistor M6, a first electrode 171 and a second electrode 172 of the fifth control transistor M7, a first electrode 181 and a second electrode 182 of the sixth control transistor M8, a first electrode 191 and a second electrode 192 of the seventh control transistor M9, a first electrode 201 and a second electrode 202 of the eighth control transistor M10, a first electrode 131 and a second electrode 132 of the first output transistor M3, a first electrode 141 and a second electrode 142 of the second output transistor M4, a first electrode 211 and a second electrode 212 of the first denoising control transistor M11, a first electrode 221 and a second electrode 222 of the second denoising control transistor M12, a first electrode 231 and a second electrode 232 of the third denoising control transistor M13, a first electrode 241 and a second electrode 242 of the fourth denoising control transistor M14, a first electrode 251 and a second electrode 252 of the third output transistor M15, a first electrode 261 and a second electrode 262 of the fourth output transistor M16, an initial signal line STV, a first power supply line PL1a, a third power supply line PL1b, a fourth power supply line PL2a, a second power supply line PL2b, a first clock signal line GCK1, a second clock signal line GCK2, a third clock signal line GCK3, a fourth clock signal line GCB1, a fifth clock signal line GCB2, a fourth connection electrode 504, a fifth connection electrode 505, a sixth connection electrode 506, and a second connection line 702.

In some exemplary implementations, the fourth power supply line PL2a, the first electrode 141 of the second output transistor M4, the first electrode 161 of the fourth control transistor M6, and the first electrode 191 of the seventh control transistor M9 may be of an integral structure. The second electrode 132 of the first output transistor M3 and the second electrode 142 of the second output transistor M4 may be of an integral structure. The second electrode 162 of the fourth control transistor M6, the first electrode 171 of the fifth control transistor M7, and the second electrode 182 of the sixth control transistor M8 may be of an integral structure. The second electrode 112 of the first control transistor M1, the first electrode 121 of the second control transistor M2, and the second electrode 202 of the eighth control transistor M10 may be of an integral structure. The second electrode 192 of the seventh control transistor M9 and the second electrode 152 of the third control transistor M5 may be of an integral structure. The first power supply line PL1a, the first electrode 151 of the third control transistor M5, and the first electrode 181 of the sixth control transistor M8 may be of an integral structure. The second power supply line PL2b, the first electrode 211 of the first denoising control transistor M11, and the first electrode 241 of the fourth denoising control transistor M14 may be of an integral structure. The third power supply line PL1b, the first electrode 221 of the second denoising control transistor M12, and the first electrode 251 of the third output transistor M15 may be of an integral structure. The second electrode 212 of the first denoising control transistor M11 and the second electrode 222 of the second denoising control transistor M12 may be of an integral structure. The second electrode 252 of the third output transistor M15 and the second electrode 262 of the fourth output transistor M16 may be of an integral structure.

Figure 7F:
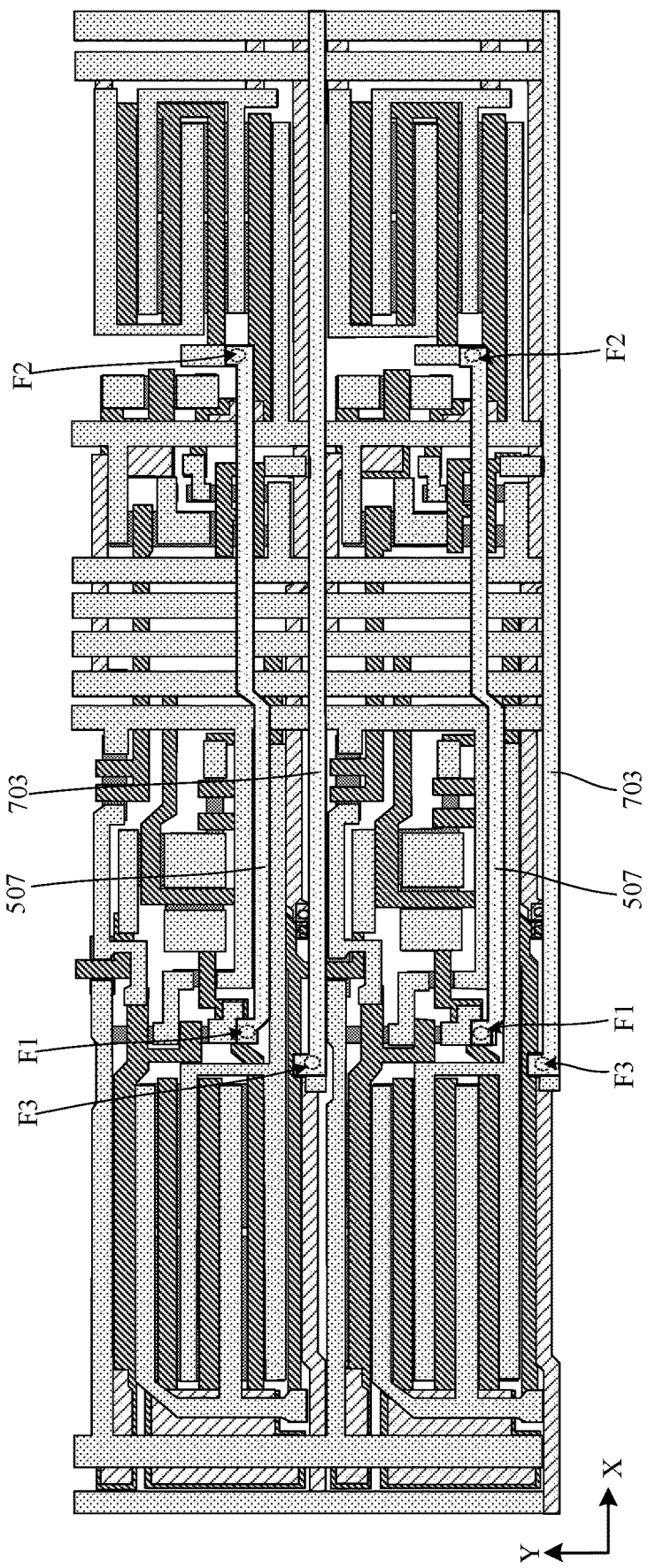
FIG. 7F is a top view of a shift register unit after a fourth conductive layer is formed according to at least one embodiment of the present disclosure.

FIG. 7F is a top view of a shift register unit after a fourth conductive layer is formed according to at least one embodiment of the present disclosure. As shown in FIG. 5 to FIG. 7F, a plurality of vias are formed on the sixth insulation layer 66 of the non-display region. For example, the plurality of vias may include a plurality of fourth vias F1 to F3. The fifth insulation layer 65 and sixth insulation layer 66 in the plurality of fourth vias F1 to F3 are etched away to expose a surface of the third conductive layer.

In some exemplary implementations, the fourth conductive layer of the non-display region at least includes a connection electrode. For example, the fourth conductive layer may include a seventh connection electrode 507 and a third connection line 703. The seventh connection electrode 507 and the third connection line 703 both extend along the first direction X. The seventh connection electrode 507 may be connected with the second electrode 172 of the fifth control transistor M7 through the fourth via F1 and also connected with the fifth connection electrode 505 through the fourth via F2. The fifth connection electrode 505 is connected with the control electrode 263c of the fourth output transistor M16 through two second vias H17 disposed vertically. The third connection line 703 may be connected with the second connection line 702 through the fourth via F3, and the second connection line 702 may be connected with the first connection line 701 through the third via D3.

In some examples, the gate drive circuit of the embodiment may be configured to provide a scanning signal and a reset signal to a sub-pixel of the display region, and a light emitting drive circuit may be provided on one side of the gate drive circuit of the example away from the display region, and is configured to provide a light emitting control signal to the sub-pixel of the display region. The light emitting drive circuit may include a plurality of cascaded shift registers. An output terminal of a shift register unit of any stage of the light emitting drive circuit may be connected with the first connection line 701, and sequentially connected with the second connection line 702 and the third connection line 703 to transmit a light emitting control signal to the display region. However, the embodiment is not limited thereto.

In some exemplary implementations, the first control transistor M1 includes an active layer 110, a control electrode 113, a first electrode 111, and a second electrode 112. The active layer 110 includes a channel region 110a, a first doped region 110b, and a second doped region 110c. The control electrode 113 of the first control transistor M1 and the control electrode 123 of the second control transistor M2 are of an integral structure. The control electrode 113 of the first control transistor M1 is connected with the first clock signal line GCK1 through two second vias H6 disposed vertically. The first electrode 111 of the first control transistor M1 is connected with the first doped region 110b of the active layer 110 through three first vias K14 disposed side by side and connected with the connection electrode 193 of the seventh control transistor M9 through the second via H4. The second electrode 112 of the first control transistor M1 is connected with the second doped region 110c of the active layer 110 through six first vias K15 arranged in a 2*3 array. The second electrode 113 of the first control transistor M1, the first electrode 121 of the second control transistor M2, and the second electrode 202 of the eighth control transistor M10 are of an integral structure.

In the embodiments of the present disclosure, "disposed side by side" may mean being disposed in sequence along the first direction X, and "disposed vertically" may mean being disposed in sequence along the second direction Y.

In some exemplary implementations, the second control transistor M2 includes an active layer 120, a control electrode 123, a first electrode 121, and a second electrode 122. The active layer 120 includes a channel region 120a, a first doped region 120b, and a second doped region 120c. The active layer 120 of the second control transistor M2 and the active layer 110 of the first control transistor M1 are of an integral structure, and the first doped region 120b of the active layer 120 is connected with the second doped region 110c of the active layer 110. The second electrode 122 of the second control transistor M2 is connected with the second doped region 120c of the active layer 120 through two first vias K13 disposed vertically, and is also connected with the control electrode 183 of the sixth control transistor M8 through two second vias H3 disposed vertically.

In some exemplary implementations, the third control transistor M5 includes an active layer 150, control electrodes 153a and 153b, a first electrode 151, and a second electrode 152. The active layer 150 includes channel regions 150a1, 150a2, and 150a3, a first doped region 150b, and a second doped region 150c. The control electrodes 153a and 153b of the third transistor M5 and the control electrode 223 of the second denoising control transistor M12 are of an integral structure. The control electrodes 153a and 153b of the third control transistor M5 is connected with the third clock signal line GCK3 through two second vias H5 disposed vertically. The first electrode 151 of the third control transistor M5 is connected with the first doped region 150b of the active layer 150 through the first via K17. The first electrode 151 of the third control transistor M5 and the first power supply line PL1a are of an integral structure. The second electrode 152 of the third control transistor M5 is connected with the second doped region 150c of the active layer 150 through the first via K16. The second electrode 152 of the third control transistor M5 and the second electrode 192 of the seventh control transistor M9 are of an integral structure.

In some exemplary implementations, the fourth control transistor M6 includes an active layer 160, a control electrode 163, a first electrode 161, and a second electrode 162. The active layer 160 includes a channel region 160a, a first doped region 160b, and a second doped region 160c. The active layer 160 of the fourth control transistor M6 and the active layer 170 of the fifth control transistor M7 are of an integral structure, and the second doped region 160c of the active layer 160 is connected with the first doped region 170b of the active layer 170. The control electrode 163 of the fourth control transistor M6 is connected with the second electrode 192 of the seventh control transistor M9 through the second via H1. The control electrode 163 of the fourth control transistor M6, the control electrode 173 of the fifth control transistor M7, the control electrode 143 of the second output transistor M4, and the first electrode 302 of the second capacitor C2 may be of an integral structure. The first electrode 161 of the fourth control transistor M6 is connected with the first doped region 160b of the active layer 160 through the first via K6. The first electrode 161 of the fourth control transistor M6, the first electrode 191 of the seventh control transistor M9, the first electrode 141 of the second output transistor M4, and the fourth power supply line PL2a are of an integral structure. The second electrode 162 of the fourth control transistor M6 is connected with the second doped region 160c of the active layer 160 through the first via K7. The second electrode 162 of the fourth control transistor M6, the first electrode 172 of the fifth control transistor M7, and the second electrode 182 of the sixth control transistor M8 are of an integral structure.

In some exemplary implementations, the fifth control transistor M7 includes an active layer 170, a control electrode 173, a first electrode 171, and a second electrode 172. The active layer 170 includes a channel region 170a, a first doped region 170b, and a second doped region 170c. The second electrode 172 of the fifth control transistor M7 is connected with the second doped region 170c of the active layer 170 through the first via K8, and is also connected with the control electrode 183 of the sixth control transistor M6 through the second via H2.

In some exemplary implementations, the sixth control transistor M8 includes an active layer 180, a control electrode 183, a first electrode 181, and a second electrode 182. The active layer 180 includes a channel region 180a, a first doped region 180b, and a second doped region 180c. The control electrode 183 of the sixth control transistor M8, the control electrodes 133a, 133b, and 133c of the first output transistor M3, and the first electrode 301 of the first capacitor C1 may be of an integral structure. The first electrode 181 of the sixth control transistor M8 is connected with the first doped region 180b of the active layer 180 through the first via K12. The first electrode 181 of the sixth control transistor M8 and the first power supply line PL1a are of an integral structure. The second electrode 182 of the sixth control transistor M8 is connected with the second doped region 180c of the active layer 180 through the first via K11.

In some exemplary implementations, the seventh control transistor M9 includes an active layer 190, a control electrode 193, a first electrode 191, and a second electrode 192. The active layer 190 includes a channel region 190a, a first doped region 190b, and a second doped region 190c. The first electrode 191 of the seventh control transistor M9 is connected with the first doped region 190b of the active layer 190 through the first via K9, and the second electrode 192 is connected with the second doped region 190c of the active layer 190 through the first via K10. A control electrode 193 of a seventh control transistor M9 of a shift register unit of any stage, control electrodes 203a and 203b of an eighth control transistor M10 of a shift register unit of a previous stage, and a first connection electrode 501 of the shift register unit of the previous stage are of an integral structure. In this way, a first output signal output by a shift register unit of this stage is transmitted to an input terminal of a shift register unit of a next stage. The first connection electrode 501 is connected with the second electrode 132 of the first output transistor M3 through two second vias H10 disposed side by side.

In some exemplary implementations, the eighth control transistor M10 includes an active layer 200, control electrodes 203a and 203b, a first electrode 201, and a second electrode 202. The active layer 200 includes channel regions 200a1, 200a2, and 200a3, a first doped region 200b, and a second doped region 200c. The active layer 200 of the eighth control transistor M10 and the active layer 110 of the first control transistor M1 are of an integral structure, and the second doped region 200c of the active layer 200 is connected with the second doped region 110c of the active layer 110. The control electrodes 203a and 203b of the eight control transistor M10 are of an integral structure and may be connected with the sixth connection electrode 506 through the second via H11. The sixth connection electrode 506 may be connected with the first output terminal OUT1 through the third via D4. The first electrode 201 of the eighth control transistor M10 is connected with the first doped region 200b of the active layer 200 through the first via K18, and is also connected with the second connection electrode 502 through the second via H7. The second connection electrode 502 is connected with the first electrode 131 of the first output transistor M3 through the second via H8, and is also connected with the second clock signal line GCK2 through two second via H9 disposed vertically.

In some exemplary implementations, the first output transistor M3 includes active layers 130-1 and 130-2, control electrodes 133a, 133b, and 133c, a first electrode 131, and a second electrode 132. The active layer 130-1 includes channel regions 130-1a1, 130-1a2, and 130-1a3, a first doped region 130-1b, a second doped region 130-1c, a third doped region 130-1d, and a fourth doped region 130-1e. The active layer 130-2 includes channel regions 130-2a1, 130-2a2, and 130-2a3, a first doped region 130-2b, a second doped region 130-2c, a third doped region 130-2d, and a fourth doped region 130-2e. The active layer 130-1 of the first output transistor M3 and the active layer 140-1 of the second output transistor M4 are of an integral structure, and the fourth doped region 130-1e of the active layer 130-1 is connected with the fourth doped region 140-1c of the active layer 140-1. The active layer 130-2 of the first output transistor M3 and the active layer 140-2 of the second output transistor M4 are of an integral structure, and the fourth doped region 130-2e of the active layer 130-2 is connected with the second doped region 140-2c of the active layer 140-1.

The first electrode 131 of the first output transistor M3 is connected with the first doped region 130-1b of the active layer 130-1 through a plurality of first vias K5 (e.g., seven first vias K5) disposed side by side, and is connected with the first doped region 130-2b of the active layer 130-2 through the plurality of first vias K5 (e.g., seven first vias K5) disposed side by side, and is also connected with the third doped region 130-1d of the active layer 130-1 through a plurality of first vias K3 (e.g., seven first vias K3) disposed side by side, and is connected with the third doped region 130-2d of the active layer 130-2 through the plurality of first vias K3 (e.g., seven first vias K3) disposed side by side, and is also connected with the second connection electrode 502 through the second via H8.

The second electrode 132 of the first output transistor M3 is connected with the second doped region 130-1c of the active layer 130-1 through a plurality of first vias K4 (e.g., seven first vias K4) disposed side by side, and is connected with the second doped region 130-2c of the active layer 130-2 through the plurality of first vias K4 (e.g., seven first vias K4) disposed side by side, and is also connected with the fourth doped region 130-1e of the active layer 130-1 through a plurality of first vias K2 (e.g., seven first vias K2) disposed side by side, and is connected with the fourth doped region 130-2e of the active layer 130-2 through the plurality of first vias K2 (e.g., seven first vias K2) disposed side by side. The second electrode 132 of the first output transistor M3 is also connected with the second electrode 302 of the second capacitor C2 through three third vias D2 disposed vertically, and is also connected with the first connection electrode 501 through two second vias H10 disposed side by side. The second electrode 132 of the first output transistor M3 and the second electrode 142 of the second output transistor M4 are of an integral structure.

In some exemplary implementations, the second output transistor M4 includes active layers 140-1 and 140-2, a control electrode 143, a first electrode 141, and a second electrode 142. The active layer 140-1 includes a channel region 140-1a, a first doped region 140-1b, and a second doped region 140-1c. The active layer 140-2 includes a channel region 140-2a, a first doped region 140-2b, and a second doped region 140-2c. The first electrode 141 of the second output transistor M4 is connected with the first doped region 140-1b of the active layer 140-1 through a plurality of first vias K1 (e.g., six first vias K1) disposed side by side, and is connected with the first doped region 140-2b of the active layer 140-2 through the plurality of first vias K1 (e.g., six first vias K1) disposed side by side.

In some exemplary implementations, the first capacitor C1 includes the first electrode 301 and the second electrode 401. The first electrode 301 and the control electrodes 133a1, 133a2, and 133a3 of the first output transistor M3 are of an integral structure, and the second electrode 401 is connected with the second electrode 132 of the first output transistor M3 through three third vias D2 disposed vertically. The second capacitor C2 includes the first electrode 302 and the second electrode 402. The first electrode 302 and the control electrode 143 of the second output transistor M4 are of an integral structure, and the second electrode 402 is connected with the fourth power supply line PL2a through the third via D1.

In some exemplary implementations, the first denoising control transistor M11 includes an active layer 210, control electrodes 213a and 213b, a first electrode 211, and a second electrode 212. The active layer 210 includes channel regions 210a1, 210a2, and 210a3, a first doped region 210b, and a second doped region 210c. The active layer 210 of the first denoising control transistor M11 and the active layer 220 of the second denoising control transistor M12 are of an integral structure, and the second doped region 210c of the active layer 210 is connected with the second doped region 220c of the active layer 220. The control electrodes 213a and 213b of the first denoising control transistor M11 and the control electrodes 243a and 243b of the fourth denoising control transistor M14 are of an integral structure, and connected with the fourth connection electrode 504 through the second via H16. The fourth connection electrode 504 may be connected with the first output terminal OUT1 through the third via D5. The first electrode 211 of the first denoising control transistor M11 is connected with the first doped region 210b of the active layer 210 through the first via K21. The second electrode 212 of the second denoising control transistor M11 is connected with the second doped region 210c of the active layer 210 through fourth first vias $K_2O$ arranged in a 2*2 array, and is also connected with the first electrode 303 of the third capacitor C3 through the second via H12. The first electrode 211 of the first denoising control transistor M11 and the first electrode 241 of the fourth denoising control transistor M14 are of an integral structure. The second electrode 212 of the first denoising control transistor M11 and the second electrode 222 of the second denoising control transistor M12 are of an integral structure.

In some exemplary implementations, the second denoising control transistor M12 includes an active layer 220, a control electrode 223, a first electrode 221, and a second electrode 222. The active layer 220 includes a channel region 220a, a first doped region 220b, and a second doped region 220c. The first electrode 221 of the second denoising control transistor M12 is connected with the first doped region 220b of the active layer 220 through two first vias K19 disposed side by side.

In some exemplary implementations, the third denoising control transistor M13 includes an active layer 230, a control electrode 233, a first electrode 231, and a second electrode 232. The active layer 230 includes a channel region 230a, a first doped region 230b, and a second doped region 230c. The control electrode of the third denoising control transistor M13 and the first electrode 303 of the third capacitor C3 are of an integral structure. The first electrode 231 of the third denoising control transistor M13 is connected with the first doped region 230b of the active layer 230 through two first vias K24 disposed side by side, and is also connected with the first electrode 303 of the third capacitor C3 through two second vias H13 disposed side by side. The second electrode 232 of the third denoising control transistor M13 is connected with the second doped region 230c of the active layer 230 through two first vias K25 disposed side by side, and is also connected with the first electrode 304 of the fourth capacitor C4 through two second vias H14 disposed side by side.

In some exemplary implementations, the fourth denoising control transistor M14 includes an active layer 240, control electrodes 243a and 243b, a first electrode 241, and a second electrode 242. The active layer 240 includes channel regions 240a1, 240a2, and 240a3, a first doped region 240b, and a second doped region 240c. The first electrode 241 of the fourth denoising control transistor M14 is connected with the first doped region 240b of the active layer 240 through the first via K22. The second electrode 242 of the fourth denoising control transistor M14 is connected with the second doped region 240c of the active layer 240 through the first via K23, and is also connected with the first electrode 304 of the fourth capacitor C4 through the second via H15.

In some exemplary implementations, the third output transistor M15 includes active layers 250-1 and 250-2, a control electrode 253, a first electrode 251, and a second electrode 252. The active layer 250-1 includes a channel region 250-1a, a first doped region 250-1b, and a second doped region 250-1c. The active layer 250-2 includes a channel region 250-2a, a first doped region 250-2b, and a second doped region 250-2c. The active layer 250-1 of the third output transistor M15 and the active layer 260-1 of the fourth output transistor M16 are of an integral structure, and the second doped region 250-1c of the active layer 250-1 is connected with the fourth doped region 260-1e of the active layer 260-1. The active layer 250-2 of the third output transistor M15 and the active layer 260-2 of the fourth output transistor M16 are of an integral structure, and the second doped region 250-2c of the active layer 250-2 is connected with the fourth doped region 260-2e of the active layer 260-2. The control electrode 253 of the third output transistor M15 and the first electrode 303 of the fourth capacitor C4 are of an integral structure.

The first electrode 251 of the third output transistor M15 is connected with the first doped region 250-1b of the active layer 250-1 through a plurality of first vias K30 (e.g., four first vias K30) disposed side by side, and is also connected with the first doped region 250-2b of the active layer 250-2 through the plurality of first vias K30 (e.g., four first vias K30) disposed side by side. The first electrode 251 of the third output transistor M15 and the third power supply line PL1b are of an integral structure.

The second electrode 252 of the third output transistor M15 is connected with the second doped region 250-1c of the active layer 250-1 through a plurality of first vias K29 (e.g., four first vias K29) disposed side by side, and is also connected with the second doped region 250-2c of the active layer 250-2 through the plurality of first vias K29 (e.g., four first vias K29) disposed side by side. The second electrode 252 of the third output transistor M15 and the second electrode 262 of the fourth output transistor M16 are of an integral structure.

In some exemplary implementations, the fourth output transistor M16 includes active layers 260-1 and 260-2, control electrodes 263a, 263b, and 263c, a first electrode 261, and a second electrode 262. The active layer 260-1 includes channel regions 260-1a1, 260-1a2, and 260-1a3, a first doped region 260-1b, a second doped region 260-1c, a third doped region 260-1d, and a fourth doped region 260-1e. The active layer 260-2 includes channel regions 260-2a1, 260-2a2, and 260-2a3, a first doped region 260-2b, a second doped region 260-2c, a third doped region 260-2d, and a fourth doped region 260-2e.

The control electrodes 263a, 263b, and 263c of the fourth output transistor M16 are of an integral structure and are connected with the fifth connection electrode 505 through two second vias H17 disposed vertically. The fifth connection electrode 505 is connected with the sixth connection electrode 506 through the fourth via F2. The sixth connection electrode 506 is connected with the second electrode 172 of the fifth control transistor M7 through the fourth via F1.

The first electrode 261 of the fourth output transistor M16 is connected with the first doped region 260-1b of the active layer 260-1 through a plurality of first vias K26 (e.g., four first vias K26) disposed side by side, and is connected with the first doped region 260-2b of the active layer 260-2 through the plurality of first vias K26 (e.g., four first vias K26) disposed side by side, and is also connected with the third doped region 260-1d of the active layer 260-1 through a plurality of first vias K28 (e.g., four first vias K28) disposed side by side, and is connected with the third doped region 260-2d of the active layer 260-2 through a plurality of first vias K28 (e.g., four first vias K28) disposed side by side. The first electrode 261 of the fourth output transistor M16 is also connected with the third connection electrode 503 through two third vias D8 disposed side by side. The third connection electrode 503 is connected with the fourth clock signal line GCB1 through two third vias D9 disposed vertically.

The second electrode 262 of the fourth output transistor M16 is connected with the second doped region 260-1c of the active layer 260-1 through a plurality of first vias K27 (e.g., four first vias K27) disposed side by side, and is connected with the second doped region 260-2c of the active layer 260-2 through the plurality of first vias K27 (e.g., four first vias K27) disposed side by side. The second electrode 262 of the fourth output transistor M16 is connected with the second output terminal OUT2 through two third vias D10 disposed vertically.

In some exemplary implementations, the third capacitor C3 includes the first electrode 303 and the second electrode 403, the first electrode 303 is connected with the first electrode 231 of the third denoising control transistor M13 and the second electrode 222 of the second denoising control transistor M12, and the second electrode 403 is connected with the first clock signal line GCK1 through two third vias D6 disposed vertically. The fourth capacitor C4 includes the first electrode 304 and the second electrode 404, the first electrode 304 is connected with the second electrode 232 of the third denoising control transistor M13 and the second electrode 242 of the fourth denoising control transistor M14, and the second electrode 404 is connected with the third power supply line PL1b through two third vias D7 disposed vertically.

In some exemplary implementations, as shown in FIG. 5 to FIG. 7F, the control electrode 113 of the first control transistor M1 of the (6n+1)th stage shift register unit may be connected with the first clock signal line GCK1 through the second via, and the second electrode 403 of the third capacitor C3 may be connected with the first clock signal line GCK1 through the third via; the control electrode of the third control transistor M5 and the control electrode of the second denoising control transistor M12 are of an integral structure and may be connected with the third clock signal line GCK3 through the second via; the second connection electrode 502 is connected with the second clock signal line GCK2, and the second connection electrode 502 is connected with the first electrode 201 of the eighth control transistor M10 and the first electrode 131 of the first output transistor M3. The first electrode 261 of the fourth output transistor M16 is connected with the fourth clock signal line GCB1 through the third connection electrode 503.

In some exemplary implementations, as shown in FIG. 5 to FIG. 7F, the control electrode 113 of the first control transistor M1 of the (6n+2)th stage shift register unit may be connected with the second clock signal line GCK2 through the second via, and the second electrode 403 of the third capacitor C3 may be connected with the second clock signal line GCK2 through the second via; the control electrode of the third control transistor M5 and the control electrode of the second denoising control transistor M12 are of an integral structure and may be connected with the first clock signal line GCK1 through the second via; the second connection electrode 502 may be connected with the third clock signal line GCK3, and the second connection electrode 502 may be connected with the first electrode 201 of the eighth control transistor M10 and the first electrode 131 of the first output transistor M3; the first electrode 261 of the fourth output transistor M16 is connected with the fifth clock signal line GCB2 through the third connection electrode 503.

In the exemplary implementation, a connection manner between a shift register unit of each stage, and the first group of clock signal lines and the second group of clock signal lines may be determined in combination with a cascade relationship of shift register units shown in FIG. 4 and a structure of shift registers shown in FIG. 5 to FIG. 7F, so details will not be repeated here.

A structure of the display substrate will be described below through an example of a preparation process of the display substrate. A "patterning process" mentioned in the present disclosure includes processes, such as film layer deposition, photoresist coating, masking and exposure, development, etching, and photoresist stripping. Deposition may be any one or more of sputtering, evaporation, and chemical vapor deposition. Coating may be any one or more of spray coating and spin coating. Etching may be any one or more of dry etching and wet etching. A "thin film" refers to a layer of thin film made of a material on a substrate by using a process of deposition or coating. If a patterning process is not needed for the "thin film" in a whole preparation process, the "thin film" may also be referred to as a "layer". If the patterning process is needed for the "thin film" in the whole preparation process, the thin film is referred to as a "thin film" before the patterning process and referred to as a "layer" after the patterning process. A "layer" after the patterning process includes at least one "pattern".

"A and B are arranged in a same layer" mentioned in the present disclosure refers to that A and B are simultaneously formed through a same patterning process. A "thickness" of a film layer is a size of the film layer in a direction perpendicular to the display substrate. In the exemplary embodiment of the present disclosure, "a projection of A includes a projection of B" refers to that a boundary of the projection of B falls within a range of a boundary of the projection of A or the boundary of the projection of A is overlapped with the boundary of the projection of B.

The preparation process of the display substrate according to the exemplary embodiment may include following acts.

(1) A base substrate is provided.

In some exemplary implementations, a base substrate 60 may be a rigid substrate or a flexible substrate. The rigid substrate may include one or more of glass and metal foil sheet. The flexible substrate may include one or more of polyethylene terephthalate, ethylene terephthalate, polyether ether ketone, polystyrene, polycarbonate, polyarylate, polyarylester, polyimide, polyvinyl chloride, polyethylene, and textile fiber.

(2) A pattern of a first semiconductor layer is formed.

In some exemplary implementations, a first insulation thin film and a first semiconductor thin film are sequentially deposited on the base substrate 60, and the first semiconductor thin film is patterned through a patterning process to form a first insulation layer 61 covering the whole base substrate 60 and the pattern of the first semiconductor layer disposed on the first insulation layer 61, as shown in FIG. 7A. The pattern of the first semiconductor layer at least includes active layers of a plurality of transistors (for example, transistors M1 to M16) in a shift register unit. An active layer may include at least one channel region and a plurality of doped regions. The channel region may not be doped with an impurity, and has characteristics of a semiconductor. A doped region is doped with an impurity and therefore has conductivity. An impurity may be changed according to a type (e.g., an N type or a P type) of a transistor. In some examples, a material of the first semiconductor thin film may be poly silicon.

(3) A pattern of a first conductive layer is formed.

In some exemplary implementations, a second insulation thin film and a first conductive thin film are sequentially deposited on the base substrate 60 where the aforementioned pattern is formed, and the first conductive thin film is patterned through a patterning process to form a second insulation layer 62 covering the pattern of the first semiconductor layer and the pattern of the first conductive layer disposed on the second insulation layer 62, as shown in FIG. 7B. In some examples, the pattern of the first conductive layer may include control electrodes of a plurality of transistors (for example, the transistors M1 to M16) of the shift register unit, first electrodes of a plurality of capacitors (for example, a first capacitor C1 to a fourth capacitor C4) of the shift register unit, and a plurality of connection electrodes (for example, a first connection electrode 501 and a second connection electrode 502).

(4) A pattern of a second conductive layer is formed.

In some exemplary implementations, a third insulation thin film and a second conductive thin film are sequentially deposited on the base substrate 60 where the aforementioned patterns are formed, and the second conductive thin film is patterned through a patterning process to form a third insulation layer 63 covering the first conductive layer and the pattern of the second conductive layer disposed on the third insulation layer 63, as shown in FIG. 7C. In some examples, the pattern of the second conductive layer may include second electrodes of the plurality of capacitors (for example, the first capacitor C1 to the fourth capacitor C4) of the shift register unit, a first output terminal OUT1, a second output terminal OUT2, and a connection electrode (for example, a third connection electrode 503).

(5) A pattern of a fourth insulation layer is formed.

In some exemplary implementations, a fourth insulation thin film is deposited on the base substrate 60 where the aforementioned patterns are formed, and the fourth insulation thin film is patterned through a patterning process to form the pattern of the fourth insulation layer 64 covering the second conductive layer, as shown in FIG. 7D. In some examples, a plurality of vias are opened on the fourth insulation layer 64. The plurality of vias at least include a plurality of first vias K1 to K30, a plurality of second vias H1 to H17, and a plurality of third vias D1 to D10. The fourth insulation layer 64, the third insulation layer 63, and the second insulation layer 62 in the plurality of first vias K1 to K30 are etched away to expose a surface of the first semiconductor layer. The fourth insulation layer 64 and the third insulation layer 63 in the plurality of second vias H1 to H17 are etched away to expose a surface of the first conductive layer. The fourth insulation layer 64 in the plurality of third vias D1 to D10 is etched away to expose a surface of the second conductive layer.

(6) A pattern of a third conductive layer is formed.

In some exemplary implementations, a third conductive thin film is deposited on the base substrate 60 where the aforementioned patterns are formed, and the third conductive thin film is patterned through a patterning process to form the pattern of the third conductive layer on the fourth insulation layer 64, as shown in FIG. 7E. In some examples, the pattern of the third conductive layer may include: first electrodes and second electrodes of the plurality of transistors (e.g., the transistors M1 to M16) of the shift register unit, a first group of clock signal lines (e.g., including a first clock signal line GCK1, a second clock signal line GCK2, and a third clock signal line GCK3), a second group of clock signal lines (e.g., including a fourth clock signal line GCB1 and a fifth clock signal line GCB2), a plurality of power supply lines (e.g., a first power supply line PL1*a*, a fourth power supply line PL2*a*, a third power supply line PL1*b*, and a second power supply line PL2*b*), and connection electrodes (e.g., a fourth connection electrode 504, a fifth connection electrode 505, and a sixth connection electrode 506).

(7) Patterns of a fifth insulation layer and a sixth insulation layer are formed.

In some exemplary implementations, a fifth insulation thin film is deposited on the base substrate 60 where the aforementioned patterns are formed, and then a sixth insulation thin film is coated, and a pattern of the sixth insulation layer 66 is formed through masking, exposing, and developing the sixth insulation thin film; subsequently, the fifth insulation thin film is patterned to form a pattern of the fifth insulation layer 65. In some examples, a plurality of vias are formed on the sixth insulation layer 66. For example, the plurality of vias may include a plurality of fourth vias F1 to F3. The fifth insulation layer 65 and sixth insulation layer 66 in the plurality of fourth vias F1 to F3 are etched away to expose a surface of the third conductive layer.

(8) A pattern of a fourth conductive layer is formed.

In some exemplary implementations, a fourth conductive thin film is deposited on the base substrate 60 where the aforementioned patterns are formed, and the fourth conductive thin film is patterned through a patterning process to form the pattern of the fourth conductive layer on the sixth insulation layer 66, as shown in FIG. 7F. In some examples, the pattern of the fourth conductive layer at least includes a connection electrode, for example, may include a seventh connection electrode 507 and a third connection line 703.

In some exemplary implementations, while a shift register unit is formed in a non-display region, a pixel circuit may be formed in a display region. For example, a first semiconductor layer of the display region may include an active layer of a transistor of a pixel drive circuit, a first conductive layer of the display region may include a control electrode of the transistor of the pixel drive circuit and a first electrode of a storage capacitor, a second conductive layer of the display region may at least include a second electrode of the storage capacitor of the pixel drive circuit, a third conductive layer of the display region may at least include a first electrode and a second electrode of the transistor of the pixel drive circuit, and a fourth conductive layer of the display region may at least include a connection electrode between the pixel drive circuit and an anode of a light emitting element. After the first conductive layer is formed, a second semiconductor layer may be formed in the display region, and an insulation layer is disposed between the second semiconductor layer and the first conductive layer. A material of the second semiconductor film may be a metal oxide, for example, In—Ga—Zn—O (IGZO). However, a position of the second semiconductor layer is not limited in the embodiment.

In some exemplary implementations, after the fourth conductive layer is formed, patterns of a seventh insulation layer, an anode layer, a pixel definition layer, an organic light emitting layer, a cathode layer, and an encapsulation layer may be sequentially formed in the display region. In some examples, on a base substrate where the aforementioned patterns are formed, a seventh insulation thin film is coated, and a pattern of a seventh insulation layer is formed through masking, exposing, and developing the seventh insulation thin film. Then, an anode thin film is deposited on the base substrate where the display region of the aforementioned patterns is formed, and the anode thin film is patterned through a patterning process to form a pattern of an anode on the seventh insulation layer. Next, on the base substrate where the aforementioned patterns are formed, a pixel definition thin film is coated, and a pattern of a Pixel Definition layer (PDL) is formed through masking, exposure, and development processes. The pixel definition layer is formed in each sub-pixel in the display region. A pixel opening exposing the anode is formed in the pixel definition layer in each sub-pixel. Subsequently, the organic light emitting layer connected with the anode is formed in the pixel opening formed above. Subsequently, a cathode thin film is deposited and patterned through a patterning process to form a pattern of a cathode. The cathode is connected with the organic light emitting layer and the second power supply line respectively. Subsequently, the encapsulation layer is formed on the cathode. The encapsulation layer may include a stacked structure of an inorganic material/an organic material/an inorganic material. In some possible implementations, the cathode may be connected with the second power supply line through a plurality of manners, such as laser drilling.

In some exemplary implementations, the first conductive layer, the second conductive layer, the third conductive layer, and the fourth conductive layer may be made of a metal material, such as any one or more of Argentum (Ag), Copper (Cu), Aluminum (Al), and Molybdenum (Mo), or an alloy material of the aforementioned metals, such as an Aluminum-Neodymium alloy (AlNd) or a Molybdenum-Niobium alloy (MoNb), and may be in a single-layer structure, or a multilayer composite structure such as Mo/Cu/Mo. The first insulation layer 61, the second insulation layer 62, the third insulation layer 63, the fourth insulation layer 64, and the fifth insulation layer 65 may be made of any one or more of Silicon Oxide (SiOx), Silicon Nitride (SiNx), and Silicon Oxynitride (SiON), and may be a single layer, a multilayer, or a composite layer. The sixth insulation layer 66 and the seventh insulation layer may be made of an organic material, such as polyimide, acrylic, or polyethylene terephthalate. The first insulation layer 61 may be referred to as a buffer layer, the first insulation layer 61 is configured to improve water and oxygen resistance of the base substrate 60, the second insulation layer 62 and the third insulation layer 63 are referred to as Gate Insulators (GIs), the fourth insulation layer 64 is referred to as an Interlayer Dielectric (ILD) layer, and the fifth insulation layer 65 is referred to as a Passivation (PVX) layer; the sixth insulation layer 66 and the seventh insulation layer are referred to as planarization layers. The pixel definition layer may be made of an organic material, such as polyimide, acrylic, or polyethylene terephthalate. The anode may be made of a transparent conductive material, e.g., Indium Tin Oxide (ITO) or Indium Zinc Oxide (IZO). The cathode may be made of any one or more of Magnesium (Mg), Argentum (Ag), Aluminum (Al), Copper (Cu), and Lithium (Li), or an alloy made of any one or more of the aforementioned metals. However, the embodiment is not limited thereto. For example, the anode may be made of a reflective material such as a metal, and the cathode may be made of a transparent conductive material.

The structure shown in the exemplary embodiment and the preparation process thereof are merely illustrative. In some exemplary implementations, changes in corresponding structures and, addition or deletion of patterning processes may be made according to actual needs. For example, the fourth conductive layer may not be disposed. As another example, a sequence of a plurality of clock signal lines in the first group of clock signal lines may be changed, and a sequence of a plurality of clock signal lines in the second group of clock signal lines may be changed. However, the embodiment is not limited thereto.

The preparation process of the exemplary embodiment may be implemented using an existing mature preparation device, and may be compatible well with an existing preparation process, simple in process implementation, easy to implement, high in a production efficiency, low in a production cost, and high in a yield.

According to the display substrate provided by the exemplary embodiment, a first output circuit and a second output circuit are disposed to share a clock signal line, and a first group of clock signal lines, a first power supply line, and a second power supply line are disposed between the first output circuit and the second output circuit, so that a layout density of a shift register unit may be improved and a narrow bezel may be achieved; in addition, a load on the clock signal line may be reduced, which is beneficial to improve performance of the shift register unit.

In some exemplary implementations, the gate drive circuit includes a plurality of cascaded shift register units. A first output terminal of a (2k−1)th stage shift register unit is connected with an input terminal of a (2k+1)th stage shift register unit, and an input terminal of a first stage shift register unit is connected with a first initial signal line STVO. A first output terminal of a (2k)th stage shift register unit is connected with an input terminal of a (2k+2)th stage shift register unit, and an input terminal of a second stage shift register unit is connected with a second initial signal line STVE, wherein k is a positive integer.

In some exemplary implementations, the first group of clock signal lines includes a first sub-group of clock signal lines and a second sub-group of clock signal lines; the second group of clock signal lines includes a third sub-group of clock signal lines and a fourth sub-group of clock signal lines. The (2k−1)th stage shift register unit is connected with the first sub-group of clock signal lines and the third sub-group of clock signal lines, and the (2k)th stage shift register unit is connected with the second sub-group of clock signal lines and the fourth sub-group of clock signal lines.

In some exemplary implementations, the first sub-group of clock signal lines includes a first clock signal line GCKO1, a second clock signal line GCKO2, and a third clock signal line GCKO3. The second sub-group of clock signal lines includes a sixth clock signal line GCKE1, a seventh clock signal line GCKE2, and an eighth clock signal line GCKE3. The third sub-group of clock signal lines includes a fourth clock signal line GCBO1 and a fifth clock signal line GCBO2. The fourth sub-group of clock signal lines includes a ninth clock signal line GCBE1 and a tenth clock signal line GCBE2.

In the exemplary embodiment, odd-stage shift register units are sequentially cascaded and connected with the first sub-group of clock signal lines and the third sub-group of clock signal lines, and even-stage shift register units are sequentially cascaded and connected with the second sub-group of clock signal lines and the fourth sub-group of clock signal lines. By increasing a quantity of clock signals and adopting driving in odd and even rows, the gate drive circuit of the exemplary embodiment may increase a charging time length and ensure a pixel charging effect, and may be applied to a high-frequency driving mode.

Figure 8:
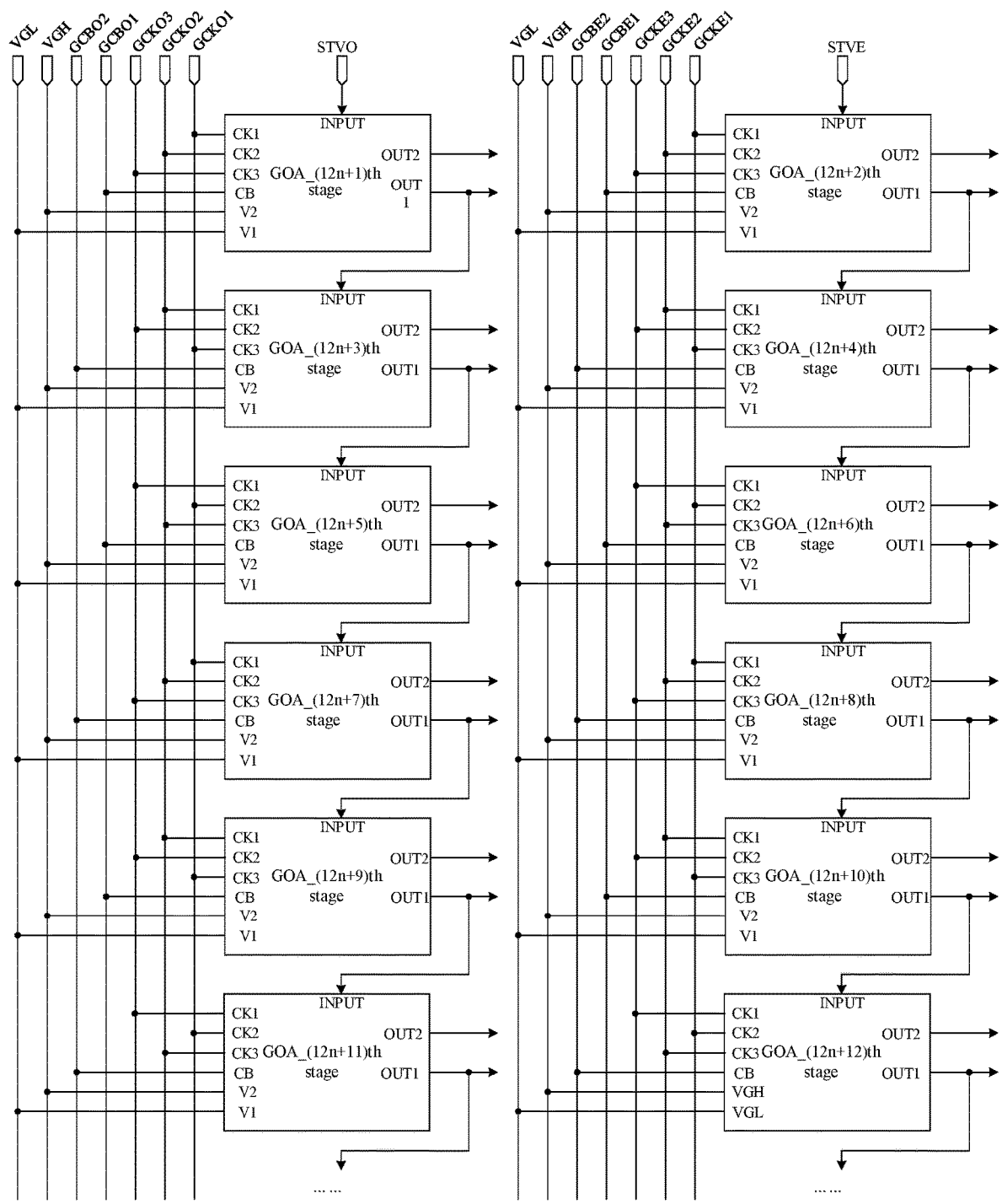
FIG. 8 is a schematic diagram of another cascade of shift register units according to at least one embodiment of the present disclosure.

FIG. 8 is another schematic diagram of a gate drive circuit according to at least one embodiment of the present disclosure. In some exemplary implementations, as shown in FIG. 8, a (12n+1)th stage shift register unit has a first clock terminal connected with the first clock signal line GCKO1, a second clock terminal connected with the second clock signal line GCKO2, a third clock terminal connected with the third clock signal line GCKO3, and a fourth clock terminal connected with the fourth clock signal line GCBO1.

A (12n+3)th stage shift register unit has a first clock terminal connected with the second clock signal line GCKO2, a second clock terminal connected with the third clock signal line GCKO3, a third clock terminal connected with the first clock signal line GCKO1, and a fourth clock terminal connected with the fifth clock signal line GCBO2.

A (12n+5)th stage shift register unit has a first clock terminal connected with the third clock signal line GCKO3, a second clock terminal connected with the first clock signal line GCKO1, a third clock terminal connected with the second clock signal line GCKO2, and a fourth clock terminal connected with the fourth clock signal line GCBO1.

A (12n+7)th stage shift register unit has a first clock terminal connected with the first clock signal line GCKO1, a second clock terminal connected with the second clock signal line GCKO2, a third clock terminal connected with the third clock signal line GCKO3, and a fourth clock terminal connected with the fifth clock signal line GCBO2.

A (12n+9)th stage shift register unit has a first clock terminal connected with the second clock signal line GCKO2, a second clock terminal connected with the third clock signal line GCKO3, a third clock terminal connected with the first clock signal line GCKO1, and a fourth clock terminal connected with the fourth clock signal line GCBO1.

A (12n+11)th stage shift register unit has a first clock terminal connected with the third clock signal line GCKO3, a second clock terminal connected with the first clock signal line GCKO1, a third clock terminal connected with the second clock signal line GCKO2, and a fourth clock terminal connected with the fifth clock signal line GCBO2.

A (12n+2)th stage shift register unit has a first clock terminal connected with the sixth clock signal line GCKE1, a second clock terminal connected with the seventh clock signal line GCKE2, a third clock terminal connected with the eighth clock signal line GCKE3, and a fourth clock terminal connected with the ninth clock signal line GCBE1.

A (12n+4)th stage shift register unit has a first clock terminal connected with the seventh clock signal line GCKE2, a second clock terminal connected with the eighth clock signal line GCKE3, a third clock terminal connected with the sixth clock signal line GCKE1, and a fourth clock terminal connected with the tenth clock signal line GCBE2.

A (12n+6)th stage shift register unit has a first clock terminal connected with the eighth clock signal line GCKE3, a second clock terminal connected with the sixth clock signal line GCKE1, a third clock terminal connected with the seventh clock signal line GCKE2, and a fourth clock terminal connected with the ninth clock signal line GCBE1.

A (12n+8)th stage shift register unit has a first clock terminal connected with the sixth clock signal line GCKE1, a second clock terminal connected with the seventh clock signal line GCKE2, a third clock terminal connected with the eighth clock signal line GCKE3, and a fourth clock terminal connected with the tenth clock signal line GCBE2.

A (12n+10)th stage shift register unit has a first clock terminal connected with the seventh clock signal line GCKE2, a second clock terminal connected with the eighth clock signal line GCKE3, a third clock terminal connected with the sixth clock signal line GCKE1, and a fourth clock terminal connected with the ninth clock signal line GCBE1.

A (12n+12)th stage shift register unit has a first clock terminal connected with the eighth clock signal line GCKE3, a second clock terminal connected with the sixth clock signal line GCKE1, a third clock terminal connected with the seventh clock signal line GCKE2, and a fourth clock terminal connected with the tenth clock signal line GCBE2, wherein n is a natural number.

The twelve shift register units of the gate drive circuit of the embodiment may be used as a repetition unit with a minimum period to drive twelve rows of sub-pixels.

Figure 9:
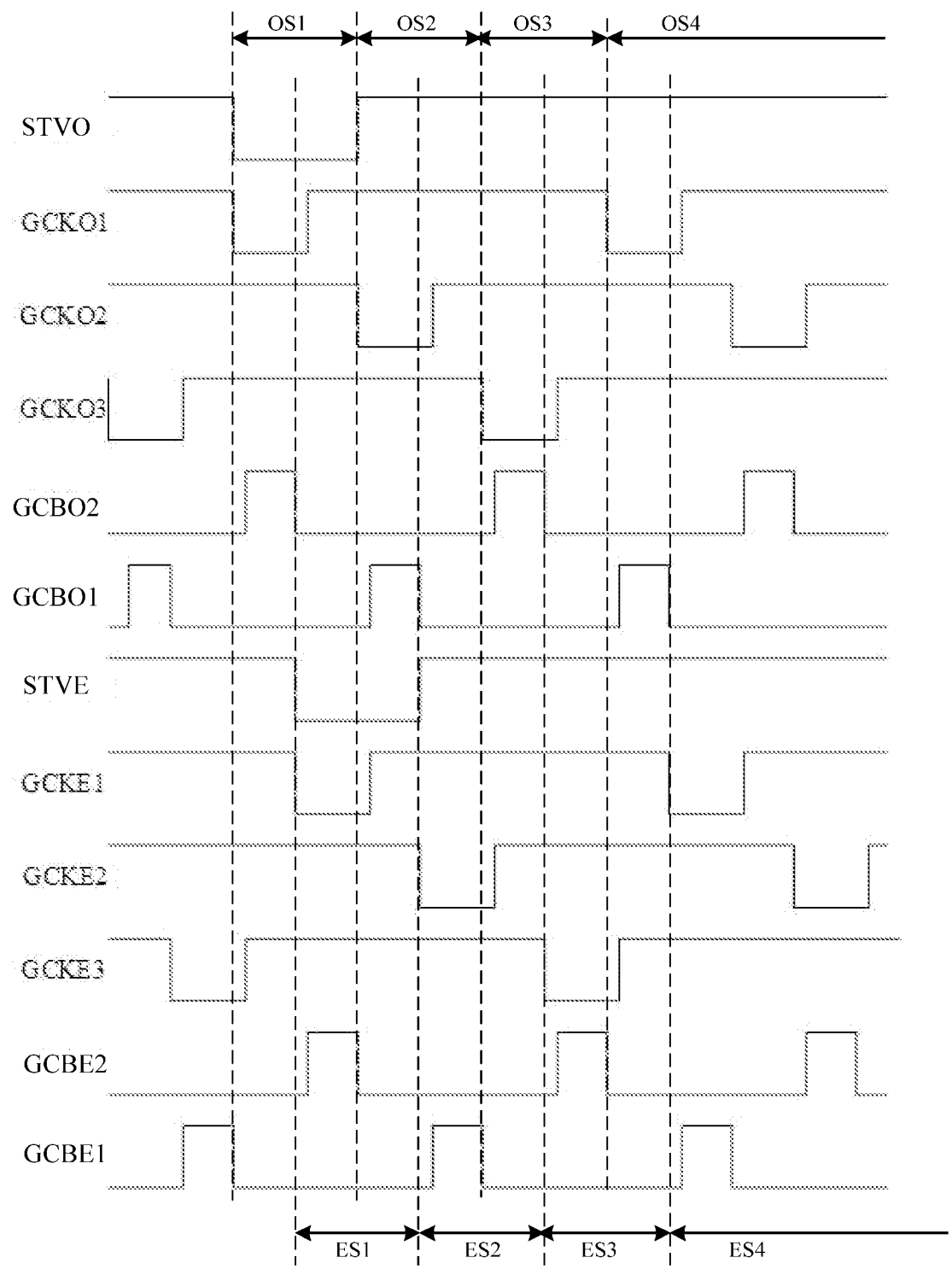
FIG. 9 is a timing schematic diagram of a clock signal according to at least one embodiment of the present disclosure.

FIG. 9 is a timing schematic diagram of a clock signal according to at least one embodiment of the present disclosure. As shown in FIG. 9, a first clock signal provided by the first clock signal line GCKO1, a second clock signal provided by the second clock signal line GCKO2, a third clock signal provided by the third clock signal line GCKO3, a fourth clock signal provided by the fourth clock signal line GCBO1, a fifth clock signal provided by the fifth clock signal line GCBO2, a sixth clock signal provided by the sixth clock signal line GCKE1, a seventh clock signal provided by the seventh clock signal line GCKE2, an eighth clock signal provided by the eighth clock signal line GCKE3, a ninth clock signal provided by the ninth clock signal line GCBE1, and a tenth clock signal provided by the tenth clock signal line GCBE2 are all pulse signals.

In some exemplary implementations, as shown in FIG. 9, duty ratios of the first clock signal, the second clock signal, the third clock signal, the sixth clock signal, the seventh clock signal, and the eighth clock signal may be the same. The second clock signal is delayed from the first clock signal by a first set time length (e.g., 2H), and the third clock signal is delayed from the second clock signal by the first set time length (e.g., 2H), so that the first clock signal, the second clock signal, and the third clock signal are not at a low voltage simultaneously. The seventh clock signal is delayed from the sixth clock signal by the first set time length (e.g., 2H), and the eighth clock signal is delayed from the seventh clock signal by the first set time length (e.g., 2H), so that the sixth clock signal, the seventh clock signal, and the eighth clock signal are not at a low voltage simultaneously. The sixth clock signal is delayed from the first clock signal by a second set time length (e.g., 1H), the seventh clock signal is delayed from the second clock signal by the second set time length (e.g., 1H), and the eighth clock signal is delayed from the third clock signal by the second set time length.

In some exemplary implementations, as shown in FIG. 9, a second initial signal provided by the second initial signal line STVE is delayed by 1H from a first initial signal provided by the first initial signal line STVO.

In some exemplary implementations, as shown in FIG. 9, duty ratios of the fourth clock signal, the fifth clock signal, the ninth clock signal, and the tenth clock signal may be the same. A duty ratio of the fourth clock signal may be smaller than a duty ratio of the first clock signal. The fourth clock signal and the fifth clock signal are not at a high voltage simultaneously, and the ninth clock signal and the tenth clock signal are not at a high voltage simultaneously. The ninth clock signal is delayed from the fourth clock signal by the second set time length (e.g., 1H), and the tenth clock signal is delayed from the fifth clock signal by the second set time length (e.g., 1H).

In some exemplary implementations, a working timing of a first stage shift register unit in FIG. 8 may include a first phase OS1, a second phase OS2, a third phase OS3, and a fourth phase OS4. A working process of a second stage shift register unit may include a first phase ES1, a second phase ES2, a third phase ES3, and a fourth phase ES4. The working process of the four phases may be referred to the description of the working process of the shift register unit of the foregoing embodiment, so it will not be repeated here.

Figure 10:
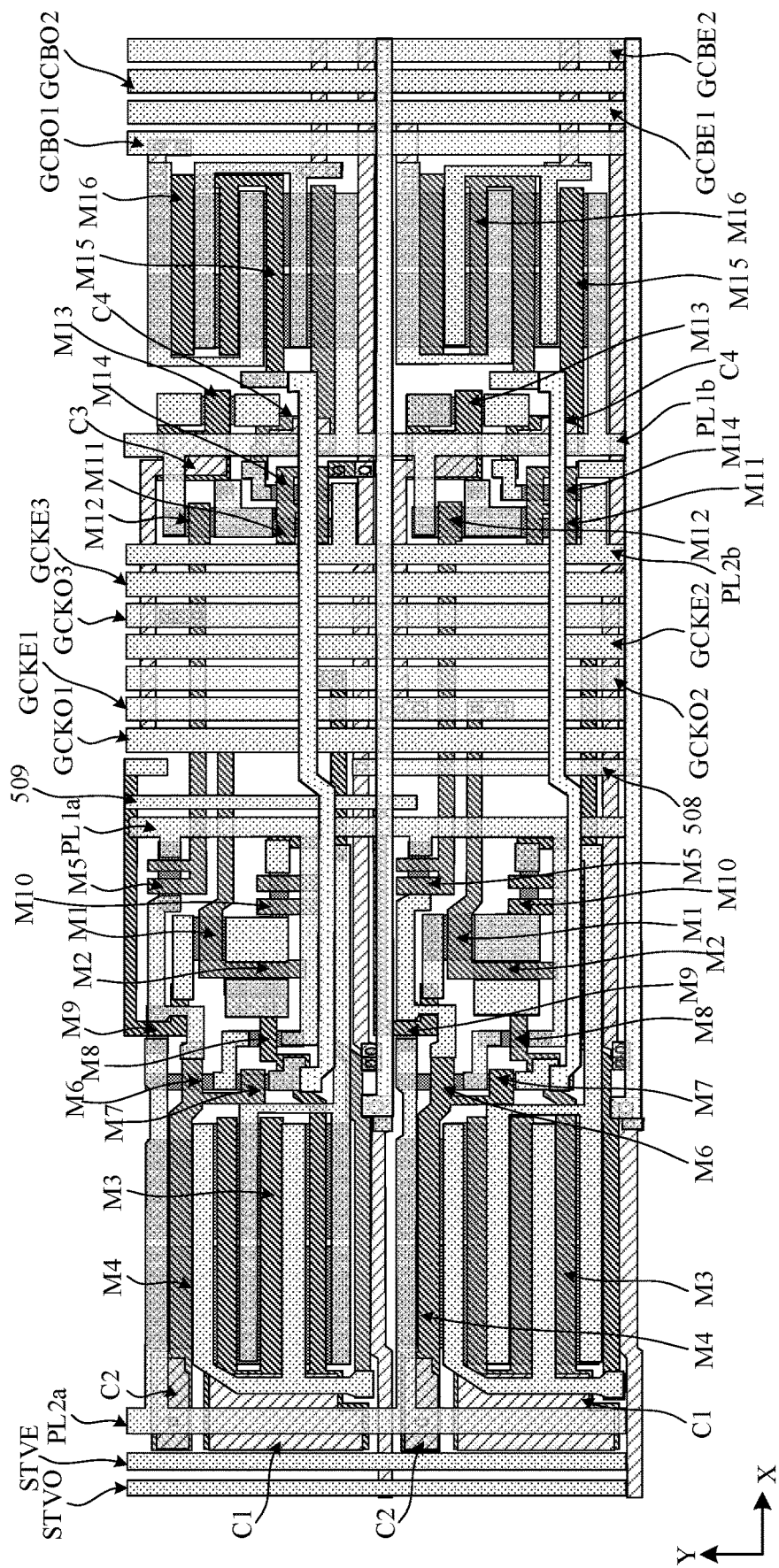
FIG. 10 is another top view of a shift register unit according to at least one embodiment of the present disclosure.

FIG. 10 is another top view of a shift register unit according to at least one embodiment of the present disclosure. In FIG. 10, a (12n+1)th stage shift register unit and a (12n+2)th stage shift register unit (e.g., n=1) are taken as an example for illustration. A structure of the (12n+1)th stage shift register unit is mainly taken as an example for illustration below.

Figure 11A:
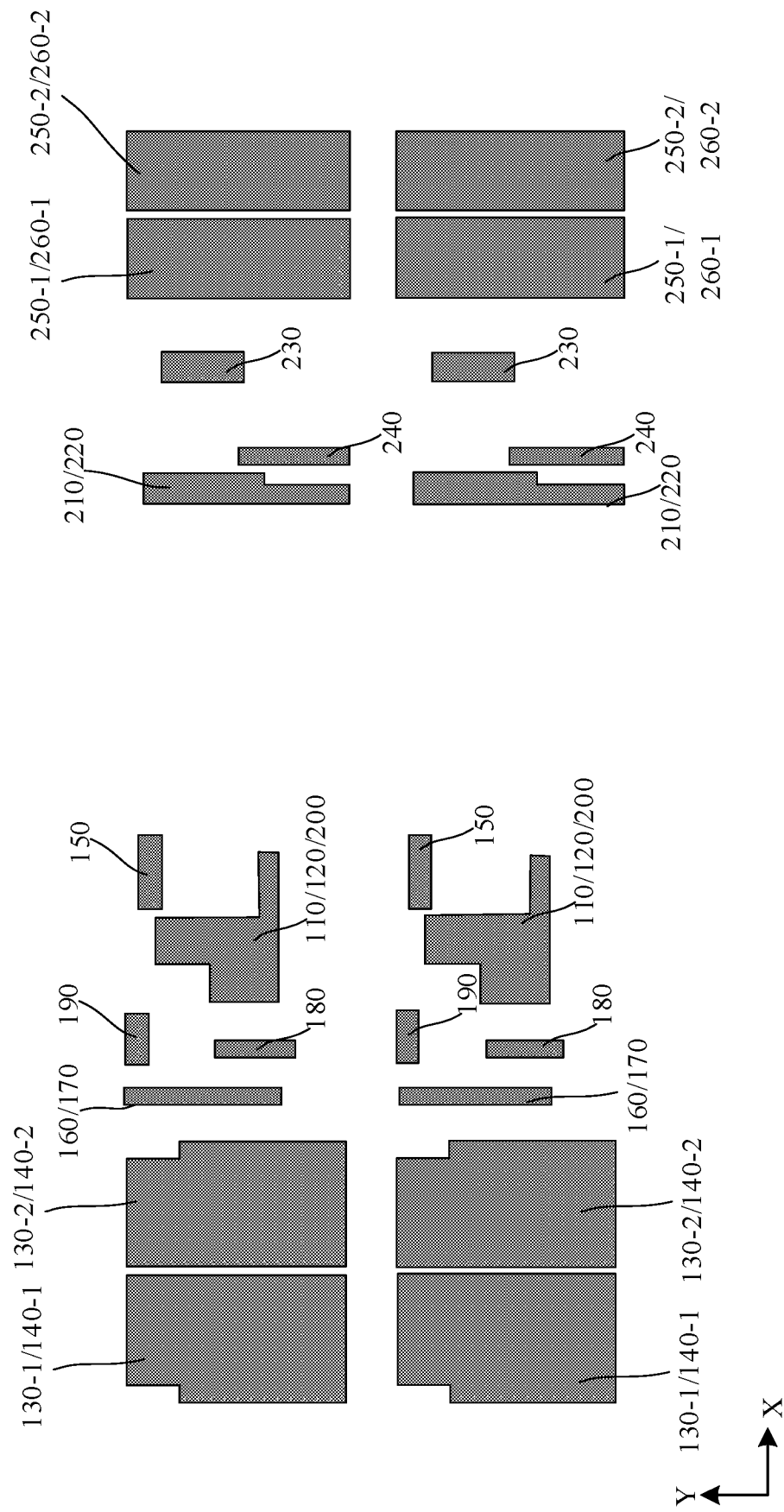
FIG. 11A is another top view of a shift register unit after a first semiconductor layer is formed according to at least one embodiment of the present disclosure.
Figure 11B:
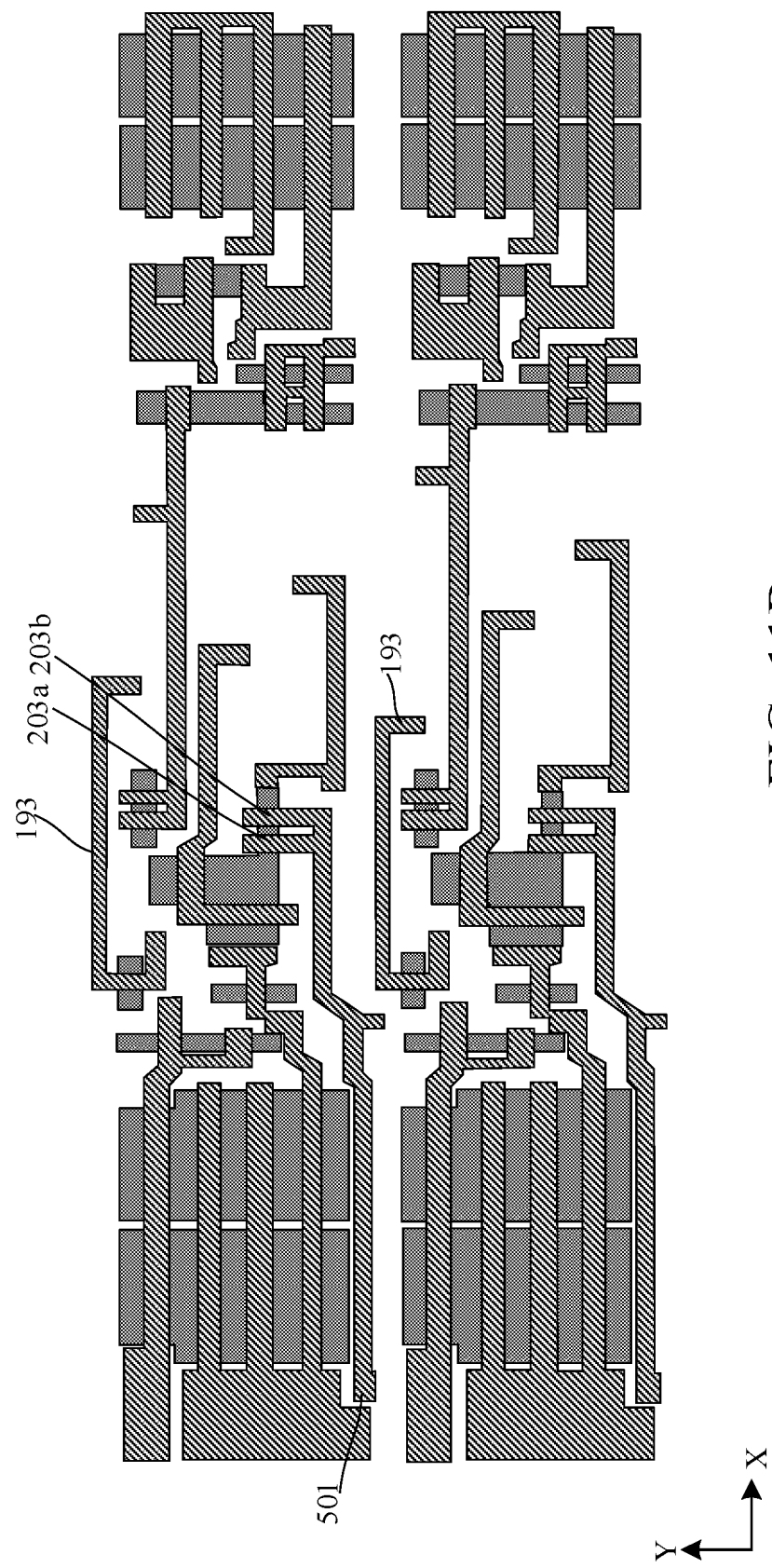
FIG. 11B is another top view of a shift register unit after a first conductive layer is formed according to at least one embodiment of the present disclosure.
Figure 11C:
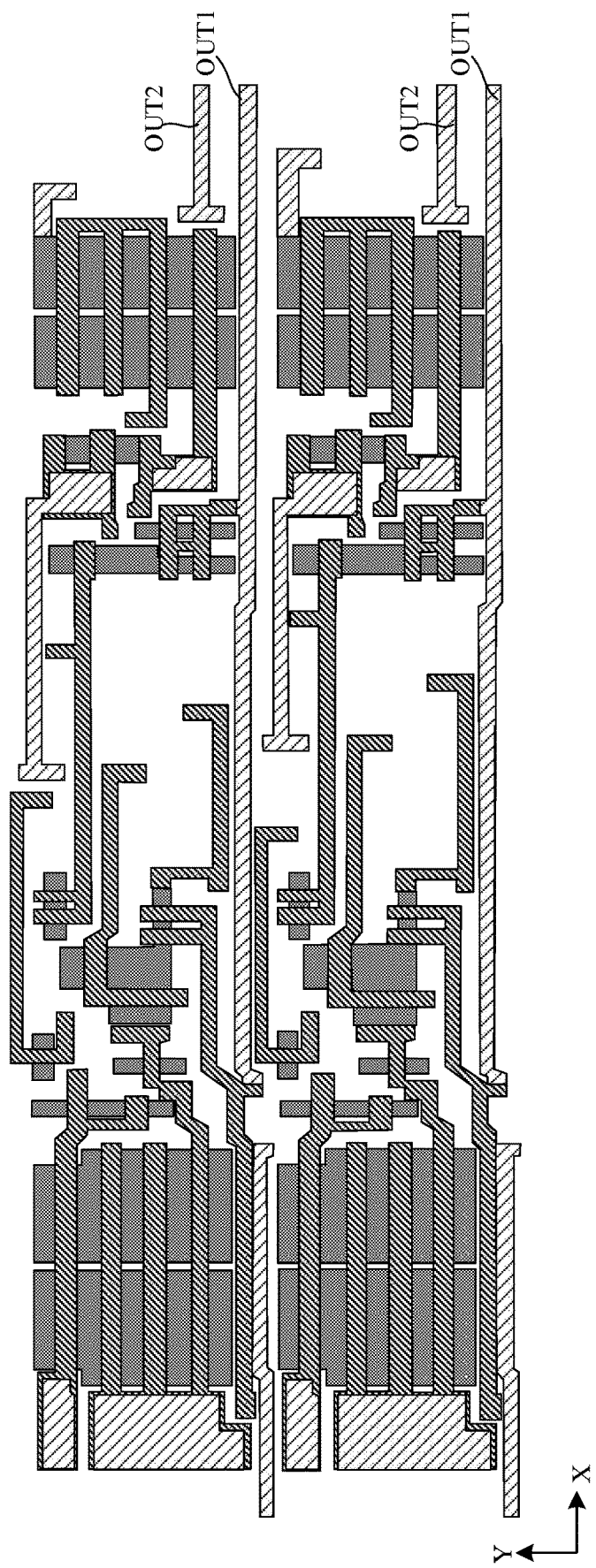
FIG. 11C is another top view of a shift register unit after a second conductive layer is formed according to at least one embodiment of the present disclosure.
Figure 11D:
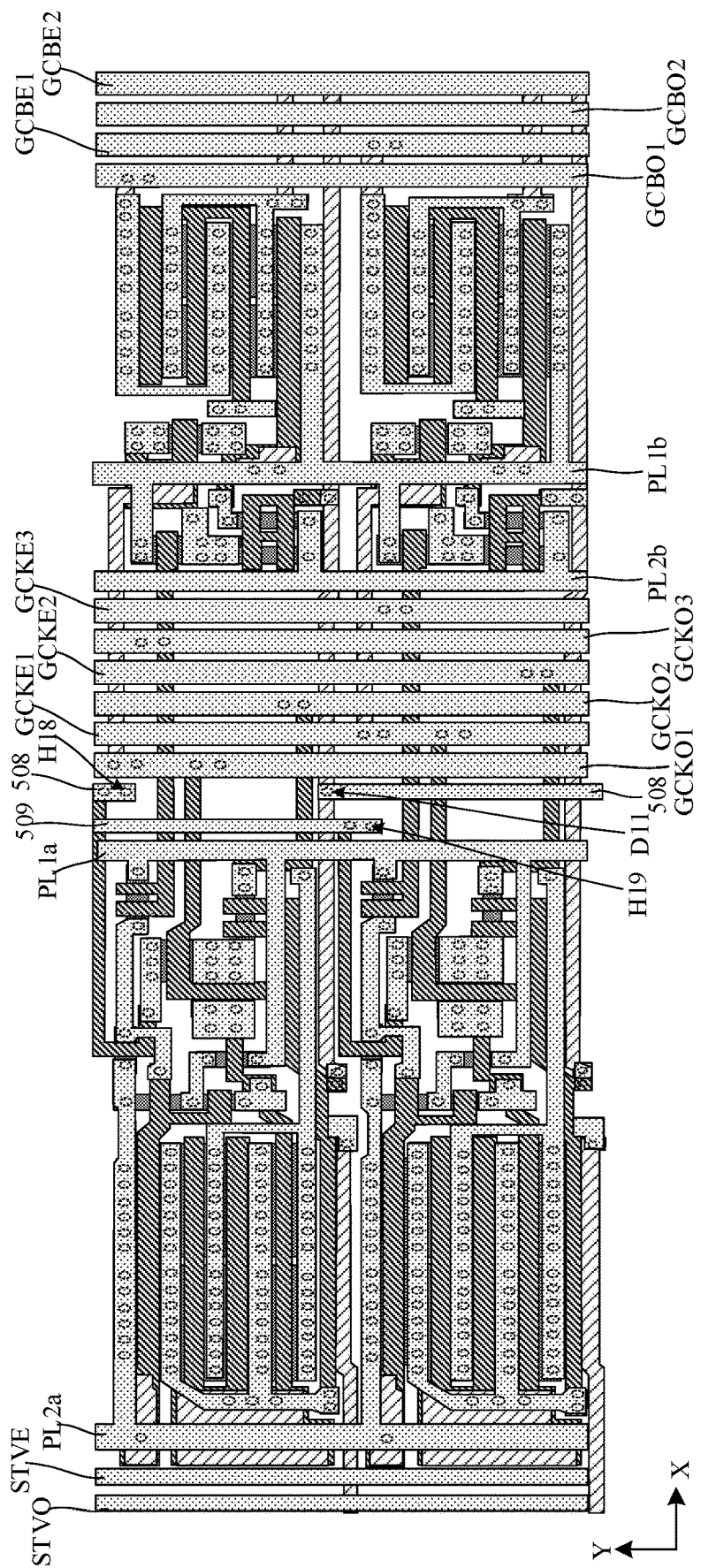
FIG. 11D is another top view of a shift register unit after a third conductive layer is formed according to at least one embodiment of the present disclosure.
Figure 11E:
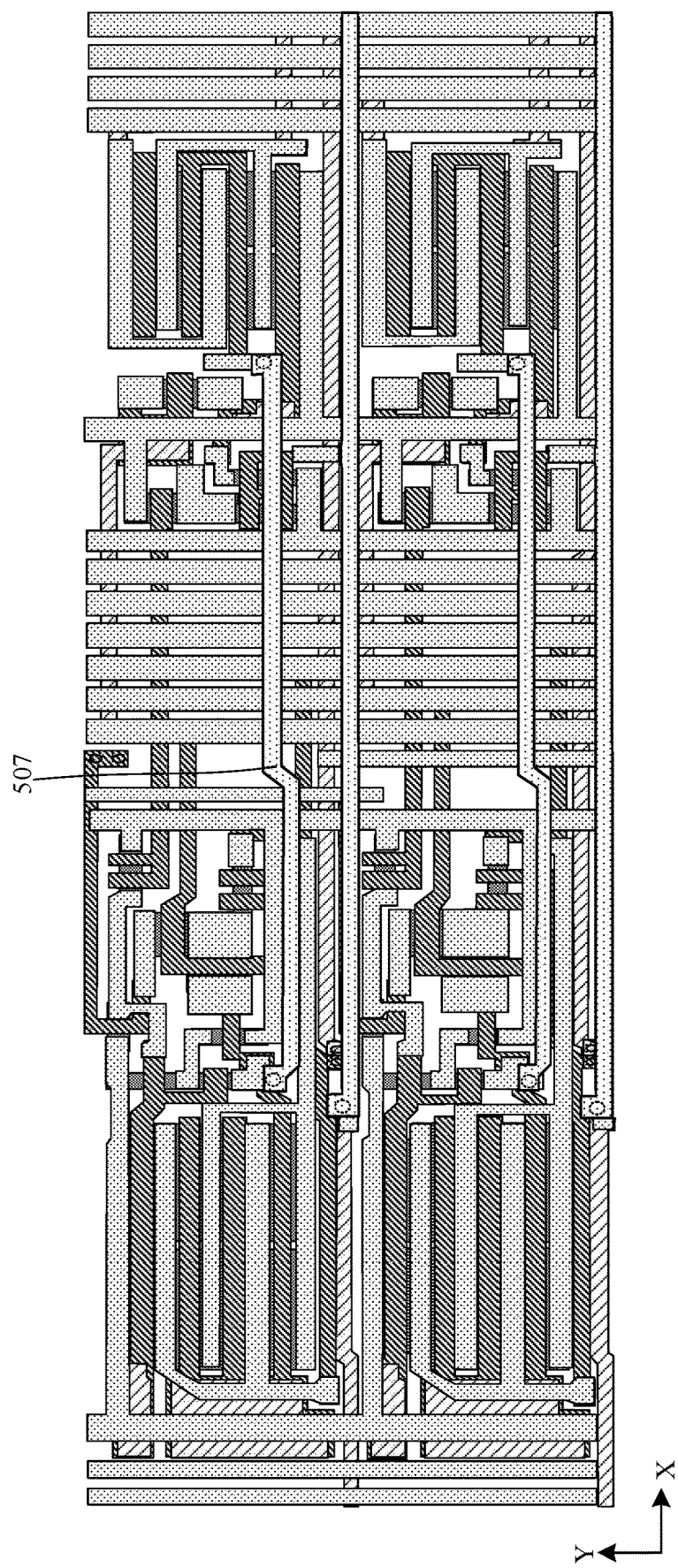
FIG. 11E is another top view of a shift register unit after a fourth conductive layer is formed according to at least one embodiment of the present disclosure.

FIG. 11A is a top view of a shift register unit after a first semiconductor layer is formed according to at least one embodiment of the present disclosure. FIG. 11B is another top view of a shift register unit after a first conductive layer is formed according to at least one embodiment of the present disclosure. FIG. 11C is another top view of a shift register unit after a second conductive layer is formed according to at least one embodiment of the present disclosure. FIG. 11D is another top view of a shift register unit after a third conductive layer is formed according to at least one embodiment of the present disclosure. FIG. 11E is another top view of a shift register unit after a fourth conductive layer is formed according to at least one embodiment of the present disclosure.

In some exemplary implementations, as shown in FIG. 10, in a plane parallel to the display substrate, in the first direction X, the second initial signal line STVE is located between the first initial signal line STVO and the fourth power supply line PL2a, the first group of clock signal lines is located between the first power supply line PL1a and the second power supply line PL2b, and the third power supply line PL1b is located between the second power supply line PL2b and the second group of clock signal lines. The first group of clock signal lines includes a first sub-group of clock signal lines and a second sub-group of clock signal lines. The first sub-group of clock signal lines and the second sub-group of clock signal lines are arranged at intervals in the first direction X. In the example, the first sub-group of clock signal lines includes a first clock signal line GCKO1, a second clock signal line GCKO2, and a third clock signal line GCKO3, and the second sub-group of clock signal lines includes a sixth clock signal line GCKE1, a seventh clock signal line GCKE2, and an eighth clock signal line GCKE3. In a first direction D1 from the first power supply line PL1a to the second power supply line PL2b, the first clock signal line GCKO1, the sixth clock signal line GCKE1, the second clock signal line GCKO2, the seventh clock signal line GCKE2, the third clock signal line GCKO3, and the eighth clock signal line GCKE3 are sequentially arranged. The second group of clock signal lines includes a third sub-group of clock signal lines and a fourth sub-group of clock signal lines. The third sub-group of clock signal lines includes a fourth clock signal line GCBO1 and a fifth clock signal line GCBO2, and the fourth sub-group of clock signal lines includes a ninth clock signal line GCBE1 and a tenth clock signal line GCBE2. The fourth clock signal line GCBO1, the ninth clock signal line GCBE1, the fifth clock signal line GCBO2, and the tenth clock signal line GCBE2 are sequentially arranged in the first direction D1 away from the second output circuit. However, the embodiment is not limited thereto. In some examples, the first sub-group of clock signal lines and the second sub-group of clock signal lines may be sequentially arranged along the first direction, and the third sub-group of clock signal lines and the fourth sub-group of clock signal lines may be sequentially arranged along the first direction.

In some exemplary implementations, as shown in FIG. 11B, the first conductive layer of the non-display region at least includes control electrodes of a plurality of transistors (e.g., transistors M1 to M16) of the shift register unit, and first electrodes of a plurality of capacitors (e.g., a first capacitor C1 to a fourth capacitor C4). Control electrodes 203a and 203b of an eighth control transistor M10 of a shift register unit of any stage and the first connection electrode 501 may be of an integral structure and are not connected with a control electrode 193 of a seventh control transistor M9 of a shift register unit of a next stage.

In some exemplary implementations, as shown in FIG. 11D, the third conductive layer of the non-display region may include first electrodes and second electrodes of a plurality of transistors (e.g., transistors M1 to M16) of the shift register unit, a first group of clock signal lines, a second group of clock signal lines, a plurality of power supply lines, and connection electrodes (e.g., an eighth electrode 508 and a ninth connection electrode 509). For example, a control electrode 193 of a seventh control transistor M9 of a (12n+1)th stage shift register unit may be connected with the eighth connection electrode 508 through two second vias H18 disposed vertically so as to be connected with a first output terminal OUT1 of a (12n−1)th stage shift register unit through the eighth connection electrode 508. The first output terminal OUT1 of the (12n+1)th stage shift register unit may be connected with another eighth connection electrode 508 through the third via D11 so as to be connected with a control electrode 193 of a seventh control transistor M9 of a (12n+3)th stage shift register unit through the eighth connection electrode 508 to provide an input signal to the (12n+3)th stage shift register unit. A control electrode 193 of a seventh control transistor M9 of a (12n+2)th stage shift register unit may be connected with the ninth connection electrode 509 through two second vias H19 disposed vertically so as to be connected with a first output terminal OUT1 of a (12n)th stage shift register unit through the ninth connection electrode 509.

In some exemplary implementations, as shown in FIG. 10 to FIG. 11E, a control electrode of a third control transistor M5 and a control electrode of a second denoising control transistor M12 of the (12n+1)th stage shift register unit may be of an integral structure, and are connected with the third clock signal line GCKO3 through a second via. The second electrode of the third capacitor C3 is connected with the first clock signal line GCKO1 through a third via. The control electrode of the first control transistor M1 is connected with the first clock signal line GCKO1 through a second via, a second connection electrode connected with the first electrode of the eighth control transistor M10 may be connected with the second clock signal line GCKO2 through a second via, and the second connection electrode is also connected with the first electrode of the first output transistor M3 through a second via. The first electrode of the fourth output transistor M16 is connected with the fourth clock signal line GCBO1 through a third connection electrode.

In some exemplary implementations, as shown in FIG. 10 to FIG. 11E, a control electrode of a third control transistor M5 and a control electrode of a second denoising control transistor M12 of the (12n+2)th stage shift register unit may be of an integral structure, and are connected with the eighth clock signal line GCKE3 through a second via. The second electrode of the third capacitor C3 is connected with the sixth clock signal line GCKE1 through a third via. The control electrode of the first control transistor M1 is connected with the sixth clock signal line GCKE1 through a second via, a second connection electrode connected with the first electrode of the eighth control transistor M10 may be connected with the seventh clock signal line GCKE2 through a second via, and the second connection electrode is also connected with the first electrode of the first output transistor M3 through a second via. The first electrode of the fourth output transistor M16 is connected with the ninth clock signal line GCBE1 through a third connection electrode.

Reference may be made to FIG. 8 for a cascade relationship of shift register units of the embodiment, and reference may be made to the description of the foregoing embodiments for the rest of the structure of the display substrate of the embodiment, so details will not be repeated here.

An embodiment of the present disclosure further provides a preparation method of a display substrate, which is used for preparing the display substrate described above. The preparation method of the embodiment includes: providing a base substrate and forming a gate drive circuit in a non-display region. The gate drive circuit includes a plurality of cascaded shift register units; a shift register unit is connected with at least one power supply line. The shift register unit includes a first output circuit and a second output circuit; the first output circuit is connected with a first group of clock signal lines, and the second output circuit is connected with the first group of clock signal lines and a second group of clock signal lines. In a first direction, the first group of clock signal lines and the at least one power supply line are located between the first output circuit and the second output circuit, and the second group of clock signal lines are located on one side of the second output circuit away from the first group of clock signal lines.

For the preparation method of the display substrate of the embodiment, reference may be made to description of the aforementioned embodiments, so details will not be repeated here.

Figure 12:
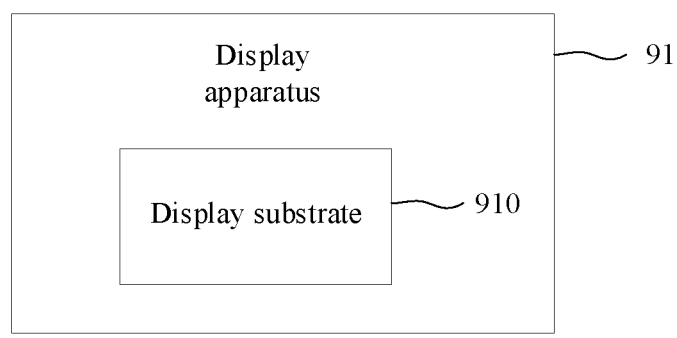
FIG. 12 is a schematic diagram of a display apparatus according to at least one embodiment of the present disclosure.

FIG. 12 is a schematic diagram of a display apparatus according to at least one embodiment of the present disclosure. As shown in FIG. 12, the embodiment provides a display apparatus 91, which includes a display substrate 910. The display substrate 910 is the display substrate provided in the above-mentioned embodiments. The display substrate 910 may be an OLED display substrate, a QLED display substrate, a micro-LED display substrate, or a mini-LED display substrate. The display apparatus 91 may be any product or component with a display function, such as an OLED display apparatus, a watch, a mobile phone, a tablet computer, a television, a display, a notebook computer, a digital photo frame, and a navigator. However, the embodiment is not limited thereto.

The drawings in the present disclosure only involve structures involved in the present disclosure, and other structures may refer to conventional designs. The embodiments in the present disclosure and features in the embodiments may be combined with each other to obtain new embodiments if there is no conflict. Those of ordinary skills in the art should understand that modifications or equivalent replacements may be made to the technical solutions of the present disclosure without departing from the spirit and scope of the technical solutions of the present disclosure, and shall all fall within the scope of the claims of the present disclosure.

The invention claimed is:

1. A display substrate, comprising a display region and a non-display region, wherein:
the non-display region is provided with a gate drive circuit, the gate drive circuit comprises a plurality of cascaded shift register units, and a shift register unit is connected with at least one power supply line;
the shift register unit comprises a first output circuit and a second output circuit; the first output circuit is connected with a first group of clock signal lines, and the second output circuit is connected with the first group of clock signal lines and a second group of clock signal lines;
in a first direction, the first group of clock signal lines and the at least one power supply line are located between the first output circuit and the second output circuit, and the second group of clock signal lines are located on a side of the second output circuit away from the first group of clock signal lines;
the first output circuit comprises a first node control sub-circuit, a second node control sub-circuit, and a first output sub-circuit;
the first node control sub-circuit is connected with an input terminal, a first output terminal, a first clock terminal, a second clock terminal, a third clock terminal, a first power supply terminal, a second power supply terminal, a first node, and a second node, and is configured to control potentials of the first node and the second node under control of the first clock terminal, the third clock terminal, and the input terminal;
the second node control sub-circuit is connected with the first node, the second node, the second power supply terminal, and the first output terminal, and is configured to maintain the potentials of the first node and the second node;
the first output sub-circuit is connected with the first node, the second node, the second clock terminal, the second power supply terminal, and the first output terminal, and is configured to control the first output terminal to output a first output signal under control of the first node and the second node; and
the second node control sub-circuit, the first output sub-circuit, and the first node control sub-circuit are sequentially arranged along the first direction.

2. The display substrate according to claim 1, wherein the at least one power supply line comprises: a first power supply line and a second power supply line, the first power supply line is connected with the first output circuit, and the second power supply line is connected with the second output circuit;
in the first direction, the first power supply line is located between the first output circuit and the first group of clock signal lines, and the second power supply line is located between the first group of clock signal lines and the second output circuit.

3. The display substrate according to claim 2, wherein the non-display region is further provided with a third power supply line and a fourth power supply line;
the third power supply line is connected with the second output circuit, and the fourth power supply line is connected with the first output circuit;
in the first direction, the fourth power supply line is located on a side of the first output circuit away from the first power supply line, and the third power supply line is located between the second power supply line and the second group of clock signal lines.

4. The display substrate according to claim 3, wherein the non-display region is further provided with an initial signal line, and the initial signal line is located on a side of the fourth power supply line away from the first output circuit in the first direction.

5. The display substrate according to claim 1, wherein the first node control sub-circuit comprises a first control transistor, a second control transistor, a third control transistor, a fourth control transistor, a fifth control transistor, a sixth control transistor, a seventh control transistor, and an eighth control transistor;
- a control electrode of the first control transistor is connected with the first clock terminal, a first electrode is connected with the input terminal, and a second electrode is connected with a fourth node;
- a control electrode of the second control transistor is connected with the first clock terminal, a first electrode is connected with the fourth node, and a second electrode is connected with the first node;
- a control electrode of the third control transistor is connected with the third clock terminal, a first electrode is connected with the first power supply terminal, and a second electrode is connected with the second node;
- a control electrode of the fourth control transistor is connected with the second node, a first electrode is connected with the second power supply terminal, and a second electrode is connected with a third node;
- a control electrode of the fifth control transistor is connected with the second node, a first electrode is connected with the third node, and a second electrode is connected with the first node;
- a control electrode of the sixth control transistor is connected with the first node, a first electrode is connected with the first power supply terminal, and a second electrode is connected with the third node;
- a control electrode of the seventh control transistor is connected with the input terminal, a first electrode is connected with the second power supply terminal, and a second electrode is connected with the second node;
- a control electrode of the eighth control transistor is connected with the first output terminal, a first electrode is connected with the second clock terminal, and a second electrode is connected with the fourth node;
- the second node control sub-circuit comprises a first capacitor and a second capacitor; a first electrode of the first capacitor is connected with the first node, and a second electrode is connected with the first output terminal; a first electrode of the second capacitor is connected with the second node, and a second electrode is connected with the second power supply terminal;
- the first output sub-circuit comprises a first output transistor and a second output transistor; a control electrode of the first output transistor is connected with the first node, a first electrode is connected with the second clock terminal, and a second electrode is connected with the first output terminal; a control electrode of the second output transistor is connected with the second node, a first electrode is connected with the second power supply terminal, and a second electrode is connected with the first output terminal.

6. The display substrate according to claim 5, wherein the first capacitor and the first output transistor are adjacent in the first direction, the second capacitor and the second output transistor are adjacent in the first direction; the first capacitor and the second capacitor are adjacent in a second direction, and the first output transistor and the second output transistor are adjacent in the second direction; and the second direction is intersected with the first direction.

7. The display substrate according to claim 5, wherein active layers of the first control transistor, the second control transistor, and the eighth control transistor are of an integral structure, and active layers of the fourth control transistor and the fifth control transistor are of an integral structure; and active layers of the first output transistor and the second output transistor are of an integral structure.

8. The display substrate according to claim 7, in the first direction, an active layer of the sixth control transistor is located between an active layer of the fifth control transistor and an active layer of the second control transistor, and an active layer of the seventh control transistor is located between an active layer of the fourth control transistor and an active layer of the third control transistor.

9. The display substrate according to claim 1, wherein the second output circuit comprises a denoising control sub-circuit, a second output sub-circuit, and a third output sub-circuit;
- the denoising control sub-circuit is connected with a first output terminal, a first clock terminal, a third clock terminal, a first power supply terminal, a second power supply terminal, and a first denoising control node, and the denoising control sub-circuit is configured to, under control of the third clock terminal, rectify a charge of the first power supply terminal to the first denoising control node to allow the first denoising control node to maintain a voltage that enables the second output sub-circuit to be turned on, and under control of the first output terminal, transmit a signal of the second power supply terminal to the first denoising control node to allow the first denoising control node to maintain a voltage that enables the second output sub-circuit to be turned off;
- the second output sub-circuit is connected with the first denoising control node, a second output terminal, and the first power supply terminal, and is configured to transmit a signal of the first power supply terminal to the second output terminal under control of the first denoising control node;
- the third output sub-circuit is connected with a first node, a fourth clock terminal, and the second output terminal, and is configured to transmit a signal of the fourth clock terminal to the second output terminal under control of the first node;
- in a second direction, the second output sub-circuit and the third output sub-circuit are adjacent;
- in the first direction, the denoising control sub-circuit is located between the first group of clock signal lines and the second output sub-circuit, wherein the second direction is intersected with the first direction.

10. The display substrate according to claim 9, wherein the denoising control sub-circuit comprises a first denoising control transistor, a second denoising control transistor, a third denoising control transistor, a fourth denoising control transistor, a third capacitor, and a fourth capacitor;
- a control electrode of the first denoising control transistor is connected with the first output terminal, a first electrode is connected with the second power supply terminal, and a second electrode is connected with a second denoising control node;
- a control electrode of the second denoising control transistor is connected with the third clock terminal, a first electrode is connected with the first power supply terminal, and a second electrode is connected with the second denoising control node;

a control electrode and a first electrode of the third denoising transistor are connected with the second denoising control node, and a second electrode is connected with the first denoising control node;
a control electrode of the fourth denoising control transistor is connected with the first output terminal, a first electrode is connected with the second power supply terminal, and a second electrode is connected with the first denoising control node;
a first electrode of the third capacitor is connected with the second denoising control node, and a second electrode is connected with the first clock terminal;
a first electrode of the fourth capacitor is connected with the first denoising control node, and a second electrode is connected with the first power supply terminal;
the second output sub-circuit comprises a third output transistor;
a control electrode of the third output transistor is connected with the first denoising control node, a first electrode is connected with the first power supply terminal, and a second electrode is connected with the second output terminal;
the third output sub-circuit comprises a fourth output transistor;
a control electrode of the fourth output transistor is connected with the first node, a first electrode is connected with the fourth clock terminal, and a second electrode is connected with the second output terminal.

11. The display substrate according to claim 10, wherein the third output transistor and the fourth output transistor are adjacent in the second direction, the first denoising control transistor and the second denoising control transistor are adjacent in the second direction;
in the first direction, the third capacitor is located between the second denoising control transistor and the third denoising control transistor, and the fourth denoising control transistor is located between the first denoising control transistor and the fourth capacitor.

12. The display substrate according to claim 10, wherein active layers of the first denoising control transistor and second denoising control transistor are of an integral structure, and active layers of the third output transistor and the fourth output transistor are of an integral structure.

13. The display substrate according to claim 1, wherein the first group of clock signal lines comprises a first clock signal line, a second clock signal line, and a third clock signal line;
the second group of clock signal lines comprises a fourth clock signal line and a fifth clock signal line;
a duty ratio of a first clock signal provided by the first clock signal line, a duty ratio of a second clock signal provided by the second clock signal line, and a duty ratio of a third clock signal provided by the third clock signal line are the same, a duty ratio of a fourth clock signal provided by the fourth clock signal line and a duty ratio of a fifth clock signal provided by the fifth clock signal line are the same, and the duty ratio of the fourth clock signal is smaller than the duty ratio of the first clock signal;
the second clock signal is delayed from the first clock signal by a set time length, and the third clock signal is delayed from the second clock signal by a set time length, wherein the first clock signal, the second clock signal, and the third clock signal are not at a first voltage simultaneously; the fourth clock signal and the fifth clock signal are not at a second voltage simultaneously; and the first voltage is different from the second voltage.

14. The display substrate according to claim 13, wherein in the first direction, the first clock signal line, the second clock signal line, and the third clock signal line are sequentially arranged in a direction away from the first output circuit, and the fourth clock signal line and the fifth clock signal line are sequentially arranged in a direction away from the second output circuit.

15. The display substrate according to claim 13, wherein a first output circuit of a shift register unit of any stage is connected with the first clock signal line, the second clock signal line, and the third clock signal line, and a second output circuit is connected with two clock signal lines in the first group of clock signal lines and one clock signal line in the second group of clock signal lines.

16. The display substrate according to claim 15, wherein a first clock terminal of a (6n+1) th stage shift register unit is connected with the first clock signal line, a second clock terminal is connected with the second clock signal line, a third clock terminal is connected with the third clock signal line, and a fourth clock terminal is connected with the fourth clock signal line;
a first clock terminal of a (6n+2) th stage shift register unit is connected with the second clock signal line, a second clock terminal is connected with the third clock signal line, a third clock terminal is connected with the first clock signal line, and a fourth clock terminal is connected with the fifth clock signal line;
a first clock terminal of a (6n+3) th stage shift register unit is connected with the third clock signal line, a second clock terminal is connected with the first clock signal line, a third clock terminal is connected with the second clock signal line, and a fourth clock terminal is connected with the fourth clock signal line;
a first clock terminal of a (6n+4) th stage shift register unit is connected with the first clock signal line, a second clock terminal is connected with the second clock signal line, a third clock terminal is connected with the third clock signal line, and a fourth clock terminal is connected with the fifth clock signal line;
a first clock terminal of a (6n+5) th stage shift register unit is connected with the second clock signal line, a second clock terminal is connected with the third clock signal line, a third clock terminal is connected with the first clock signal line, and a fourth clock terminal is connected with the fourth clock signal line;
a first clock terminal of a (6n+6) th stage shift register unit is connected with the third clock signal line, a second clock terminal is connected with the first clock signal line, a third clock terminal is connected with the second clock signal line, and a fourth clock terminal is connected with the fifth clock signal line;
wherein n is a natural number.

17. The display substrate according to claim 1, a first output terminal of a (2k−1) th stage shift register unit is connected with an input terminal of a (2k+1) th stage shift register unit, and an input terminal of a first stage shift register unit is connected with a first initial signal line;
a first output terminal of a (2k) th stage shift register unit is connected with an input terminal of a (2k+2) th stage shift register unit, and an input terminal of a second stage shift register unit is connected with a second initial signal line, wherein k is a positive integer;
the first group of clock signal lines comprises a first sub-group of clock signal lines and a second sub-group of clock signal lines; and the second group of clock signal lines comprises a third sub-group of clock signal lines and a fourth sub-group of clock signal lines;

the (2k−1)th stage shift register unit is connected with the first sub-group of clock signal lines and the third sub-group of clock signal lines, and the (2k)th stage shift register unit is connected with the second sub-group of clock signal lines and the fourth sub-group of clock signal lines.

18. The display substrate according to claim 17, wherein the first sub-group of clock signal lines comprises a first clock signal line, a second clock signal line, and a third clock signal line;

the second sub-group of clock signal lines comprises a sixth clock signal line, a seventh clock signal line, and an eighth clock signal line;

the third sub-group of clock signal lines comprises a fourth clock signal line and a fifth clock signal line;

the fourth sub-group of clock signal lines comprises a ninth clock signal line and a tenth clock signal line;

a duty ratio of a first clock signal provided by the first clock signal line, a duty ratio of a second clock signal provided by the second clock signal line, a duty ratio of a third clock signal provided by the third clock signal line, a duty ratio of a sixth clock signal provided by the sixth clock signal line, a duty ratio of a seventh clock signal provided by the seventh clock signal line, and a duty ratio of an eighth clock signal provided by the eighth clock signal line are the same; the second clock signal is delayed from the first clock signal by a first set time length, and the third clock signal is delayed from the second clock signal by the first set time length, wherein the first clock signal, the second clock signal, and the third clock signal are not at a first voltage simultaneously; the seventh clock signal is delayed from the sixth clock signal by the first set time length, and the eighth clock signal is delayed from the seventh clock signal by the first set time length, wherein the sixth clock signal, the seventh clock signal, and the eighth clock signal are not at the first voltage simultaneously; the sixth clock signal is delayed from the first clock signal by a second set time length, the seventh clock signal is delayed from the second clock signal by the second set time length, and the eighth clock signal is delayed from the third clock signal by the second set time length;

a duty ratio of a fourth clock signal provided by the fourth clock signal line, a duty ratio of a fifth clock signal provided by the fifth clock signal line, a duty ratio of a ninth clock signal provided by the ninth clock signal line, a duty ratio of a tenth clock signal provided by the tenth clock signal line are the same; the duty ratio of the fourth clock signal is smaller than the duty ratio of the first clock signal; the fourth clock signal and the fifth clock signal are not at a second voltage simultaneously, the ninth clock signal and the tenth clock signal are not at the second voltage simultaneously, and the second voltage is different from the first voltage; the ninth clock signal is delayed from the fourth clock signal by the second set time length, and the tenth clock signal is delayed from the fifth clock signal by the second set time length.

19. A display apparatus, comprising the display substrate according to claim 1.

* * * * *